(12) United States Patent
Darwish

(10) Patent No.: US 7,964,913 B2
(45) Date of Patent: Jun. 21, 2011

(54) POWER MOS TRANSISTOR INCORPORATING FIXED CHARGES THAT BALANCE THE CHARGE IN THE DRIFT REGION

(75) Inventor: Mohamed N. Darwish, Campbell, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 11/971,139

(22) Filed: Jan. 8, 2008

(65) Prior Publication Data

US 2008/0164518 A1 Jul. 10, 2008

Related U.S. Application Data

(60) Provisional application No. 60/879,434, filed on Jan. 9, 2007.

(51) Int. Cl.
*H01L 29/423* (2006.01)
(52) U.S. Cl. ......... 257/330; 257/334; 257/329; 257/331
(58) Field of Classification Search .................. 257/331, 257/330, 329, 334, E29.262
See application file for complete search history.

(56) References Cited

U.S. PATENT DOCUMENTS

| | | |
|---|---|---|
| 5,216,275 A | 6/1993 | Chen |
| 5,282,018 A | 1/1994 | Hiraki et al. |
| 5,637,898 A | 6/1997 | Baliga |
| 5,767,548 A | 6/1998 | Wondrak et al. |
| 5,864,159 A | 1/1999 | Takahashi |
| 5,973,359 A | 10/1999 | Kobayashi |
| 5,998,833 A | 12/1999 | Baliga |
| 6,069,372 A | 5/2000 | Uenishi |
| 6,078,090 A | 6/2000 | Williams et al. |
| 6,114,727 A | 9/2000 | Ogura et al. |
| 6,191,447 B1 | 2/2001 | Baliga |
| 6,251,730 B1 | 6/2001 | Luo |
| 6,388,286 B1 | 5/2002 | Baliga |
| 6,509,233 B2 | 1/2003 | Chang et al. |
| 6,525,373 B1 | 2/2003 | Kim |
| 6,541,820 B1 | 4/2003 | Bol |
| 6,649,975 B2 | 11/2003 | Baliga |
| 6,686,244 B2 | 2/2004 | Blanchard |
| 6,710,403 B2 | 3/2004 | Sapp |

(Continued)

OTHER PUBLICATIONS

Grant et al., *Power MOSFETS Theory and Applications*, John Wiley & Sons Ltd., 1989, p. 68-74.

(Continued)

*Primary Examiner* — Wai-Sing Louie
*Assistant Examiner* — Bilkis Jahan
(74) *Attorney, Agent, or Firm* — Robert O. Groover, III; Storm LLP

(57) ABSTRACT

A semiconductor device includes a semiconductor layer of a first conductivity type and a semiconductor layer of a second conductivity type formed thereon. The semiconductor layer of the second conductivity type is characterized by a first thickness. The semiconductor device includes a set of trenches having a predetermined depth and extending into the semiconductor layer of the second conductivity type, thereby defining interfacial regions disposed between the semiconductor layer of the second conductivity type and each of the trenches. The trenches comprises a distal portion consisting essentially of a dielectric material disposed therein and a proximal portion comprising the dielectric material and a gate material disposed interior to the dielectric material in the proximal portion of the trench. The semiconductor device further includes a source region coupled to the semiconductor layer of the second conductivity type.

22 Claims, 71 Drawing Sheets

U.S. PATENT DOCUMENTS

| | | |
|---|---|---|
| 6,803,627 B2 | 10/2004 | Pfirsch |
| 7,230,310 B2 | 6/2007 | Chen |
| 2001/0041407 A1 | 11/2001 | Brown |
| 2003/0071616 A1 | 4/2003 | Hauenstein |
| 2003/0203576 A1 | 10/2003 | Kitada et al. |
| 2005/0032291 A1* | 2/2005 | Baliga .......................... 438/212 |
| 2005/0056886 A1* | 3/2005 | Tihanyi ........................ 257/330 |
| 2006/0060916 A1 | 3/2006 | Girdhar et al. |
| 2006/0118853 A1 | 6/2006 | Takata et al. |
| 2006/0214222 A1* | 9/2006 | Challa et al. .................. 257/328 |
| 2006/0267090 A1 | 11/2006 | Sapp et al. |

OTHER PUBLICATIONS

Kazerounian et al., "CODMOS—A Depletion MOSFET Using Fixed Oxide Charge", 41st Annual Device Research Conference, *IEEE Electron Devices Society*, Jun. 20-22, 1983.

Konig et al., "The Negatively Charged Insulator-Semiconductor Structure: Concepts, Technological Considerations and Applications,". *Solid State Electronics*, 2000; 44(1): 111-116.

Pfiester et al., "Gain-enhanced LDD NMOS Device Using Cesium Implantation," *IEEE Transactions on Electron Devices*, Jun. 1992; 39(6): 1469-1476.

International Search Report and Written Opinion of PCT Application No. PCT/US08/50505, dated Jul. 7, 2008, 17 pages total.

Watt et al. "A Low-Temperature NMOS Technology with Cesium-Implanted Load Devices" IEEE Trans. Electron Devices, 34, Jan. 1987, pp. 28-38.

J. T. Watt, B. J. Fishbein & J. D. Plummer; Low-Temperature NMOS Technology with Cesium-Implanted Load Devices; IEEE Trans. Electron Devices, vol. 34, # 1, Jan. '87; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan. '89; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. '92; p. 1469-1476.

\* cited by examiner

POWER MOS TRANSISTOR INCORPORATING FIXED CHARGES THAT BALANCE THE CHARGE IN THE DRIFT REGION

CROSS-REFERENCES TO RELATED APPLICATIONS

The present application claims benefit under 35 U.S.C. §119(e) of U.S. Provisional Patent Application No. 60/879,434, filed Jan. 9, 2007, entitled "Power MOS Transistor," the disclosure of which is incorporated herein by reference in its entirety.

The present application is related to co-pending and commonly assigned U.S. patent application Ser. No. 11/971,096, filed on Jan. 8, 2008, entitled "Semiconductor device," the disclosure of which is hereby incorporated by reference for all purposes.

The following four regular U.S. patent applications (including this one) are being filed concurrently, and the entire disclosure of the other applications are incorporated by reference into this application for all purposes:

Application Ser. No. 11/971,123, filed Jan. 8, 2008, entitled "Semiconductor device";
Application Ser. No. 11/971,096, filed Jan. 8, 2008, entitled "Semiconductor device";
Application Ser. No. 11/971,152, filed Jan. 8, 2008, entitled "Semiconductor device"; and
Application Ser. No. 11/971,169, filed Jan. 8, 2008, entitled "Method of manufacture for a semiconductor device".

BACKGROUND OF THE INVENTION

The present invention relates generally to the field of electronics. More particularly, the present invention relates to a power MOS transistor device and methods of manufacturing the same. Merely by way of example, the invention has been applied to a power MOS transistor incorporating fixed charges that balance the charge in the drift region. The present invention has applicability to both lateral and vertical MOSFET structures as well as other MOS structures.

Power MOSFETs are widely used as switching devices in many electronic applications. In order to minimize conduction and switching power loss it is desirable that power MOSFETs for a given breakdown voltage have low specific on-resistance and capacitances. Specific on-resistance ($R_{sp}$) is defined as the on-resistance area product ($R_{on}$* A). The Superjunction (SJ) structure achieves a low specific on-resistance by paralleling higher doping alternate p-type and n-type layers or pillars that are charge balanced. Therefore, for a SJ structure, it is desirable to pack as many pillars or cells in a given unit area to lower $R_{sp}$.

In a SJ structure, the minimum widths of the n-type and p-type pillars set a limitation on reducing cell pitch and scaling the device. There are also several drawbacks related to manufacturing this structure, including the need to grow multiple epitaxial layers combined by successive implant and diffusion steps. Alternative approaches such as forming trenches followed by epitaxial trench filling or providing floating islands have similar disadvantages. Therefore, there is a need in the art for a power MOS transistor characterized by a low $R_{sp}$ and low capacitances that can be scaled to finer cell pitches. Additionally, reductions in manufacturing complexity are desirable.

SUMMARY OF THE INVENTION

According to embodiments of the present invention, techniques related generally to the field of electronics are provided. More particularly, the present invention relates to a power MOS transistor device and methods of manufacturing the same. Merely by way of example, the invention has been applied to a power MOS transistor incorporating fixed charges that balance the charge in the drift region. In a particular embodiment, the fixed charges are present in one or more dielectric layers. The present invention has applicability to both lateral and vertical MOSFET structures as well as other MOS structures.

According to an embodiment of the present invention, a semiconductor device includes a semiconductor layer of a first conductivity type and a semiconductor layer of a second conductivity type formed on the semiconductor layer of the first conductivity type. The semiconductor layer of the second conductivity type is characterized by a first thickness. The semiconductor device also includes a body layer extending a first predetermined distance into the semiconductor layer of the second conductivity type and a pair of trenches extending a second predetermined distance into the semiconductor layer of the second conductivity type. Each of the pair of trenches consists essentially of a dielectric material disposed therein and a concentration of doping impurities present in the semiconductor layer of the second conductivity type and a distance between the pair of trenches define an electrical characteristic of the semiconductor device. The semiconductor device further includes a control gate coupled to the semiconductor layer of the second conductivity type and a source region coupled to the semiconductor layer of the second conductivity type.

According to another embodiment of the present invention, a semiconductor device includes a semiconductor layer of a first conductivity type and a semiconductor layer of a second conductivity type formed on the semiconductor layer of the first conductivity type. The semiconductor layer of the second conductivity type is characterized by a first thickness. The semiconductor device also includes a body layer extending a first predetermined distance into the semiconductor layer of the second conductivity type and a plurality of trenches extending a second predetermined distance into the semiconductor layer of the second conductivity type. Each of the plurality of trenches includes a first dielectric material disposed therein and the first dielectric material includes an intentionally introduced charge. The semiconductor device further includes a plurality of control gates coupled to the semiconductor layer of the second conductivity type and a plurality of source regions coupled to the semiconductor layer of the second conductivity type.

According to yet another embodiment of the present invention, a semiconductor device includes a semiconductor layer of a first conductivity type and a semiconductor layer including a first set of pillars having the first conductivity type and a second set of pillars having a second conductivity type. The first set of pillars and the second set of pillars are formed on the semiconductor layer of the first conductivity type. The first set of pillars and the second set of pillars are characterized by a first thickness. The semiconductor device also includes a plurality of trenches extending a predetermined distance into either the first set of pillars or the second set of pillars. Each of the plurality of trenches comprises a first dielectric material disposed therein and the first dielectric material includes an intentionally introduced charge. The semiconductor device further includes a plurality of control gates coupled to the semiconductor layer including the first set of pillars and the second set of pillars and a plurality of source regions coupled to the semiconductor layer including the first set of pillars and the second set of pillars.

According to an alternative embodiment of the present invention, a semiconductor device includes a semiconductor layer of a first conductivity type and a semiconductor layer of a second conductivity type formed on the semiconductor layer of the first conductivity type. The semiconductor layer of the second conductivity type is characterized by a first thickness. The semiconductor device also includes a trench having a predetermined depth and extending into the semiconductor layer of the second conductivity type, thereby defining an interfacial region disposed between the semiconductor layer of the second conductivity type and the trench. The trench includes a distal portion consisting essentially of a dielectric material disposed therein and a proximal portion comprising the dielectric material and a gate material disposed interior to the dielectric material in the proximal portion of the trench.

The semiconductor device further includes a second trench having the predetermined depth and extending into the semiconductor layer of the second conductivity type, thereby defining a second interfacial region disposed between the semiconductor layer of the second conductivity type and the second trench. The second trench includes a distal portion consisting essentially of the dielectric material disposed therein and a proximal portion comprising the dielectric material and the gate material disposed interior to the dielectric material in the proximal portion of the second trench. Moreover, the semiconductor device includes a source region coupled to the semiconductor layer of the second conductivity type.

According to a specific alternative embodiment of the present invention, a semiconductor device includes a semiconductor layer of a first conductivity type having formed thereon a semiconductor layer of a second conductivity type. The semiconductor layer of the second conductivity type is characterized by a first thickness. The semiconductor device includes a first trench having a predetermined depth and extending into the semiconductor layer of the second conductivity type, thereby defining a first interfacial region disposed between the semiconductor layer of the second conductivity type and the first trench. The first trench includes a distal portion consisting essentially of a dielectric material disposed therein and a proximal portion comprising the dielectric material and a gate material disposed interior to the dielectric material in the proximal portion of the trench. An intentionally introduced charge is provided in at least one of the dielectric material disposed in the distal portion of the first trench or the first interfacial region.

The semiconductor device also includes a second trench having the predetermined depth and extending into the semiconductor layer of the second conductivity type, thereby defining a second interfacial region disposed between the semiconductor layer of the second conductivity type and the second trench. The second trench includes a distal portion consisting essentially of the dielectric material disposed therein and a proximal portion comprising the dielectric material and the gate material disposed interior to the dielectric material in the proximal portion of the second trench. The intentionally introduced charge is provided in at least one of the dielectric material disposed in the distal portion of the second trench or the second interfacial region.

According to another alternative embodiment of the present invention, a semiconductor device includes a semiconductor layer of a first conductivity type having a first surface and a second surface, a source region disposed on the first surface, and a gate region disposed on the first surface adjacent the source region. The semiconductor device also includes a drain region disposed on the first surface and a pair of charge control trenches disposed between the gate region and the drain region. Each of the pair of charge control trenches is characterized by a width and includes a first dielectric material disposed therein and a second material disposed internal to the first dielectric material. A concentration of doping impurities present in the semiconductor layer of the first conductivity type and a distance between the pair of charge control trenches define an electrical characteristic of the semiconductor device that is independent of the width of each of the pair of charge control trenches. The semiconductor device further includes a control gate coupled to the semiconductor layer of the first conductivity type and a source region coupled to the semiconductor layer of the first conductivity type.

According to yet another alternative embodiment of the present invention, a semiconductor device includes a semiconductor layer of a first conductivity type having a first surface and a second surface, a source region disposed on the first surface, and a gate region disposed on the first surface adjacent the source region. The semiconductor device also includes a drain region disposed on the first surface and a charge control trench disposed between the gate region and the drain region. The charge control trench includes a first dielectric material disposed therein. The first dielectric material includes an intentionally introduced charge.

According to a particular embodiment of the present invention, a semiconductor device includes a semiconductor layer of a first conductivity type. The semiconductor layer of the first conductivity type has formed thereon a first semiconductor region of a second conductivity type. The first semiconductor region is characterized by a first thickness. The first semiconductor region includes a first trench having a predetermined depth and extending into the first semiconductor region, thereby defining a first interfacial region disposed between the first semiconductor region and the first trench. The first trench includes a first dielectric material disposed in a proximal portion of the first trench and distal portion of the first trench. An intentionally introduced charge is present in at least one of the first dielectric material disposed in the proximal portion of the first trench or the first interfacial region. The first trench also includes a first gate material disposed interior to the first dielectric material in the proximal portion of the first trench.

The semiconductor layer of the first conductivity type also has formed thereon a second semiconductor region of the first conductivity type. The second semiconductor region is characterized by a second thickness. The second semiconductor region includes a second trench having a second predetermined depth and extending into the second semiconductor region, thereby defining a second interfacial region disposed between the second semiconductor region and the second trench. The second trench includes a second dielectric material disposed in a proximal portion of the second trench and distal portion of the second trench. An intentionally introduced charge is provided in at least one of the second dielectric material disposed in the proximal portion of the second trench or the second interfacial region. The second trench also includes a second gate material disposed interior to the second dielectric material in the proximal portion of the second trench.

According to another particular embodiment of the present invention, a method of manufacturing a semiconductor device is provided. The method includes providing a semiconductor layer of a first conductivity type, forming a semiconductor layer of a second conductivity type on the semiconductor layer of the first conductivity type, forming one or more insulator layers on the semiconductor layer of the second conductivity type, and etching a plurality of trenches in the semiconductor layer of the second conductivity type, thereby forming a plurality of CC trenches and a CG trench. The method also includes forming an oxide layer in the plurality of trenches and on the semiconductor layer of the second conductivity type, forming a masking layer on a portion of the one or more insulating layers, forming a gate oxide layer in the CG trench, and forming polysilicon gate material in the CG trench. The method further includes forming a second insulator layer, thereby filling a portion of the CC trenches, forming a second material, thereby filling a second portion of the CC trenches, and forming a third insulator layer, thereby filling a remainder of the CC trenches. Furthermore, the method includes forming one or more device regions and forming a source metal layer.

According to yet another particular embodiment of the present invention, a method of manufacturing a semiconductor device is provided. The method includes providing a semiconductor layer of a first conductivity type, forming a semiconductor layer of a second conductivity type on the semiconductor layer of the first conductivity type, forming an insulator layer on the semiconductor layer of the second conductivity type, and etching a trench into at least the semiconductor layer of the second conductivity type. The method also includes forming a thermal oxide layer in the trench and on the semiconductor layer of the second conductivity type, implanting ions into the thermal oxide layer, forming a second insulator layer, thereby filling at least a portion of the trench. and removing the second insulator layer from a portion of the trench. The method further includes forming an oxide layer in the trench and on the epitaxial layer, forming a material in the trench, forming one or more device regions, and forming a second gate oxide layer over the gate material. Moreover, the method includes patterning the second gate oxide layer and forming a source metal layer.

According to a specific embodiment of the present invention, a method of manufacturing a semiconductor device is provided. The method includes providing a semiconductor layer of a first conductivity type, forming a semiconductor layer of a second conductivity type on the semiconductor layer of the first conductivity type, etching a trench into at least the semiconductor layer of the second conductivity type, and forming a first insulator layer in the trench. The method also includes forming a second insulator layer, thereby filling at least a portion of the CC trenches and forming a gate material in the trench. The method further includes forming one or more device regions and forming a source metal layer.

According to another specific embodiment of the present invention, a method of manufacturing a semiconductor device is provided. The method includes providing a semiconductor layer of a first conductivity type. forming a semiconductor layer of a second conductivity type on the semiconductor layer of the first conductivity type, forming an insulator layer on the semiconductor layer of the second conductivity type, and etching one or more trenches into at least the semiconductor layer of the second conductivity type. The method also includes forming a second insulator layer in the one or more trenches, implanting ions into the second insulator layer, forming a third insulator layer, thereby filling at least a portion of the one or more trenches, and etching an additional trench into at least the semiconductor layer of the second conductivity type. The method further includes forming a gate oxide layer in the additional trench, forming a gate material in the additional trench, forming one or more device regions, and forming a source metal layer.

According to yet another specific embodiment of the present invention, a method of manufacturing a semiconductor device is provided. The method includes providing a semiconductor layer of a first conductivity type, forming a semiconductor layer of a second conductivity type on the semiconductor layer of the first conductivity type, and forming an insulator layer on the semiconductor layer of the second conductivity type. The method also includes etching a trench into at least the semiconductor layer of the second conductivity type, forming an oxide layer in the trench and on the semiconductor layer of the second conductivity type, and implanting ions into the oxide layer. The method further includes forming a second insulator layer, thereby filling the trench, forming one or more device regions, and forming a metal layer.

Numerous benefits are achieved using the present invention over conventional techniques. For example, in an embodiment according to the present invention, improved MOSFET conduction and switching performance is achieved. Moreover, in other embodiments, paralleling of alternate charge balanced dielectric and silicon layers provides a device with performance exceeding the one dimensional silicon breakdown voltage limit for a given doping concentration. The use of fixed charge reduces the capacitances compared to conventional techniques where p-n junctions are used for charge balance purposes. Furthermore, reverse recovery charge $Q_{rr}$ and Safe Operating Area (SOA) are improved over conventional devices. Depending upon the embodiment, one or more of these benefits may exist. These and other benefits have been described throughout the present specification and more particularly below. Various additional objects, features and advantages of the present invention can be more fully appreciated with reference to the detailed description and accompanying drawings that follow.

DETAILED DESCRIPTION OF SPECIFIC EMBODIMENTS

According to embodiments of the present invention, a power MOSFET structure is provided that is characterized by improved conduction and switching performance. In a particular embodiment, a high voltage MOSFET structure is provided in which dielectric layers containing charge are used to balance the charge in the drift region. By alternating dielectric and silicon layers that are charge balanced, the structure's performance exceeds the one dimensional silicon breakdown voltage limit for a given doping concentration. Both vertical and lateral MOSFET structures are provided by embodiments of the present invention. Furthermore, in a specific embodiment, a lateral structure is used in which dielectric layers with charge are combined with double or multiple Reduced SURface Field (Resurf) techniques for additional improvement in breakdown voltage and/or on-resistance. Methods of fabricating these structures are described and further details, embodiments and examples of the invention are described throughout the present specification. While reference is made to silicon as the semiconductor material, this invention is applicable to power MOSFETs fabricated in other materials including other semiconductor materials.

Figure 42A:
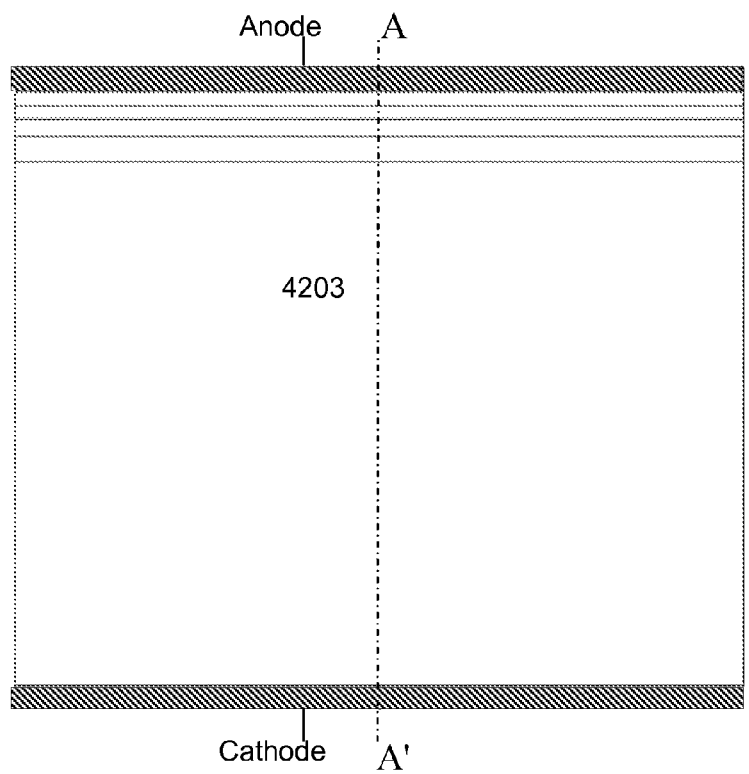
FIG. 42A is a simplified cross-sectional illustration of a p-n diode structure at breakdown with equi-potential contours shown.
Figure 42B:
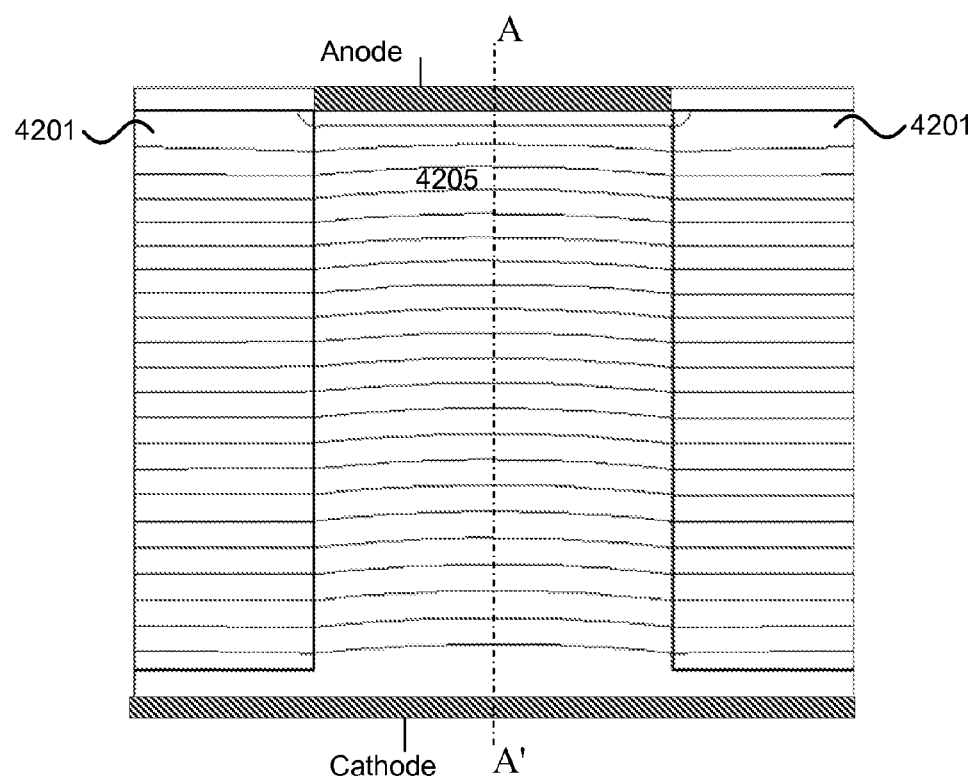
FIG. 42B is a simplified cross-sectional illustration of a diode structure with fixed charge selected for high reverse blocking at breakdown with equi-potential contours shown.

FIGS. 42A and 42B are simplified cross-sectional illustrations of diodes with a anode contact at the top and a cathode contact at the bottom. In FIG. 42A, a semiconductor region 4203 lies between the anode and cathode. In FIG. 42B, a semiconductor region 4205 lies between two insulating regions 4201. The equipotential lines at breakdown are also shown in FIGS. 42A-B with each iso-contour representing 10V. The width of the mesa region 4205 in the simulation was 1 μm with the distance between anode and cathode being 10 μm and the widths of the insulating layers being 0.5 μm. In FIG. 42A, the simulation was carried out on a simple p-n diode while in FIG. 42B, there was fixed charge along the interface between 4201 and 4205. The fixed charge density ($Q_{f/q}$), where q is the electron charge, was selected for maximum breakdown voltage. The doping of the semiconducting region was $2 \times 10^{16}/cm^3$ in both cases. In the present specification, references to fixed charge are provided to illustrate that in some embodiments, spatially fixed charge, which is generally provided by an ion implantation process, are utilized in the transistor devices. The use of the term "fixed charge" is not intended to limit embodiments of the present invention to implanted charges, but is used to represent provided (also referred to as intentionally introduced) charges present in the devices.

The simulations clearly show that the presence of fixed charge can increase the breakdown voltage significantly. In the absence of fixed charge, the doping level within the mesa must generally be much lower and the semiconducting region thicker in order to achieve the same high breakdown voltage. However, this lower doping level and thicker semiconducting region would increase the specific on-resistance of the drift region of any power MOSFETs made in such a structure.

Figure 42C:
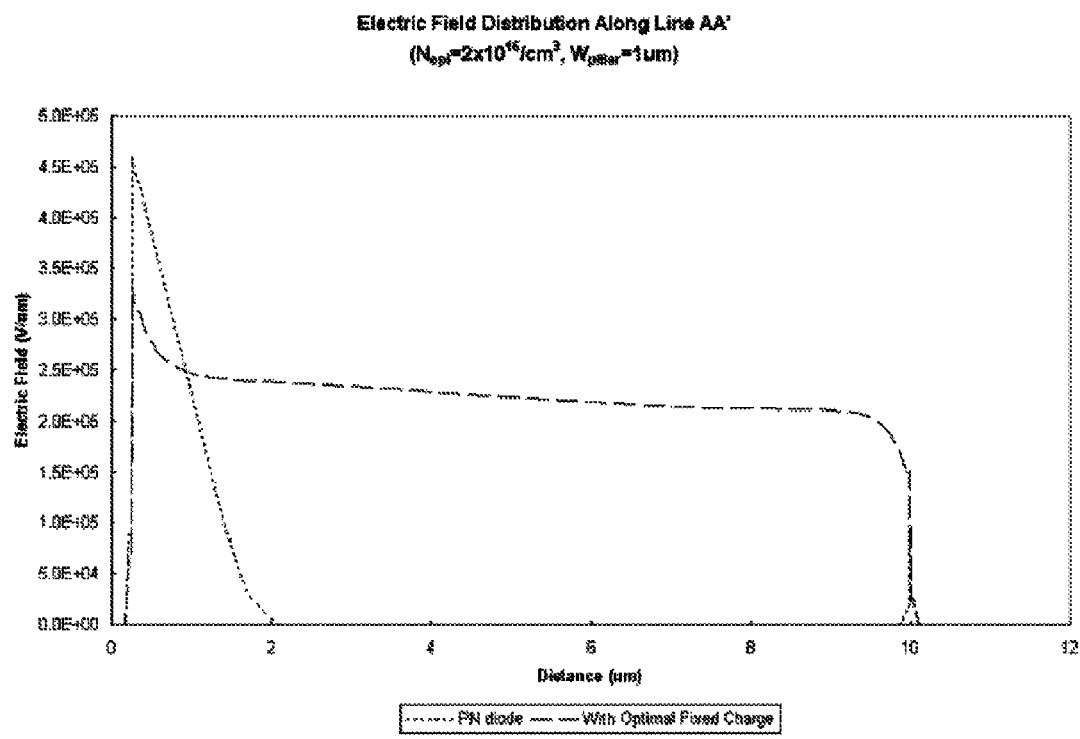
FIG. 42C shows the electric field along line AA' of FIG. 42A and FIG. 42B.

FIG. 42C shows the difference in electric field along cross-sectional line AA' for the structures shown in FIGS. 42A and 42B. The electric field distribution is poor for the p-n diode while with the fixed charge, the electric field is more uniformly distributed and is therefore nearly ideal to maximize breakdown voltage. Under reverse bias, the fixed charge enables the ionized dopant atoms in the mesa 4205 to terminate laterally, which allows a substantially uniform electric field to be maintained along cross-sectional line AA' in FIG. 42B. For FIG. 42A, under reverse bias the ionized dopants must terminate at the cathode so the electric field profile is triangular in shape.

Figure 42D:
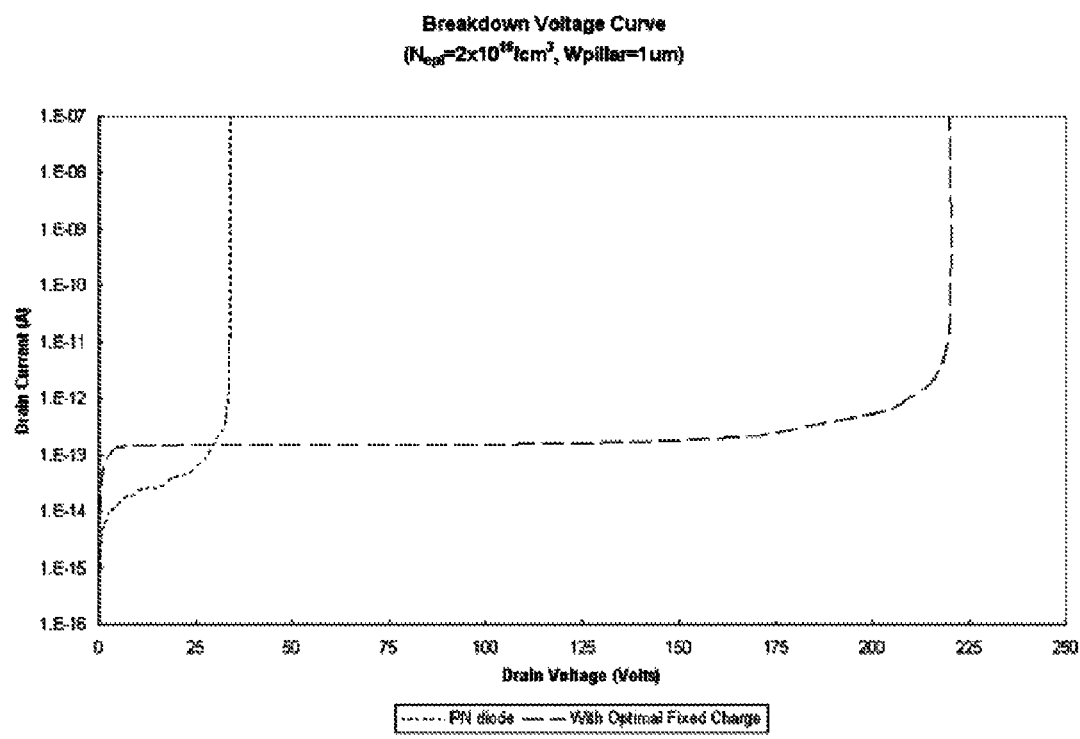
FIG. 42D shows the electrical breakdown characteristics of the diodes in FIGS. 42A and 42B.

FIG. 42D shows the electrical terminal characteristics of the p-n diode and the fixed charge diode structure. Without fixed charge, the breakdown voltage is approximately 34V, while with the optimal fixed charge, the breakdown voltage is approximately 220V. The data shown in FIGS. 42A-D shows that the use of fixed charge as a charge balance technique enables a high breakdown voltage.

While fixed charge is known by those skilled in the art as generally occurring near the interface between silicon and dielectric materials, this fixed charge is generally considered deleterious to semiconductor device performance and is therefore minimized as much as possible during device fabrication. The magnitude of such normally occurring fixed charge is insufficient to enhance breakdown voltage as shown in FIG. 42D. In the present specification, fixed charge refers to charge intentionally introduced using processes such as ion implantation, diffusion, deposition and the like in addition to charge that results as a by product of fabrication processes. Furthermore, while the interface between the dielectric and the semiconductor region is referred to, it is known that the interface region is not distinct so the interfacial charge, while generally in the dielectric, may extend somewhat into the semiconductor material as well.

According to embodiments of the present invention, novel power MOSFET structures and methods of making such structures are disclosed. The new structures utilize a concept of providing dielectric layers that have intentionally introduced charge ($Q_f$). By alternating dielectric and silicon (drift) layers that are charge balanced, a structure sustains a higher voltage for a given drift region's doping concentration. In some embodiments, the drift region is formed using epitaxial growth, implantation or lightly doped epitaxial growth followed by implantation, or the like. The device performance provided by embodiments of the present invention exceeds the one dimensional silicon breakdown voltage limit for the same thickness of the epitaxial layer.

In the following description, fixed charge(s) refers to the charge intentionally introduced using processes such as ion implantation, diffusion, deposition and the like in addition to the charge that results as a by-product of fabrication processes. Furthermore, while reference is made below generally with respect to interfacial charges, i.e., charges in the interface region between the dielectric and the semiconductor region, it is understood that such charges may also be present both in the dielectric as well as in the semiconductor region in which the dielectric regions are formed.

At reverse bias, dielectric layer's charge is balanced by charges in the depletion region. At zero bias, the dielectric layer's charge is balanced, in part, by the charges present in an inversion layer that forms at the semiconductor-dielectric layer interface. The charge in the dielectric layer is located at or close to the semiconductor-dielectric interface for maximum effectiveness. The charge is preferably immobile at typical device operating temperatures. Both negative or positive charges can be used to provide the required charge to balance the depletion charge of the ionized impurities of the semiconductor layer. This results in a more uniform electric field along the voltage sustaining region and therefore a higher breakdown voltage.

The present invention provides a number of advantages over conventional semiconductor structures that depend primarily on the permittivity and width of a dielectric layer adjacent the semiconductor region. In accordance with the present invention, the fixed charge provided for charge balance is not a function of the trench width. Therefore, to achieve a higher breakdown voltage, the width of the dielectric layer is only limited by the steps needed to introduce the fixed charge and refill the trench, which enables smaller cell pitches than that which can be obtained by conventional SJ or non-SJ type structures. Furthermore, by implementing charge balance by using charges in dielectric layers and not p-n junctions or field plates, lower capacitances are achieved. The structures of the present invention as described herein are easier and more cost effective to fabricate than conventional devices.

Utilizing embodiments of the present invention, one or more electrical characteristics (e.g., breakdown voltage) of the semiconductor device are not substantially a function of the trench width. As an example, the electrical characteristic of the device (e.g., the breakdown voltage) is defined by the distance between the trenches and the concentration of dopants present in the material between the trenches. In a particular example, the integrated charge density of the dopants measured along a line perpendicular to the epitaxial layers of the device between the pair of trenches ranges from about $q*1\times10^{12}/cm^2$ to about $q*5\times10^{12}/cm^2$. Other integrated dopant (also referred to as doping impurity) charge densities are included within the scope of embodiments of the present invention.

Figure 1A:
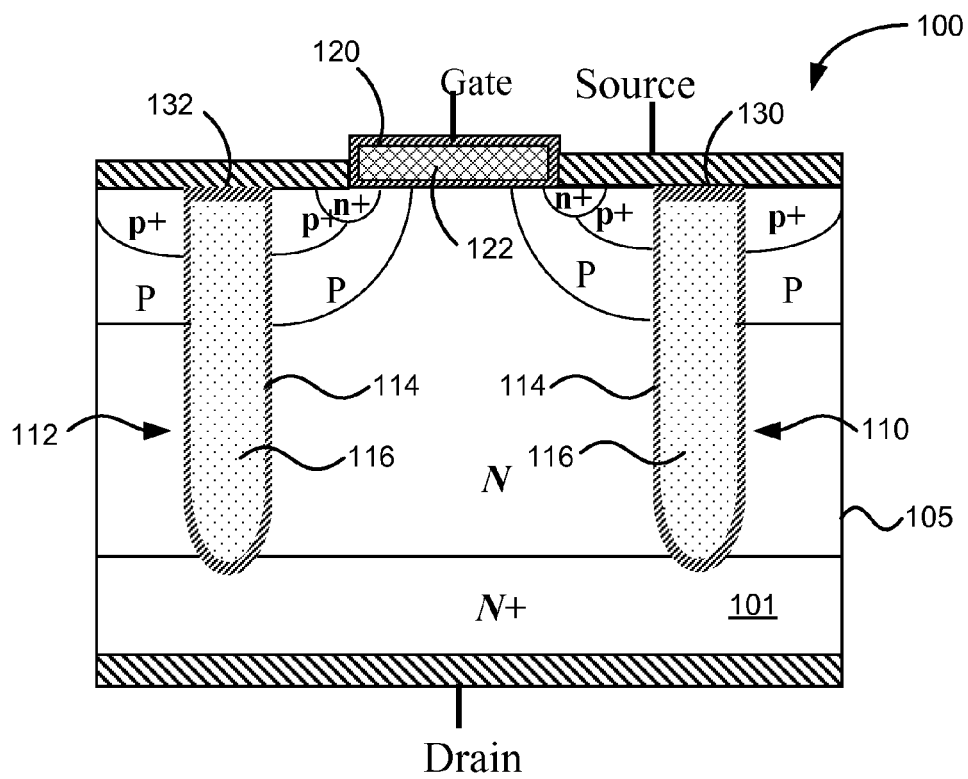
FIG. 1A is a simplified illustration of a planar n-channel DMOS transistor according to an embodiment of the present invention.

FIG. 1A is a simplified illustration of a planar n-channel DMOS transistor 100 according to an embodiment of the present invention. Although FIG. 1A illustrated an n-channel DMOS transistor, embodiments of the present invention are applicable to other MOSFET designs including p-channel MOSFETs, IGBTs, and the like. In the embodiment illustrated in FIG. 1A, the basic cell of an n-channel MOSFET 100 is illustrated on an n-type epitaxial layer 105 grown over a heavily doped n+ substrate 101. Although some embodiments refer to substrate 101 as a substrate, it will be understood that the substrate 101 could be a polished substrate suitable for initial processing or could include a substrate having one or more epitaxial layers grown thereon. Thus, the use of the term substrate is not limited to unprocessed semiconductor wafers, but includes structures providing a starting material useful for subsequent semiconductor processing operations. One of ordinary skill in the art would recognize many variations, modifications, and alternatives.

As illustrated in FIG. 1A, the device has a planar control gate 120 and two deep charge control trenches 110 and 112 having a negative charge. In this embodiment, the Charge Control (CC) trenches 110 and 112 extend from a surface of the device into the heavily doped n+ substrate 101. In one embodiment, the n-drift region formed in the n-type epitaxial layer 105 is uniformly doped. In another embodiment, the n-drift region in the n-type epitaxial layer 105 is non-uniformly doped. For example, the doping profile can be graded to have higher doping at substrate that decreases towards the surface or vice versa depending on the device parameters.

Although not discussed in relation to each and every embodiment described in the present specification, the integrated charge between the adjacent CC trenches 110 and 112 can be measured. In some embodiments, the integrated charge density ($Q_{P/q}$) measured between the set of trenches 110/112 along a line parallel to the semiconductor layer 105 ranges from about $1\times10^{12}$ cm$^{-2}$ to about $5\times10^{12}$ cm$^{-2}$, where q is the electron charge. To obtain highest performance in some embodiments, the integrated charge is preferably balanced by fixed charge provided via the CC trenches. When the integrated charge is balanced by fixed charge provided via the CC trenches, the electrical characteristics of the semiconductor device, for example, the breakdown voltage between the source and drain terminals is independent of the width of the trenches.

Figure 1B:
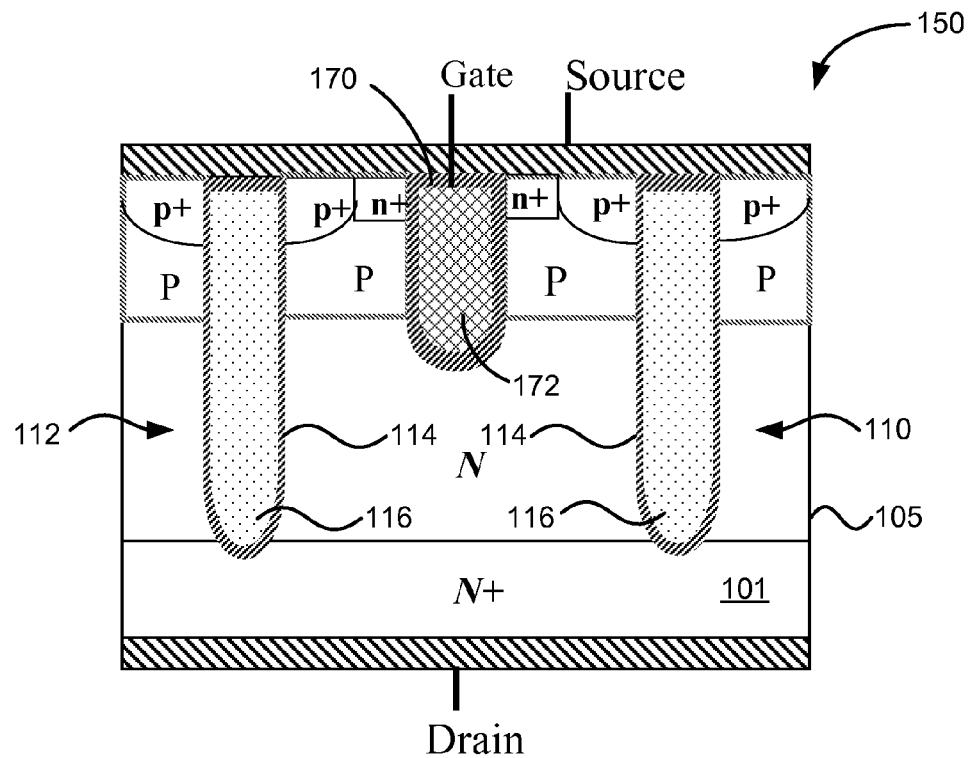
FIG. 1B is a simplified illustration of a trench n-channel MOS transistor according to an embodiment of the present invention.

FIG. 1B is a simplified illustration of a trench n-channel MOS transistor 150 according to an embodiment of the present invention. In the embodiment illustrated in FIG. 1B, the basic cell of the n-channel MOSFET 150 is illustrated on an n-type epitaxial layer 105 grown over a heavily doped n+ substrate 101. As illustrated in FIG. 1B, the device has a trench control gate 170 and two deep charge control trenches 110 and 112 having a negative charge. The trench control gate (CG) 170 extends from a surface of the device into the n-type epitaxial layer 105. As in the embodiment illustrated in FIG. 1A, the CC trenches 110 and 112 extend from a surface of the device into the heavily doped n+ substrate 101.

In the embodiments illustrated in FIGS. 1A and 1B, a first dielectric material 114, for example, a thermally grown oxide layer, lines the bottom and the walls of the CC trench. In a specific embodiment, the first dielectric material ranges in thickness from about 2 nm to about 200 nm. In a particular embodiment, the thickness of the first dielectric material is about 30 nm. The CC trenches 110 and 112 are filled with a second insulating material 116, which may also be referred to as a compound or composite material herein, in inner portions of the trench interior to the first dielectric material. In a particular embodiment, the second material 116 includes an aluminum fluoride material. As described more fully throughout the present specification, the second/compound/composite material, which may, for example, be aluminum fluoride, provides negative charges at the interface with the first dielectric material. The compound material is a single material in some embodiments and includes multiple layers of one or more materials in other embodiments. Thus, the first dielectric material 114 and the second material 116 may be the first dielectric material. As an example, the second material may be a dielectric material as well. It should be noted that the second material may be a dielectric material that includes the same material as the first dielectric material or a different material.

Referring to FIG. 1A, the tops of the CC trenches 110 and 112 are covered with a layer of the first dielectric material, illustrated as layers 130 and 132, respectively. Additionally, the planar gate 120 is insulated using the first dielectric material in the embodiment illustrated in FIG. 1A. A layer of gate conducting material 122/172, typically doped polysilicon, is illustrated in FIG. 1A and FIG. 1B. In the embodiment illustrated in FIG. 1B, the first insulating material is provided as a layer on the walls and bottom of the trench gate 170. The formation of this layer on the walls and bottom of the trench gate could be performed concurrently or simultaneously with the formation of the first dielectric layers 114 or as a separate process step. One of ordinary skill in the art would recognize many variations, modifications, and alternatives. Source and drain metallization is provided as appropriate to the functionality of the MOSFET device. As illustrated in both FIGS. 1A and 1B, diffused body regions are provided in the devices. These n+, p+, and p-type layers are formed using conventional fabrication processes such as implantation, diffusion, annealing, and the like. The fabrication of these layers is discussed in additional detail throughout the present specification.

Referring to FIG. 1B, the integrated charge between the two CC trenches 110 and 112 can be measured. In some embodiments, the integrated charge density ($Q_{N/q}$) measured between the set of trenches along a line parallel to the surface ranges from about $1 \times 10^{12}$ cm$^{-2}$ to about $5 \times 10^{12}$ cm$^{-2}$, where q is the electron charge. In a particular embodiment, the integrated charge density measured between the set of trenches 110 and 112 is about $2 \times 10^{12}$ cm$^{-2}$. To obtain highest performance, the integrated charge is balanced by fixed charge provided via the CC trenches.

Figure 2A:
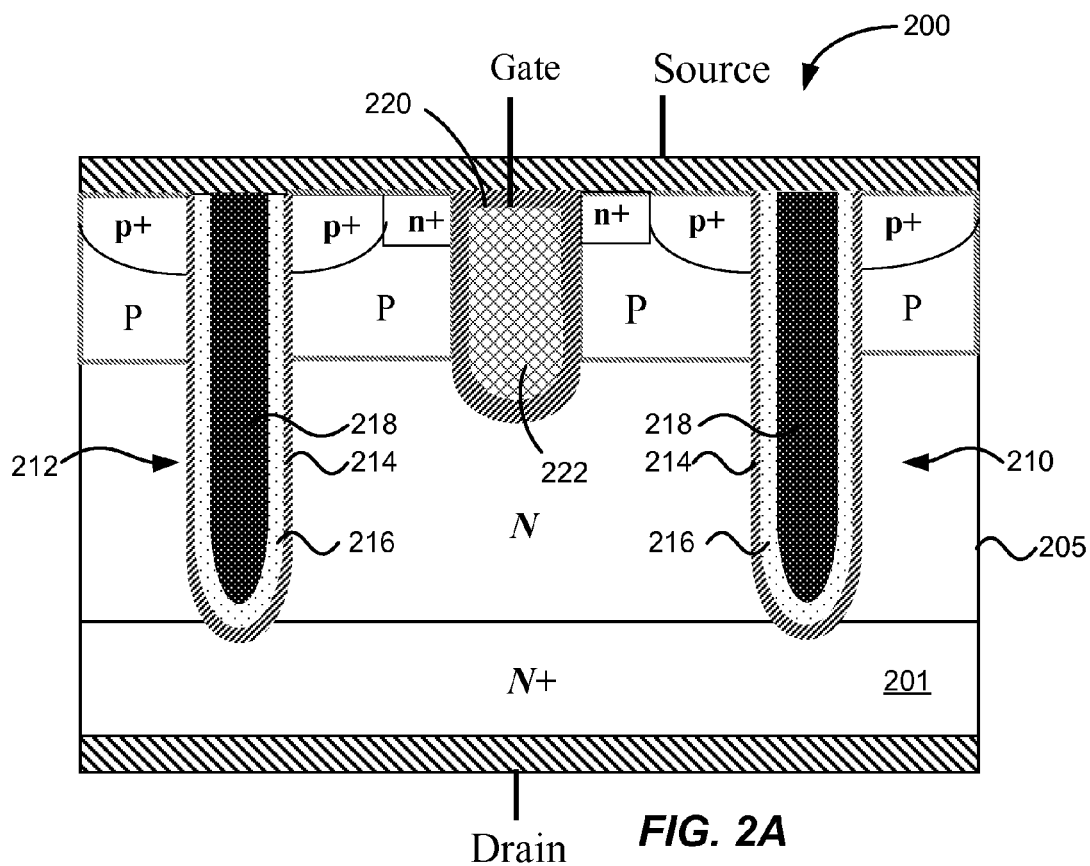
FIG. 2A is a simplified illustration of a trench MOS transistor with Charge Control trenches including a second dielectric material according to an embodiment of the present invention.

FIG. 2A is a simplified illustration of a trench MOS transistor with CC trenches including a second dielectric material according to an embodiment of the present invention. The n-channel trench MOS transistor 200 is formed on an n-type epitaxial layer 205 grown over a heavily doped n+ substrate 201. As illustrated in FIG. 2A, the device has a trench control gate 220 and two deep charge control trenches 210 and 212 having a negative charge. The trench CG 220 extends from a surface of the device into the n-type epitaxial layer 205. In this embodiment, the CC trenches 210 and 212 extend from a surface of the device into the heavily doped n+ substrate 201.

In the embodiment illustrated in FIG. 2A, the CC trenches 210 and 212 include a first dielectric layer 214, a compound material layer 216, and a second dielectric layer 218. The geometry of the illustrated device features the first dielectric layer 214 on the walls and bottom of the CC trenches 210 and 212, the compound material layer 216 interior to the first dielectric layer 214, and the second dielectric layer 218 interior to the compound material layer 216. In a first embodiment, the second dielectric layer 218 is the same material type as the first dielectric layer 214. In a second embodiment, the first and second dielectric layers are formed using different materials. Sandwiching of the compound material layer 216, for example, aluminum fluoride, between the two insulating layers provides negative charges at the interfaces between the insulating layers and the compound material.

The combination of the first dielectric layer 214, the compound material layer 216, and the second dielectric layer 218 fill the CC trenches 210 and 212. As illustrated in FIG. 2A, the tops of the CC trenches 210 and 212 are not covered with the first dielectric material, but are in electrical contact with the source metallization. A layer of gate conducting material 222, typically doped polysilicon, and diffused body and source regions are provided in the device illustrated in FIG. 2A. These n+, p+, and p-type layers are formed using conventional fabrication processes such as implantation, diffusion, annealing, and the like. The fabrication of these layers is discussed in additional detail throughout the present specification. Source and drain metallization is provided as appropriate to the functionality of the MOSFET device.

In several embodiments power MOSFET structures are disclosed that utilize negative charge present in dielectric layers to balance the positive depletion charge of the ionized impurities in n-type silicon layers. In a specific embodiment, the walls and the bottom of a control gate (CG) trench are lined with a first dielectric material such as silicon oxide (SiO$_2$) and is filled with a conducting material such as doped polysilicon. A charge control (CC) trench has a thin first dielectric layer, such as an oxide, a few nanometers in thickness that is covered by a layer of an insulating or compound material such as aluminum oxide (Al$_2$O$_3$) or aluminum fluoride (AlF$_3$ or AlF$_x$), where a negative charge is generated at the oxide-compound material interface. This negative charge generation effect using a compound insulating layer of silicon dioxide and aluminum fluoride (AlF$_3$ or AlF$_x$) has been experimentally verified where the negative interface charge was found to be a strong function of the fraction x. Positive charge in the N-drift depletion region created at reverse bias is balanced by the negative fixed charge located at or close to the interface of first dielectric layer of the charge control trenches.

In several other embodiments, n-channel power MOSFET structures are disclosed that utilize dielectric layers that have positive charge ($Q_f$) and p-type silicon layers to sustain voltage. The dielectric layer is provided in a trench located below or parallel to the control gate. Under equilibrium conditions, the positive charge in a dielectric layer or the dielectric layer-silicon interface is partially balanced by an inversion layer charge formed at the silicon-dielectric interface. At reverse bias, the positive charge balances the negative depletion layer charge of the ionized impurities of the p-type drift region. The positive charge can be realized, for example, by implanting positive ions such as cesium or potassium into the oxide layer that lines the trench walls and bottom. An alternative method to realize positive charge is by depositing dielectric films where a high density of positive charges can be introduced, such as silicon-nitride or silicon-oxynitride or a combination of the two methods described above.

Figure 2B:
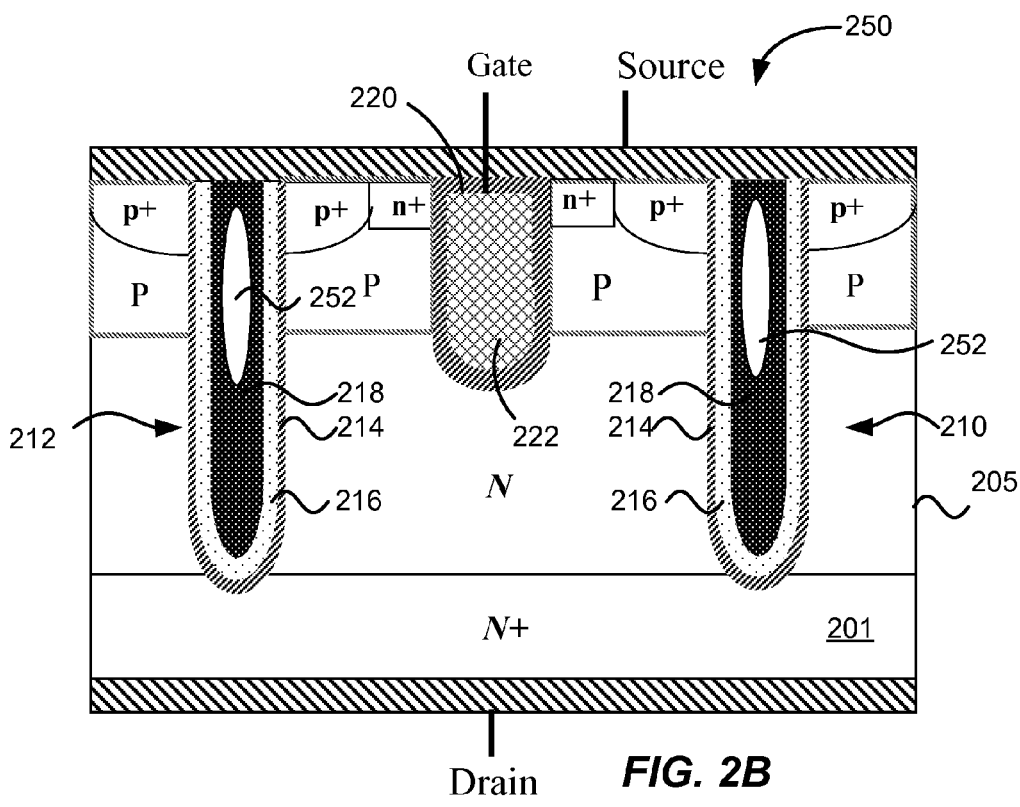
FIG. 2B is a simplified illustration of a trench MOS transistor with Charge Control trenches including a second dielectric material and a void according to an embodiment of the present invention.

FIG. 2B is a simplified illustration of a trench MOS transistor 250 with Charge Control trenches including a second dielectric material and a void according to an embodiment of the present invention. As illustrated in FIG. 2B, a void 252 is formed in each of the CC trenches during device fabrication. The void 252, which may occur during dielectric formation processes in high aspect ratio trenches, provides for an additional dielectric material (e.g., air or an inert environment) interior to the dielectric materials illustrated in the CC trenches. In some embodiments, the one or more voids formed in the CC trench are intentionally introduced, whereas in other embodiments, they are a byproduct of the deposition process utilized during device fabrication. The depth and width of the void will depend on the particular process flows utilized during device fabrication. Although a single void is illustrated in FIG. 2B, this is not required by embodiments of the present invention, as multiple voids may be utilized in other embodiments. Additionally, although voids 252 are illustrated as completely encapsulated by second dielectric layer 218, this is not required by embodiments of the present invention. One of ordinary skill in the art would recognize many variations, modifications, and alternatives.

Figure 3A:
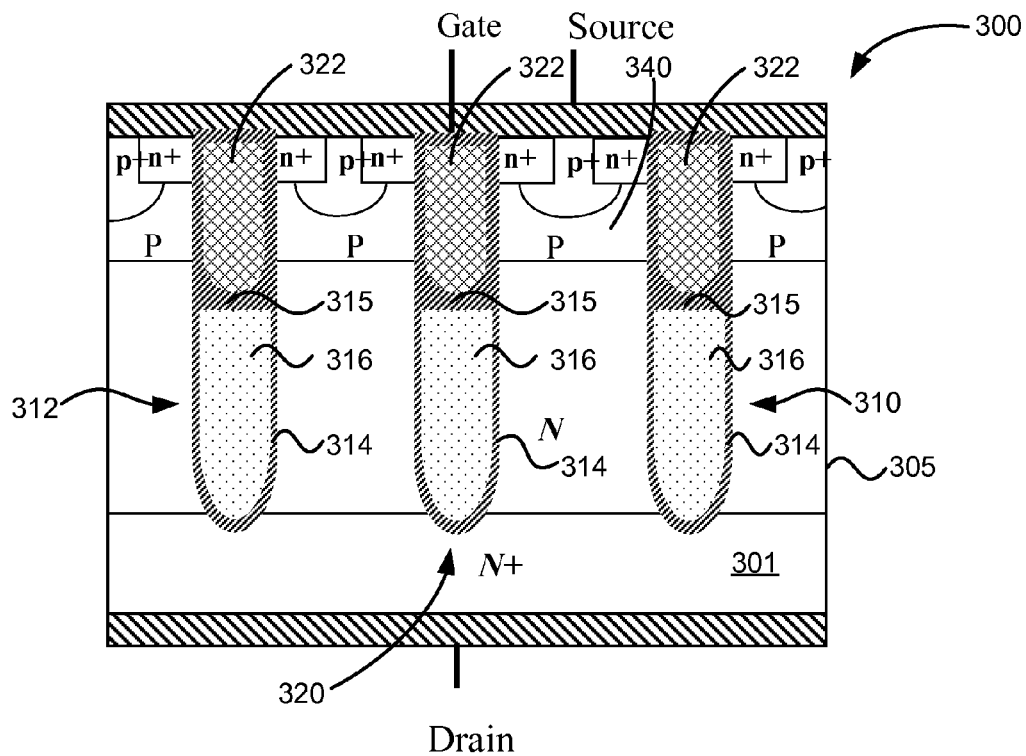
FIG. 3A is a simplified illustration of a trench MOS transistor with Control Gate and Charge Control provided in the same trench according to an embodiment of the present invention.

FIG. 3A is a simplified illustration of a trench MOS transistor's basic cell with Control Gate and Charge Control provided in the same trench according to an embodiment of the present invention. As illustrated in FIG. 3A, for each cell, both the CG and CC trenches are constructed in the same trench.

The n-channel trench MOS transistor 300 is formed on an n-type epitaxial layer 305 grown over a heavily doped n+ substrate 301. As illustrated in FIG. 3A, the device has a combined control gate and charge control trench 320 with the charge control trench region at the distal end of the trench having a negative charge. The trench CG 320 extends from a surface of the device (the proximal end of the trench) through the n-type epitaxial layer 305, passing into the heavily doped n+ substrate 301 (the distal end of the trench). As illustrated, the trench CG 320 extends below the p-body n-drift junction 340. In this embodiment, the CC region of the trenches 310 and 312 extends from below the p-body/n-drift junction into the heavily doped n+ substrate 301.

In the embodiment illustrated in FIG. 3A, the CC trenches 310 and 312 as well as the trench CG include a first dielectric layer 314 and a compound material layer 316 in a lower portion of the CC trenches and the trench CG. The upper portion of the CC trenches 310 and 312, as well as the upper portion of the trench CG includes an additional first dielectric layer 315 and gate conducting material 322. The interface between the compound material layer 316 and the additional first dielectric material 315 defines the interface between the lower portion and the upper portion of the CC trenches as well as the CG trench. As illustrated in FIG. 3A, this interface is positioned in the n-type epitaxial layer 305.

The geometry of the device illustrated in FIG. 3A features the first dielectric layer 314 on the walls and bottom of the CC trenches 310 and 312 as well as the CG trench 320 and the compound material layer 316 interior to the first dielectric layer 314 in the lower portion of the CC trenches 310 and 312 and the CG trench 320. In the upper portion of the CC trenches 310 and 312 and the CG trench 320, the additional first dielectric layer 315 is interior to the first dielectric layer 314 and the gate conducting material 322 is interior to the additional first dielectric material 315. In some embodiments, the first dielectric layer 314 and the additional first dielectric material 315 are the same material type, although this is not required by the present invention. The compound material 316, for example aluminum fluoride, and the gate conducting material 322, for example, doped polysilicon are provided as illustrated.

The tops of the CC trenches 310 and 312 as well as the trench CG 320 are covered with a layer of at least one of the first dielectric material 314 and the additional first dielectric material 315. Diffused regions are provided in the device illustrated in FIG. 3A. These n+, p+, and p-type layers are formed using conventional fabrication processes such as implantation, diffusion, annealing, and the like. The fabrication of these layers is discussed in additional detail throughout the present specification. Source and drain metallization is provided as appropriate to the functionality of the MOSFET device. A process of fabricating the device illustrated in FIG. 3A is discussed in relation to FIGS. 41A-I. It will be appreciated that the composition of the dielectric materials in the bottom portion of the CC trench (the distal portion of the trench) illustrated in FIGS. 3A and 41I are different. The variations in design can be implemented, for example, by modifications to the process flow at the step illustrated in FIG. 41D. One of ordinary skill in the art would recognize many variations, modifications, and alternatives.

Figure 3B:
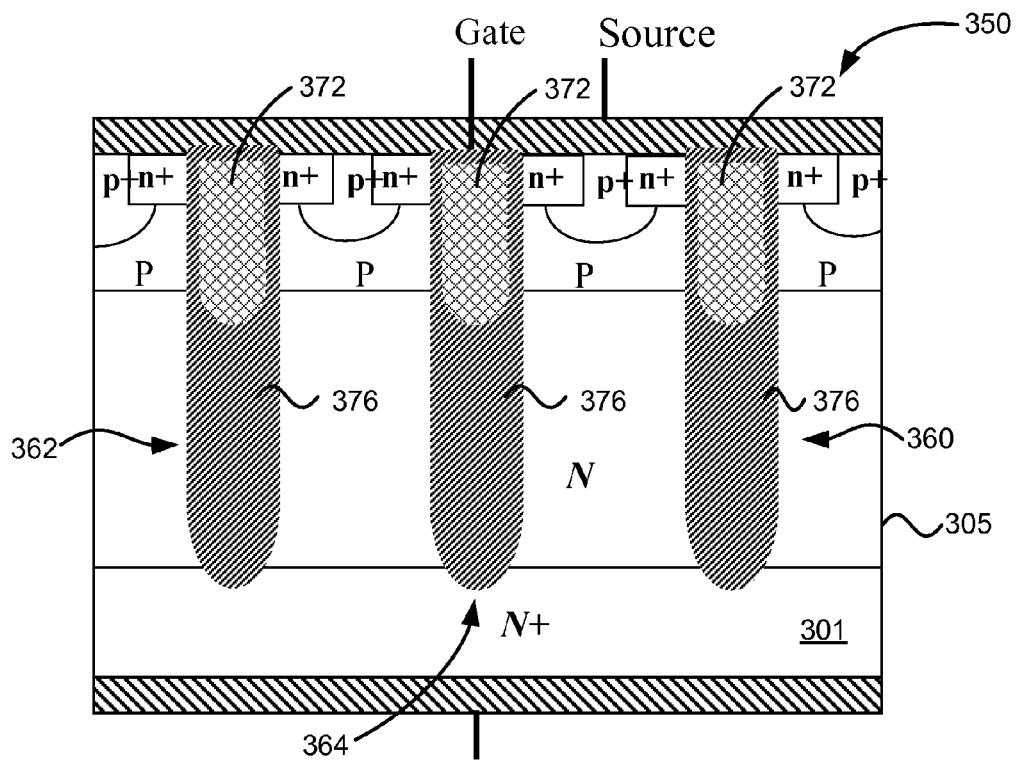
FIG. 3B is a simplified illustration of a trench MOS transistor with Control Gate and Charge Control provided in the same trench according to another embodiment of the present invention.

FIG. 3B is a simplified illustration of a trench MOS transistor with Control Gate and Charge Control provided in the same trench according to another embodiment of the present invention. Fabricated on a heavily doped n+ substrate 301 and an n-type epitaxial layer 305, the transistor includes a Control Gate (CG) and Charge Control (CC) region constructed in the same trench. Three such trenches 360, 362, and 364 are illustrated. The bottoms of the trenches 360, 362, and 364 extend into the n+ substrate 301. The trenches include control gates 372 in an upper portion of the trench (the proximal portion of the trench) and a dielectric material 376 in a lower portion of the trench (the distal portion of the trench).

Negative charge is located in dielectric layer or the dielectric layer-silicon interface present in the trenches 360, 362, and 364 below the CG. In the on-state, electron current flows from the source through the channel and the n-type drift region to the n+ substrate 301. It is worth noting that the CG sufficiently overlaps the CC portion of the trench for continuity of the current flow.

In accordance with embodiments of the present invention, the presence of the fixed charges in the trench dielectric results in a "built-in" depletion of carriers in the drift region.

As illustrated by various embodiments of the present invention, fixed charges present at or near the dielectric interface between the trench and the drift region balance charge present in the drift region. In another embodiment the negative charge $Q_f$ is such that the n-region below the CG is fully depleted at the breakdown voltage. Generally, the negative charge in the dielectric layer is provided by iodine, bromine, chlorine, chromium, aluminum, or other suitable atoms using ion implantation or diffusion of impurities into the oxide using techniques such as vapor deposition of impurities on the oxide layer followed by a drive-in or annealing step. A process of fabricating the device illustrated in FIG. 3B is discussed in relation to FIG. 40.

Figure 16:
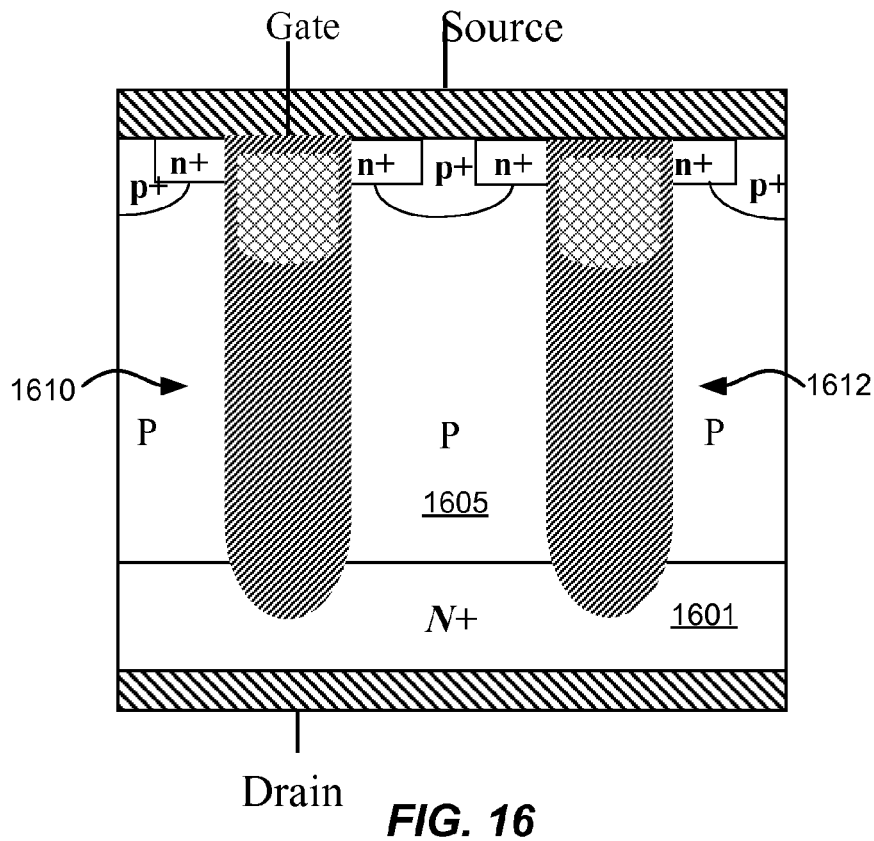
FIG. 16 is a simplified illustration of an n-channel trench MOS transistor with positive charge dielectric layer filled charge control trenches according to an embodiment of the present invention.

Referring to FIG. 3B and FIG. 16, both figures relate to an n-channel MOSFET, but in FIG. 3B, a negative fixed charge is used at the interface. This negative charge balances the positive depletion charge of the n-drift region at reverse bias. In FIG. 16, a positive fixed charge is used to balance the negative charge of the p-region at reverse bias. In the on-state, the positive fixed charge induces an inversion layer along the interface between the CC trench and the silicon, which is used for conduction. In the n-type case (FIG. 3B), the region nearest the charge control region is depleted so the current flows towards the center of the silicon pillars. In the positive fixed charge case (FIG. 16), the current flows completely along the interface between the silicon and the oxide.

Figure 4:
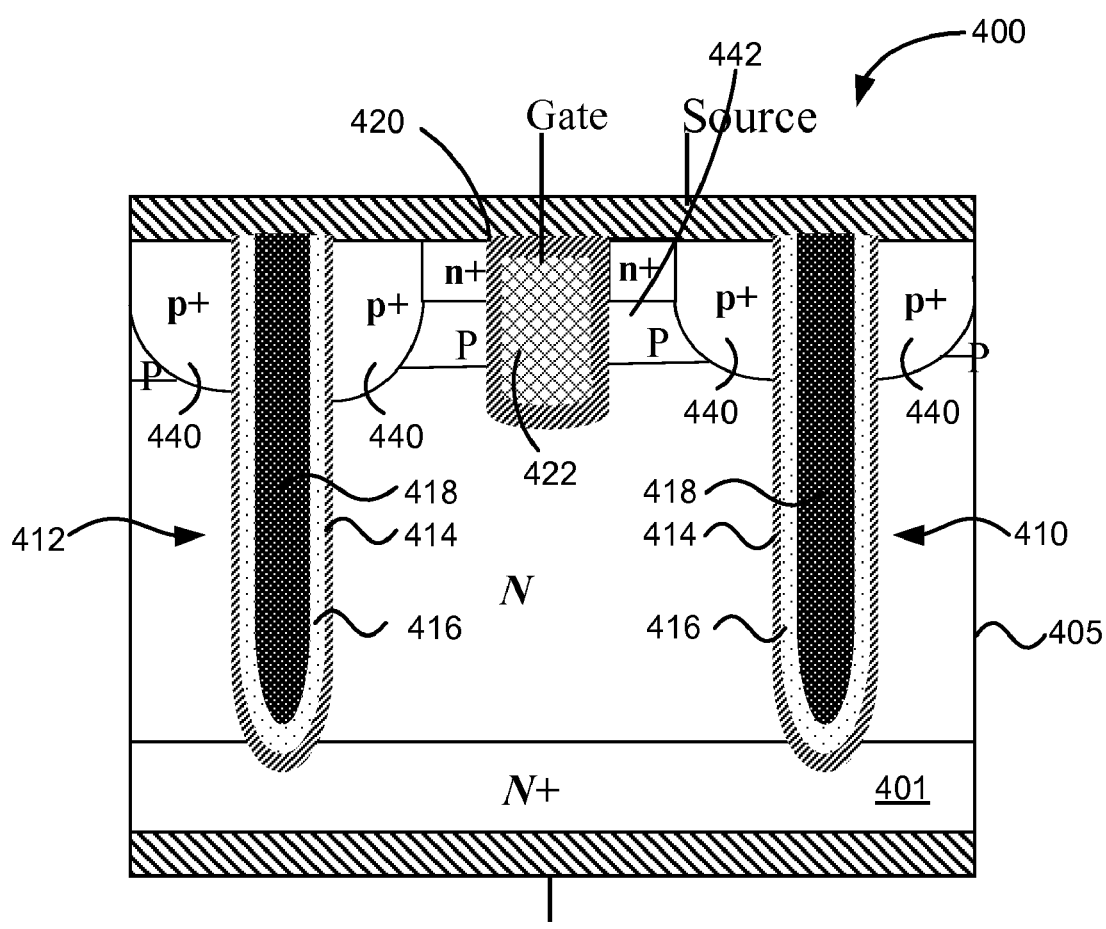
FIG. 4 is a simplified illustration of a trench MOS transistor with a Control Gate trench and Charge Control trenches having a deep p+ layer according to an embodiment of the present invention.

FIG. 4 is a simplified illustration of a trench MOS transistor with a Control Gate trench and Charge Control trenches having a deep p+ layer according to an embodiment of the present invention. The n-channel trench MOS transistor 400 is formed on an n-type epitaxial layer 405 grown over a heavily doped n+ substrate 401. As illustrated in FIG. 4, the device has a trench control gate 420 and two deep charge control trenches 410 and 412 having a negative charge. The trench CG 420 extends from a surface of the device into the n-type epitaxial layer 405. A layer of gate conducting material 422, typically doped polysilicon, and diffused regions are provided in the device illustrated in FIG. 4. These n+, p+, and p-body layers are formed using conventional fabrication processes such as implantation, diffusion, annealing, and the like.

As illustrated in FIG. 4, the CC trenches 410 and 412 are disposed between a p+ region 440 that is deeper than the p-body region 442. This design is used to clamp the breakdown voltage to a predetermined value that is lower than that of the breakdown voltage limited by the trench control gate 420. In this embodiment, the CC trenches 410 and 412 extend from a surface of the device into the heavily doped n+ substrate 401. In an alternative embodiment (not illustrated), a p+ region extends deeper than the trench CG 420.

In the embodiment illustrated in FIG. 4, the CC trenches 410 and 412 include a first dielectric layer 414, a dielectric (also referred to as a compound) material layer 416, and a second dielectric layer 418. The geometry of the illustrated device features the first dielectric layer 414 on the walls and bottom of the CC trenches 410 and 412, the compound material layer 416 interior to the first dielectric layer 414, and the second dielectric layer 418 interior to the compound material layer 416. In a first embodiment, the second dielectric layer 418 is the same material type as the first dielectric layer 414. In a second embodiment, the first and second dielectric layers are formed using different materials.

The combination of the first dielectric layer 414, the compound material layer 416, and the second dielectric layer 418 fill the CC trenches 410 and 412. As illustrated in FIG. 4, the tops of the CC trenches 410 and 412 are not covered with the first dielectric material, but are in electrical contact with the source metallization. Source and drain metallization is provided as appropriate to the functionality of the MOSFET device.

Figure 5:
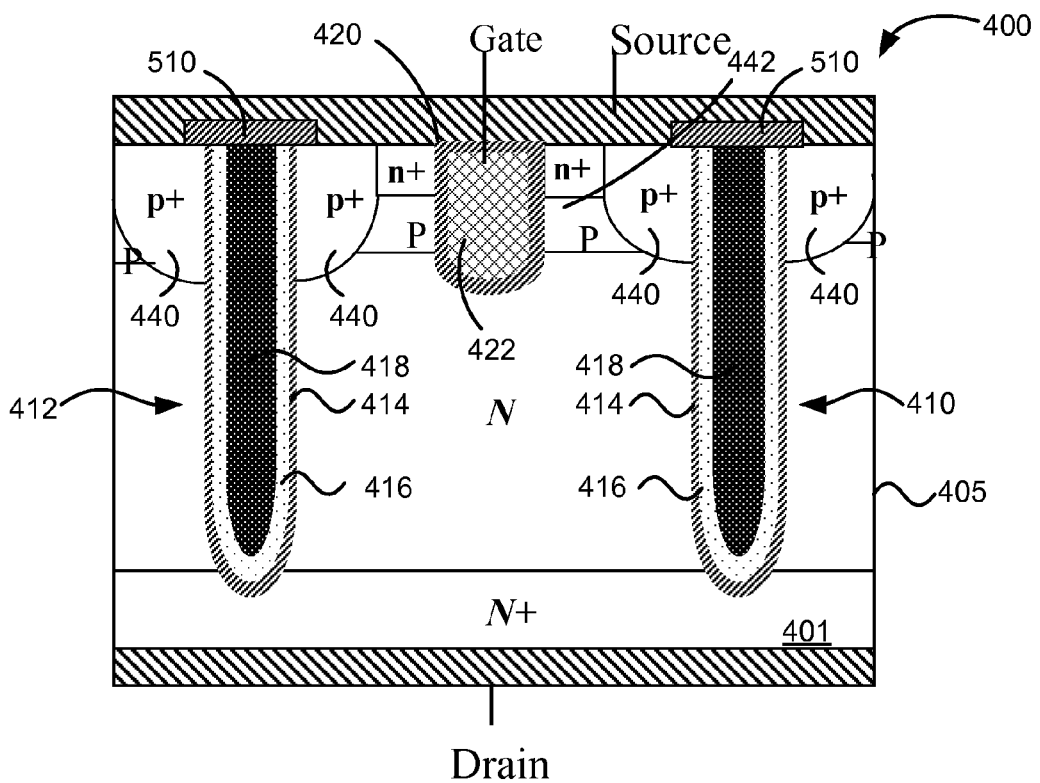
FIG. 5 is a simplified illustration of a trench MOS transistor with a Control Gate trench and Charge Control trenches covered by a first dielectric material according to an embodiment of the present invention.

FIG. 5 is a simplified illustration of a trench MOS transistor with a Control Gate trench and Charge Control trenches covered by a first dielectric material according to an embodiment of the present invention. The embodiment illustrated in FIG. 5 utilizes a similar structure to the device illustrated in FIG. 4. Accordingly, the same reference numbers are utilized for the features in both FIG. 4 and FIG. 5. Additionally, as illustrated in FIG. 5, a layer of the first dielectric material 510 is formed on top of the CC trenches 410 and 412. In some embodiments, the layer of the first dielectric material 510 is thicker than the first dielectric material 414 formed in the CC trenches. For example, the layer of the first dielectric material 510 may have a thickness ranging from 0.05 μm to 0.7 μm.

Figure 6:
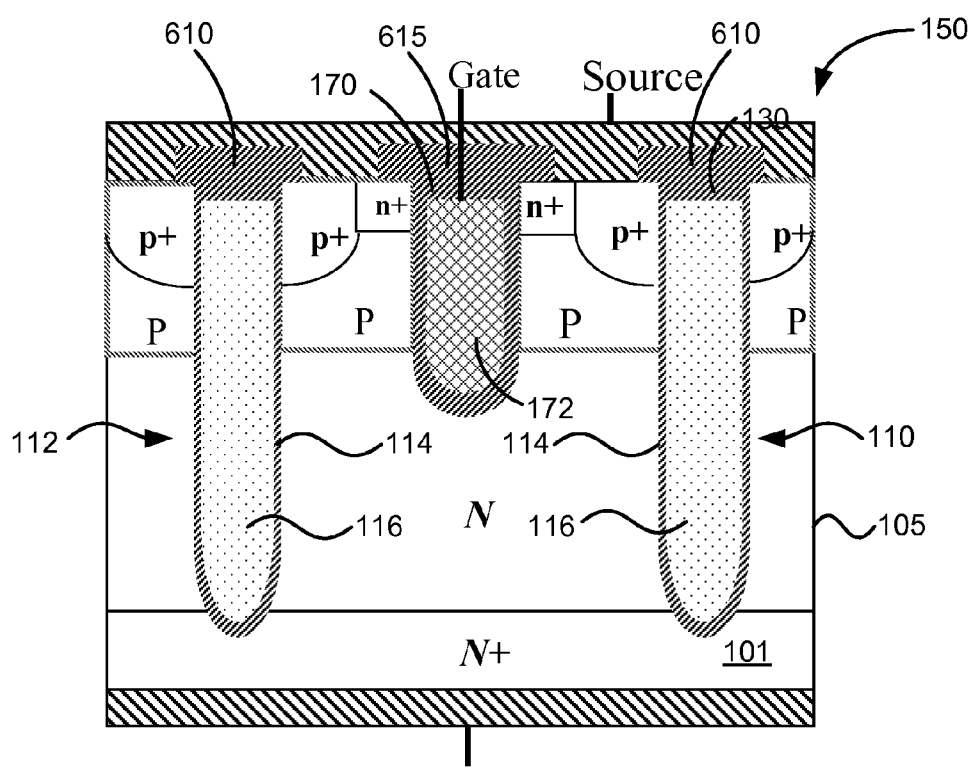
FIG. 6 is a simplified illustration of a trench MOS transistor with both the Control Gate trench and Charge Control trenches covered by a first dielectric material according to an embodiment of the present invention.

FIG. 6 is a simplified illustration of a trench MOS transistor with both the Control Gate trench and Charge Control trenches covered by a first dielectric material according to an embodiment of the present invention. The embodiment illustrated in FIG. 6 utilizes a similar structure to the device illustrated in FIG. 1B. Accordingly, the same reference numbers are utilized for the features in both FIG. 1B and FIG. 6. Additionally, as illustrated in FIG. 6, a layer of the first dielectric material 610 is formed on top of the CC trenches 110 and 112. Another portion of the layer of the first dielectric material 615 is formed on top of the trench CG 170. In some embodiments, the layer of the first dielectric material 610 and 615 is thicker than the first dielectric material 114 formed in the CC trenches 110 and 112. For example, the layer of the first dielectric material 610 and 615 may have a thickness ranging from 0.05 μm to 0.7 μm.

Figure 7:
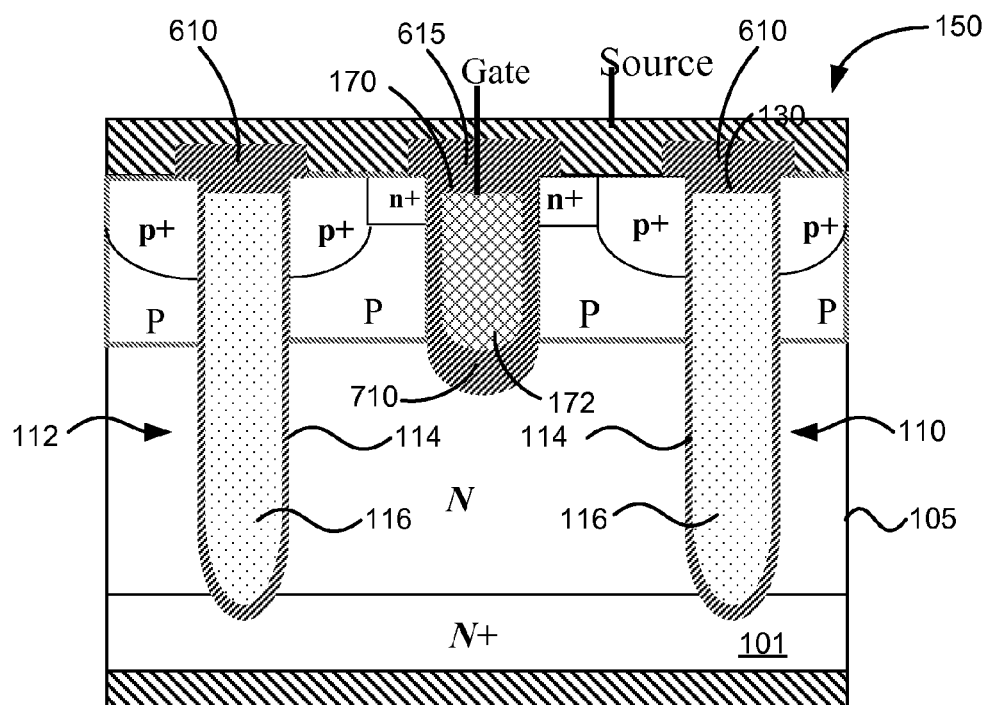
FIG. 7 is a simplified illustration of a trench MOS transistor with a Control Gate trench having a thick bottom oxide and Charge Control trenches according to an embodiment of the present invention.

FIG. 7 is a simplified illustration of a trench MOS transistor with a Control Gate trench having a thick bottom oxide and Charge Control trenches according to an embodiment of the present invention. The embodiment illustrated in FIG. 7 utilizes a similar structure to the device illustrated in FIG. 1B and FIG. 6. Accordingly, the same reference numbers are utilized for the features in both FIGS. 1B and 6 and FIG. 7. Additionally, as illustrated in FIG. 7, the first dielectric material layer 710 in the bottom of the CG trench is thicker than the first dielectric material formed on the sides of the CG trench. The increased dielectric (e.g., oxide) thickness of layer 710 lowers the gate-drain capacitance $C_{gd}$ in comparison with other devices. For example, the layer of the first dielectric material 710 may have a thickness ranging from 0.1 μm to 1.0 μm.

Figure 8:
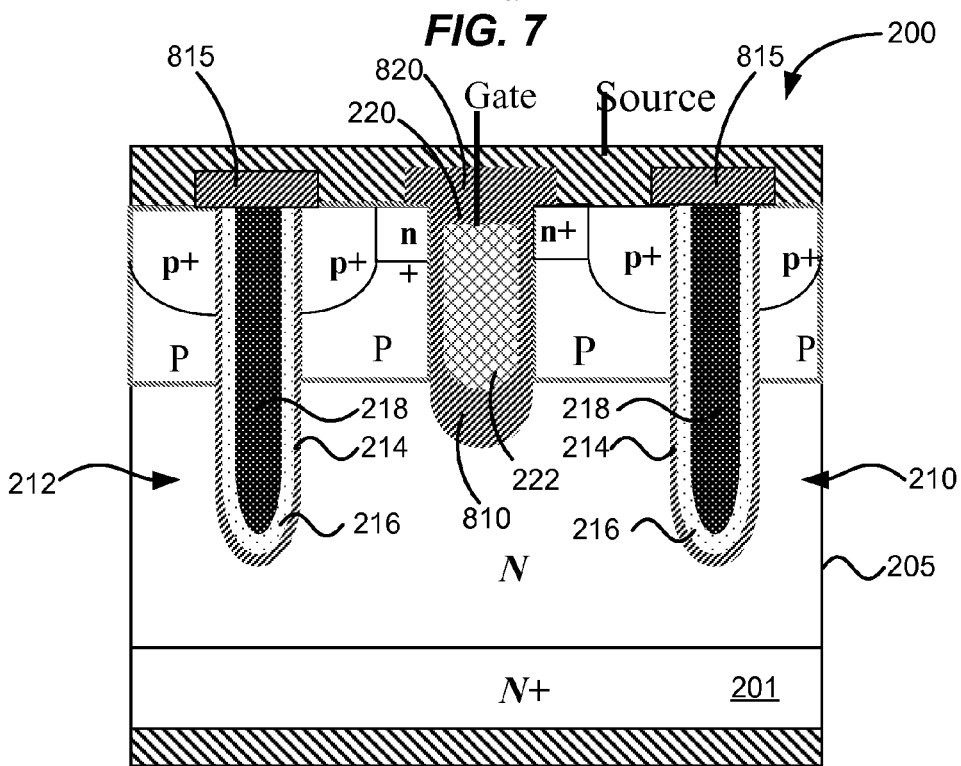
FIG. 8 is a simplified illustration of a trench MOS transistor with a Control Gate trench having a thick bottom oxide and Charge Control trenches extending into the n drift region according to an embodiment of the present invention.

FIG. 8 is a simplified illustration of a trench MOS transistor with a Control Gate trench having a thick bottom oxide for lower gate-drain capacitance $C_{gd}$ and Charge Control trenches extending into the n-drift region according to an embodiment of the present invention. The embodiment illustrated in FIG. 8 utilizes a similar structure to the device illustrated in FIG. 2A. Accordingly, the same reference numbers are utilized for the features in both FIG. 2A and FIG. 8. Additionally, as illustrated in FIG. 8, the CC trenches 210 and 212 extend into the n-drift region in the n-type epitaxial layer 205 rather than into the heavily doped n+ substrate 201.

Also, as illustrated in FIG. 8, the first dielectric material layer 810 in the bottom of the CG trench is thicker than the first dielectric material formed on the sides of the CG trench. The increased dielectric (e.g., oxide) thickness of layer 810 lowers the gate-drain capacitance $C_{gd}$ in comparison with other devices. For example, the layer of the first dielectric material 810 may have a thickness ranging from 0.05 μm to 0.5 μm. Moreover, a layer of the first dielectric material 815 is formed on top of the CC trenches 210 and 212. Another portion of the layer of the first dielectric material 820 is formed on top of the trench CG 220. In some embodiments, the layer of the first dielectric material 815 and 820 is thicker than the first dielectric material 214 formed in the CC trenches 210 and 212. For example, the layer of the first dielectric material 815 and 820 may have a thickness ranging from 0.05 μm to 0.5 μm.

Figure 9:
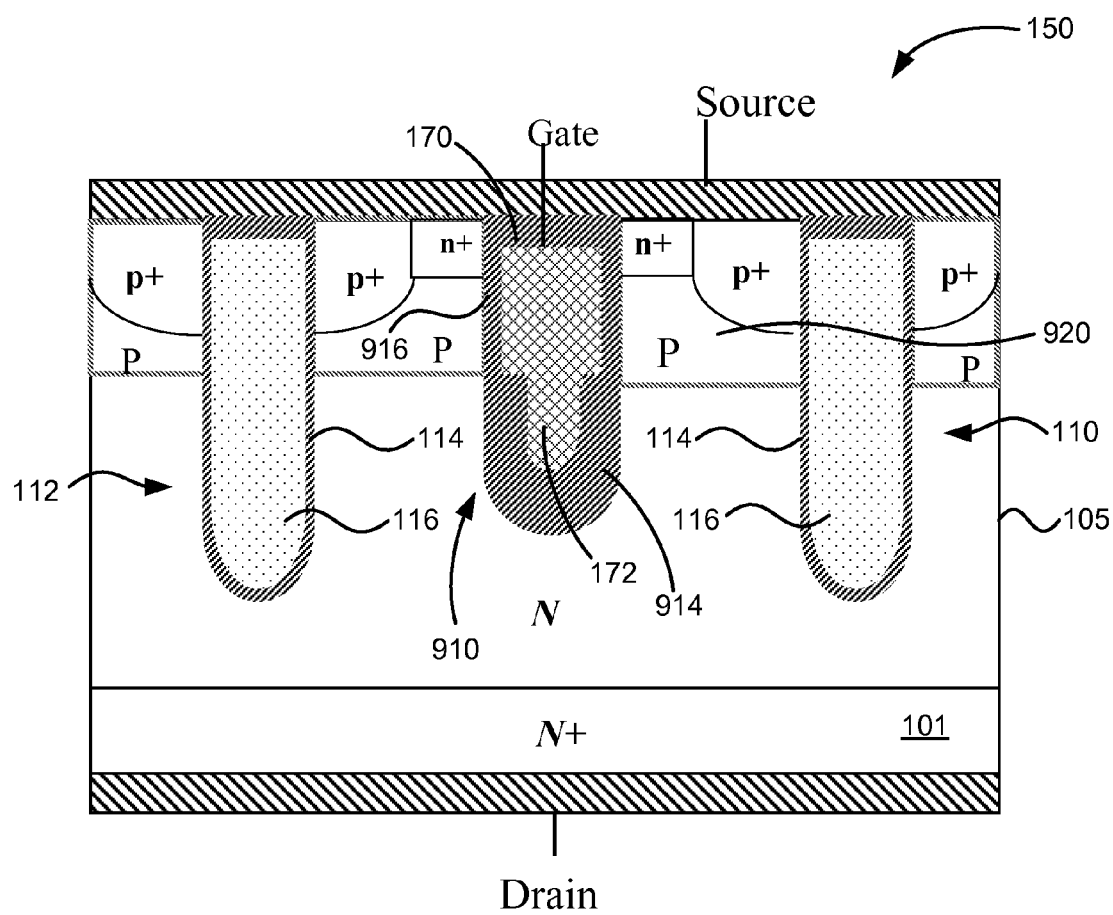
FIG. 9 is a simplified illustration of a trench MOS transistor with a stepped gate oxide Control Gate and Charge Control trenches with a depth less than the thickness of the n-epitaxial layer according to an embodiment of the present invention.

FIG. 9 is a simplified illustration of a trench MOS transistor with a stepped gate oxide Control Gate and Charge Control trenches with a depth less than the thickness of the n-epitaxial layer according to an embodiment of the present invention. The embodiment illustrated in FIG. 9 utilizes a similar structure to the device illustrated in FIG. 1B. Accordingly, the same reference numbers are utilized for the features in both FIG. 1B and FIG. 9. Additionally, as illustrated in FIG. 9, the CC trenches 110 and 112 extend into the n-drift region in the n-type epitaxial layer 105 rather than into the heavily doped n+ substrate 101.

Additionally, the embodiment illustrated in FIG. 9 includes a stepped gate insulator 910, typically an oxide layer. The lower portion of the stepped gate insulator 910 includes a dielectric layer 914 that is thicker than the dielectric layer 916 provided in the portion of the CG trench 170 above the interface between the n-type epitaxial layer 105 and the p-body 920. Although the step in the gate dielectric is illustrated at this interface in FIG. 9, this is not required by the present invention. The increased dielectric thickness in the lower portion of the CG trench 910 lowers the gate-drain capacitance $C_{gd}$ in comparison with other devices. One of ordinary skill in the art would recognize many variations, modifications, and alternatives.

Figure 10:
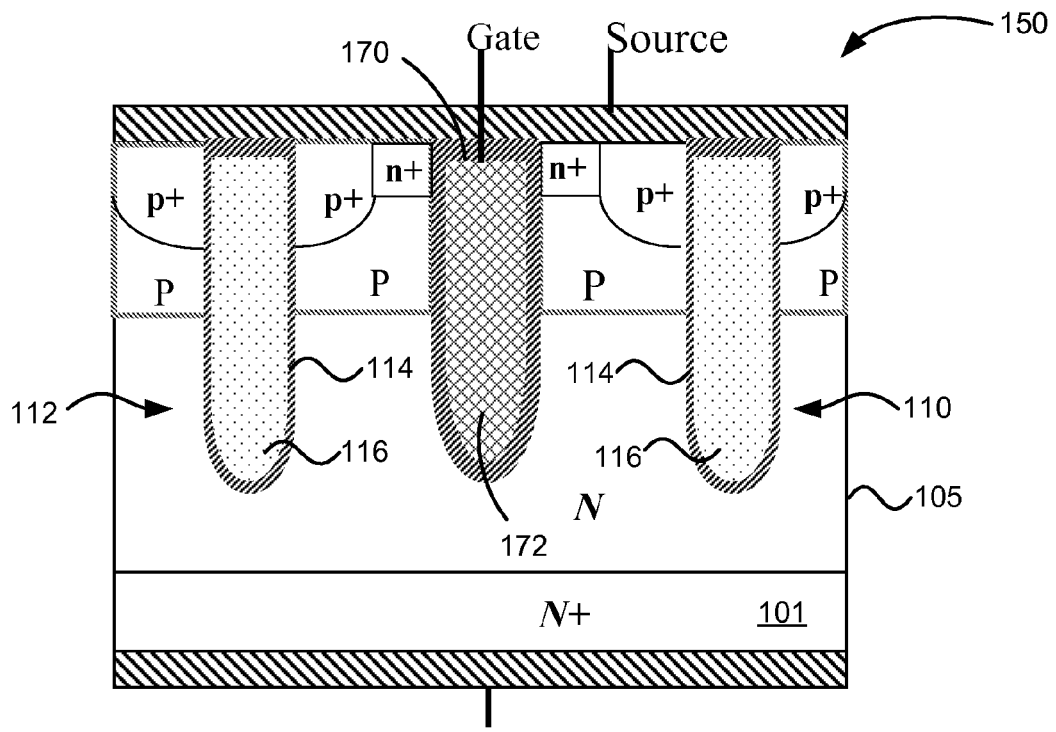
FIG. 10 is a simplified illustration of a trench MOS transistor with a uniform oxide Control Gate and CC trenches having the same depth according to an embodiment of the present invention.

FIG. 10 is a simplified illustration of a trench MOS transistor with a uniform oxide Control Gate and CC trenches having substantially the same depth according to an embodiment of the present invention. The embodiment illustrated in FIG. 10 utilizes a similar structure to the device illustrated in FIG. 1B. Accordingly, the same reference numbers are utilized for the features in both FIG. 1B and FIG. 10. Additionally, as illustrated in FIG. 10, the CC trenches 110 and 112 extend into the n-drift region in the n-epitaxial layer 105 rather than into the heavily doped n+ substrate 101.

As also illustrated in FIG. 10, the trench of the trench CG 170 extends into the n-type epitaxial layer 105 substantially the same distance that the CC trenches 110 and 112 extend into the n-drift region in the n-epitaxial layer 105. Although the extension depth of the trenches in FIG. 10 is illustrated as identical, this is not required by embodiments of the present invention. In other embodiments, the extension depth of the trenches is similar, for example, within about 10%, providing the benefits associated with the embodiment illustrated in FIG. 10. One of ordinary skill in the art would recognize many variations, modifications, and alternatives.

Figure 11:
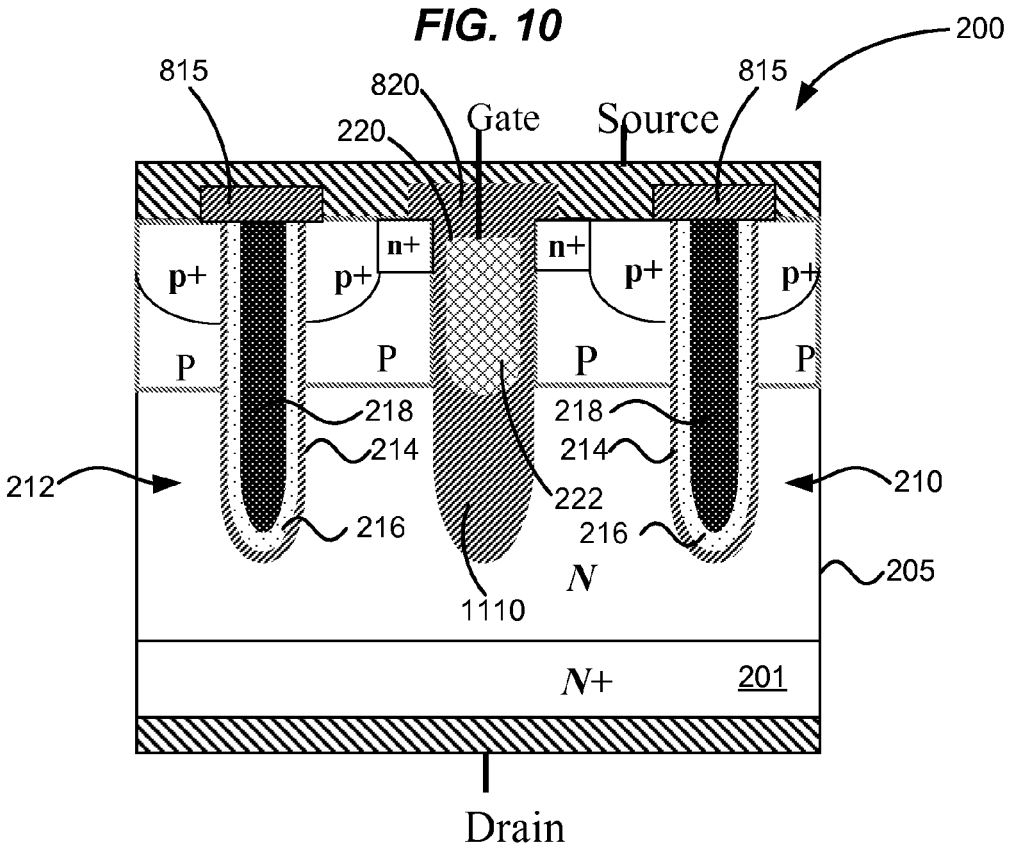
FIG. 11 is a simplified illustration of a trench MOS transistor with a thick bottom oxide Control Gate and CC trenches having the same depth according to an embodiment of the present invention.

FIG. 11 is a simplified illustration of a trench MOS transistor with a thick bottom oxide Control Gate and CC trenches having the same depth according to an embodiment of the present invention. The embodiment illustrated in FIG. 8 utilizes a similar structure to the device illustrated in FIG. 2A. Accordingly, the same reference numbers are utilized for the features in both FIG. 2A and FIG. 8. Additionally, as illustrated in FIG. 8, the CC trenches 210 and 212 extend into the n-drift region in the n-epitaxial layer 205 rather than into the heavily doped n+ substrate 201. Also, as illustrated in FIG. 11, the first dielectric material layer 1110 in the bottom of the CG trench is thicker than the first dielectric material 214 formed in the CC trenches 210 and 212. For example, the layer of the first dielectric material 1110 may have a thickness ranging from 0.5 μm to 50 μm.

Referring to FIG. 11, the trench of the trench CG 220 extends into the n epitaxial layer 205 the same distance that the CC trenches 210 and 212 extend into the n-drift region in the n epitaxial layer 205. Although the extension depth of the trenches in FIG. 11 is illustrated as identical, this is not required by embodiments of the present invention. In other embodiments, the extension depth of the trenches is similar, providing the benefits associated with the embodiment illustrated in FIG. 11. One of ordinary skill in the art would recognize many variations, modifications, and alternatives.

Figure 12A:
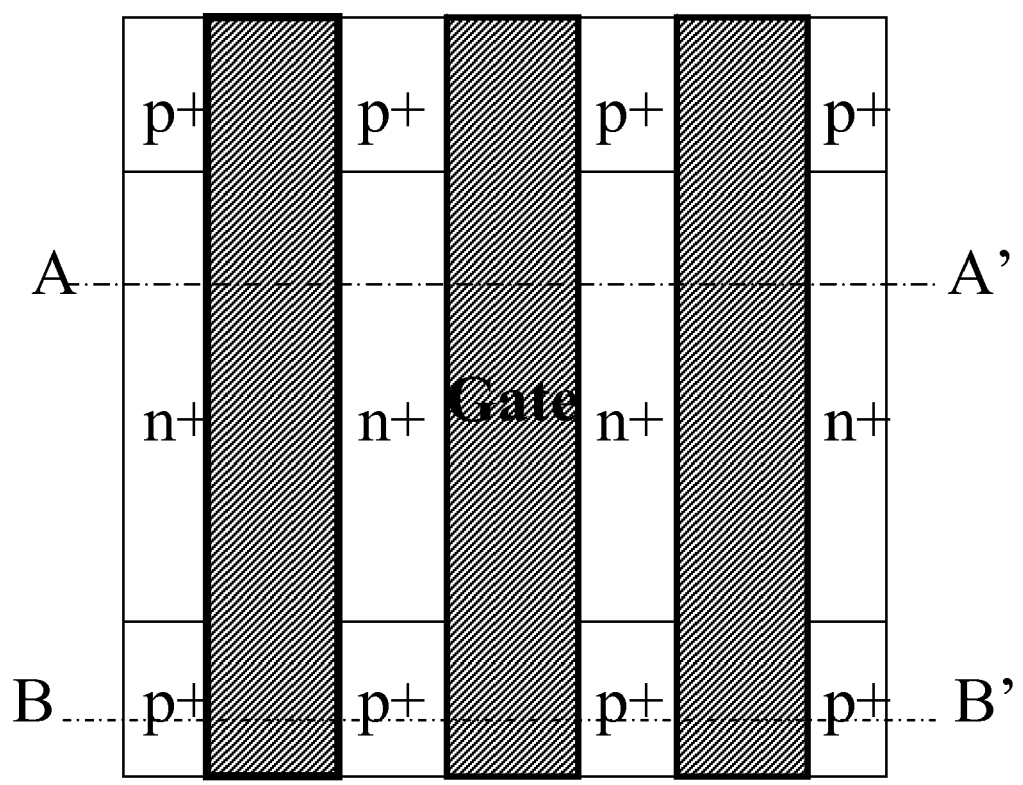
FIG. 12A is a simplified top view illustration of a power MOSFET structure according to an embodiment of the present invention.
Figure 12B:
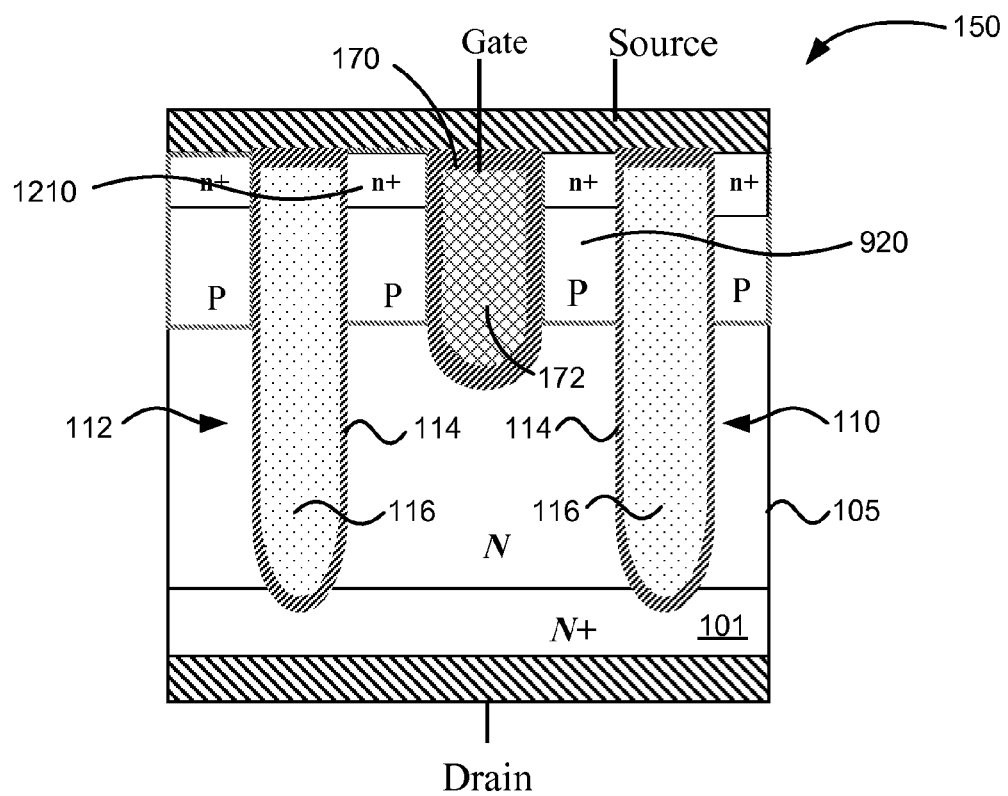
FIG. 12B is a simplified cross-sectional illustration along line AA' of FIG. 12A.
Figure 12C:
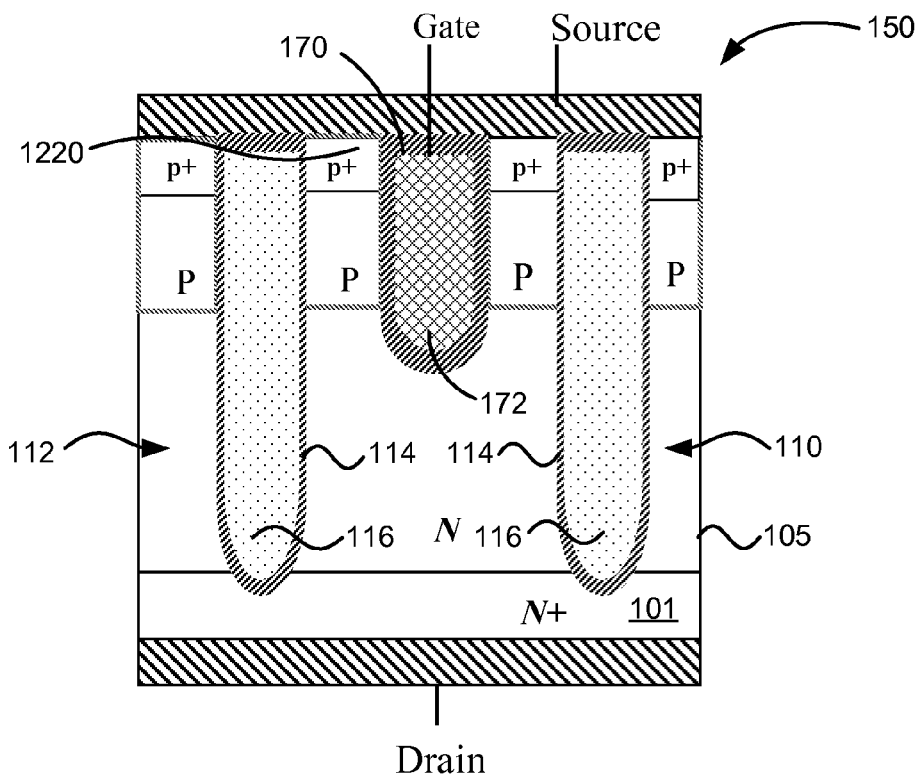
FIG. 12C is a simplified cross-sectional illustration along line BB' of FIG. 12A.

FIG. 12A is a simplified top view illustration of a power MOSFET structure according to an embodiment of the present invention. FIGS. 12B and 12C are simplified cross-sectional illustrations along lines AA' and BB' of FIG. 12A, respectively. Referring to FIG. 12B, p-body 920 and n+contact regions 1210 are illustrated in relation to the CC trenches 110 and 112 and the trench CG 170. In the cross-section illustrated in FIG. 12C, p+ contact regions 1220 are illustrated in relation to the CC trenches 110 and 112 and the trench CG 170.

Figure 13:
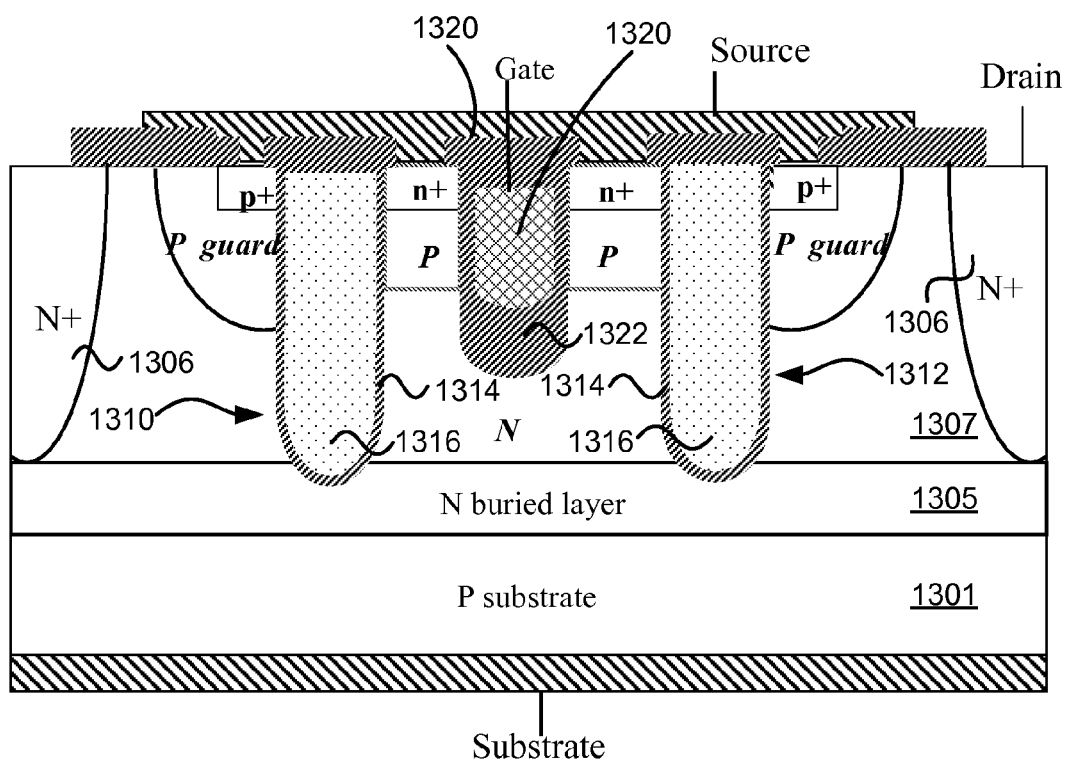
FIG. 13 is a simplified illustration of a single cell of a quasi-vertical power MOSFET with Control Gate and Charge Control trenches according to an embodiment of the present invention.

FIG. 13 is a simplified illustration of a single cell of a quasi-vertical power MOSFET with Control Gate and Charge Control trenches according to an embodiment of the present invention. As illustrated in FIG. 13, the power MOSFET structures provided by embodiments of the present invention can be implemented in a quasi-vertical configuration. In the on-state, electron current flows from the source through the channel and the N drift region 1307, n-buried layer 1305 and n+ regions 1306 (also referred to as a sinker region) to the drain contact at the surface of the device. In another embodiment the n+ regions 1306 are replaced by trenches filled with a conducting material such as doped polysilicon or tungsten. For purposes of clarity, only a single cell is shown in FIG. 13, but other structures with multiple parallel cells can also be implemented. One of ordinary skill in the art would recognize many variations, modifications, and alternatives. A deep p-well or p-guard ring and field plating is used for termination.

In the quasi-vertical power MOSFET illustrated in FIG. 13, a p-type substrate 1301 is utilized and CC trenches 1310 and 1312 include a dielectric layer 1314 and a compound material 1316. The trench CG 1320 includes polysilicon 1324 and a thicker layer of dielectric 1322 on the bottom of the trench.

Figure 14A:
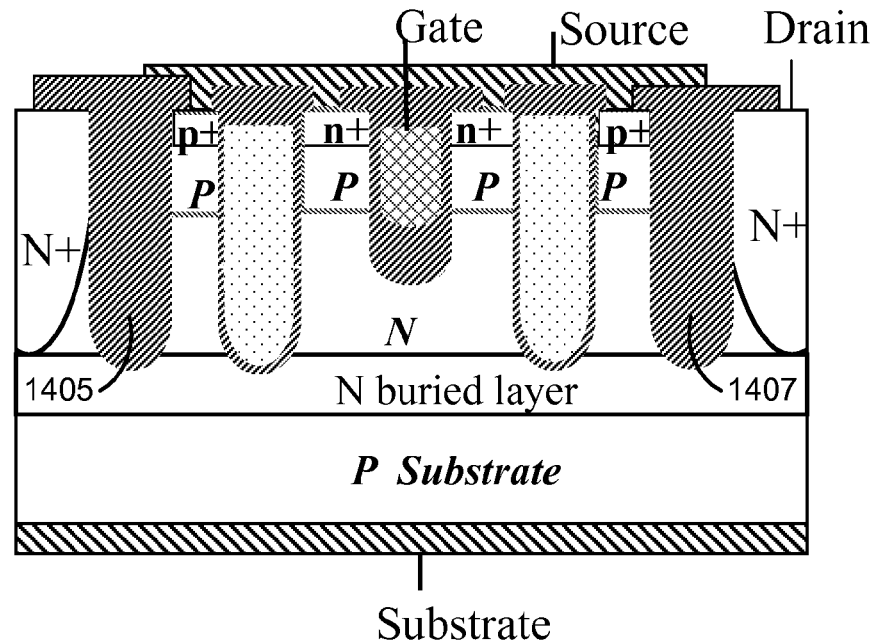
FIG. 14A is a simplified illustration of a quasi-vertical power MOSFET configuration with charge control trenches and a thick bottom oxide control gate trench and termination trenches filled with a first dielectric material according to an embodiment of the present invention.

FIG. 14A is a simplified illustration of a quasi-vertical power MOSFET configuration with charge control trenches and a thick bottom oxide control gate trench and termination trenches filled with a first dielectric material according to an embodiment of the present invention. The termination trenches can be of the same or different widths and depths than those of the charge control trenches. The termination trenches 1405 and 1407 are filled with a dielectric material such as silicon oxide (e.g., $SiO_2$).

Figure 14B:
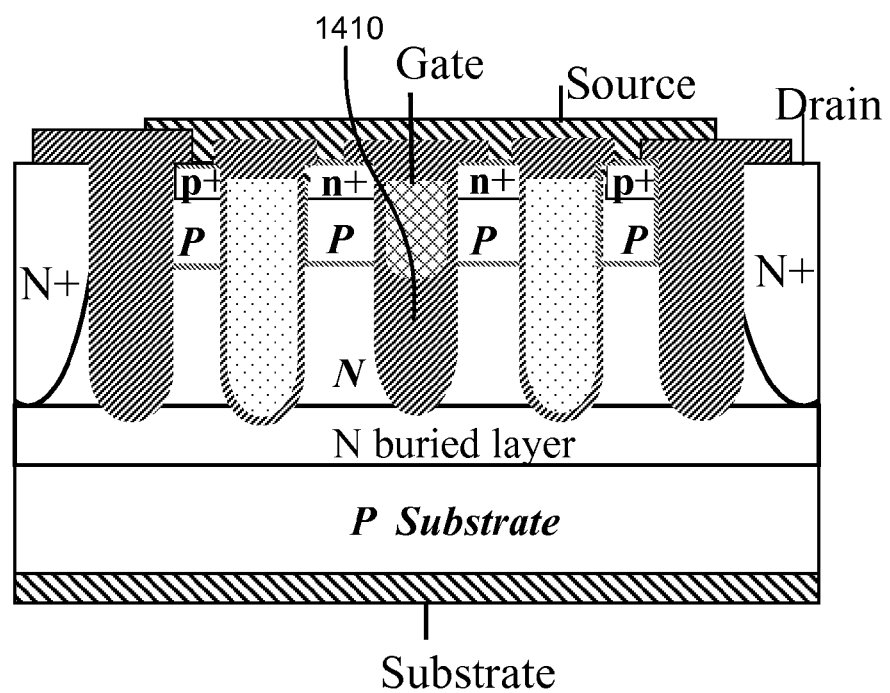
FIG. 14B is a simplified illustration of a quasi-vertical power MOSFET configuration with a thick bottom oxide control gate, charge control trenches and termination trenches filled with a first dielectric material and having the same depth according to an embodiment of the present invention.

FIG. 14B is a simplified illustration of a quasi-vertical power MOSFET configuration with a thick bottom oxide control gate, charge control trenches and termination trenches filled with a first dielectric material and having the same depth according to an embodiment of the present invention. As illustrated in FIG. 14B, the bottom dielectric 1410 of the trench CG is thicker than the embodiment illustrated in FIG. 14A. Accordingly, the depth of the CC trenches, the trench CG, and the termination trenches are the same in this embodiment. In FIGS. 14A and 14B, only a single cell is shown for purposes of clarity, but other structures with multiple cells can also be implemented.

Figure 15A:
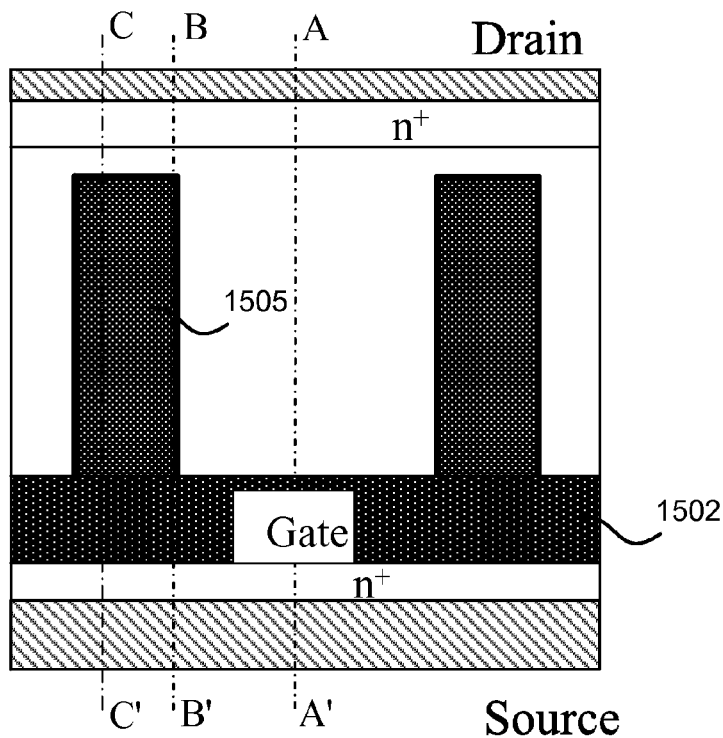
FIG. 15A is a simplified top view illustration of a lateral power MOSFET structure according to an embodiment of the present invention.
Figure 15B:
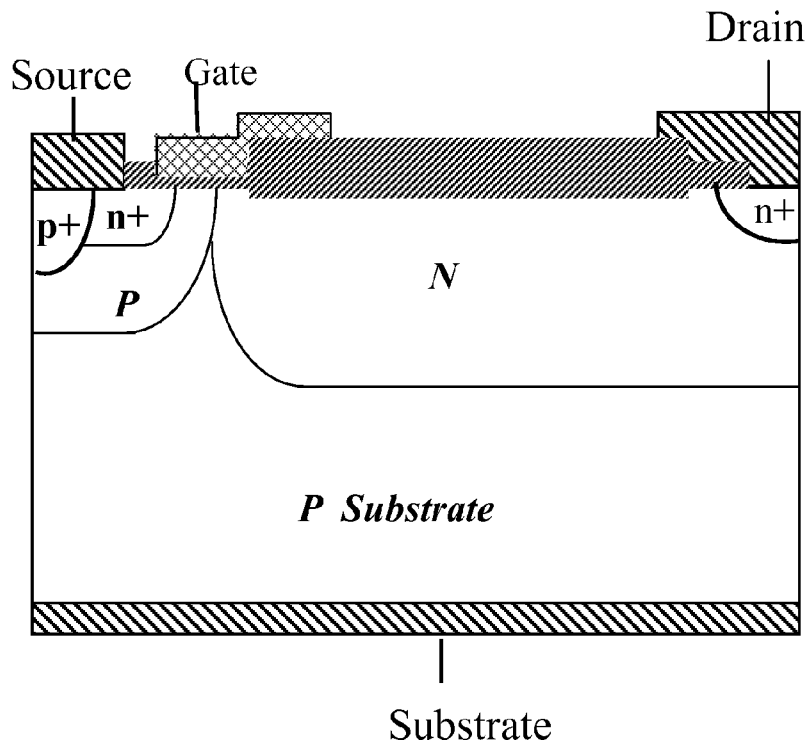
FIG. 15B is a simplified cross-sectional illustration along line AA' of FIG. 15A.
Figure 15C:
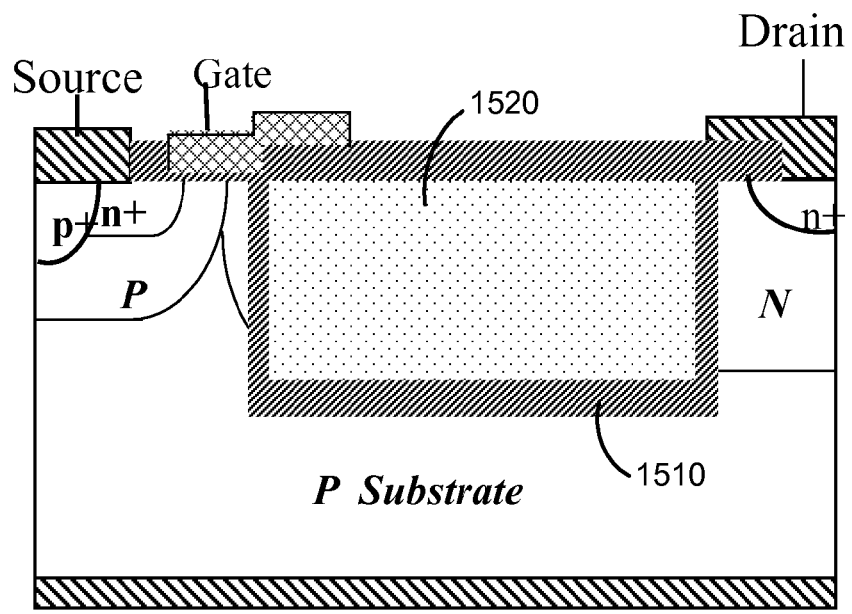
FIG. 15C is a simplified cross-sectional illustration along line BB' of FIG. 15A.
Figure 15D:
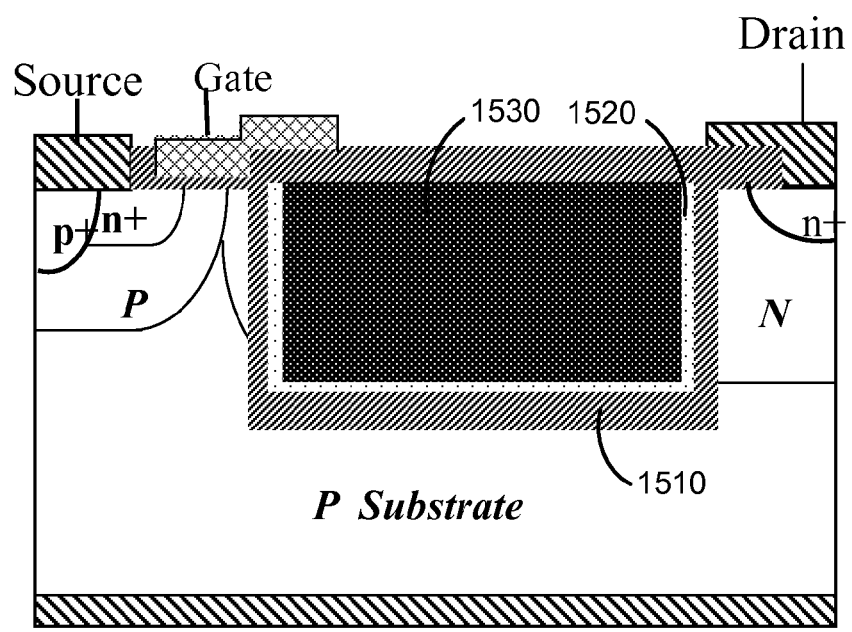
FIG. 15D is a simplified cross-sectional illustration along line CC' of FIG. 15A.

FIG. 15A is a simplified top view illustration of a lateral power MOSFET structure according to an embodiment of the present invention. The structure shown in FIGS. 15A-D has a planar CG 1502 and CC trenches 1505 that extend laterally from the source side towards the drain. The planar gate illustrated in FIGS. 15A-15D extends laterally over a portion of the CC trench 1505 although this is not required by embodiments of the present invention. The first dielectric layer thickness at the trench bottom and side walls facing source and drain can be different. FIG. 15B is a simplified cross-sectional illustration along line AA' of FIG. 15A. FIG. 15C is a simplified cross-sectional illustration along line BB' of FIG. 15A. FIG. 15D is a simplified cross-sectional illustration along line CC' of FIG. 15A.

In an embodiment, the charge in a single dielectric layer in a CC trench is equal to the effective doping charge in the N-drift region located in the mesa between CC trenches. In another embodiment, the magnitude of the charge in a single dielectric layer in a CC trench is in the range of 0.5 to 2 times the charge due to the effective doping concentration in the N drift region in the mesa between the CC trenches. In another embodiment, the dielectric charge density ($Q_{f/q}$) along the silicon-dielectric interface is in the range of $5 \times 10^{11}$ cm$^{-2}$ to $5 \times 10^{12}$ cm$^{-2}$, where q is the electron charge.

As illustrated in FIG. 15C, in one cross-section, a dielectric material 1510 lines the bottom of the CC trench. Compound material 1520 is then formed on top of the dielectric material 1510. Referring to FIG. 15D, in another cross-section through the CC trench, the second dielectric layer 1530, which may be the same as the first dielectric material, is formed interior to the compound material 1520, thereby filling the CC trench.

Although FIGS. 15A-D illustrate an n-channel device fabricated on a p-type substrate, this is not required by embodiments of the present invention. In other embodiments, p-channel devices are fabricated on an n-type substrate, with appropriate doping of the diffused regions and other device active regions. One of ordinary skill in the art would recognize many variations, modifications, and alternatives.

FIG. 16 is a simplified illustration of an n-channel trench MOS transistor with positive charge located in dielectric layer filled charge control trenches according to an embodiment of the present invention. Fabricated on a heavily doped n+ substrate 1601 and a p-type epitaxial layer 1605, the transistor includes a Control Gate (CG) and Charge Control (CC) constructed in the same trench. Two such trenches 1610 and 1612 are illustrated. The bottoms of the trenches 1610 and 1612 extend into the n+ substrate 1601.

Positive charge is located in dielectric layer present in the trenches 1610 and 1612 below the CG. In the on-state, electron current flows from the source through the channel and the electron inversion layer induced by the positive charge to the N+ substrate 1601. It is worth noting that the electron inversion layer overlaps the CG for continuity of the current flow and forms an equivalent to an n-drift region.

In accordance with embodiments of the present invention, the presence of the fixed charges in the trench dielectric results in an intrinsic depletion of carriers in the drift region at zero-bias. As illustrated by various embodiments of the present invention, fixed charges present at the dielectric interface between the trench and the drift region balance charge present in the drift depletion region. In another embodiment, the positive charge $Q_f$ is such that the p-region below the CG is fully depleted at the breakdown voltage. Generally, the positive charge in the dielectric layer is provided by cesium, potassium, or other suitable atoms. A method of fabricating the structure illustrated in FIG. 16 is described in relation to FIG. 39.

Figure 17A:
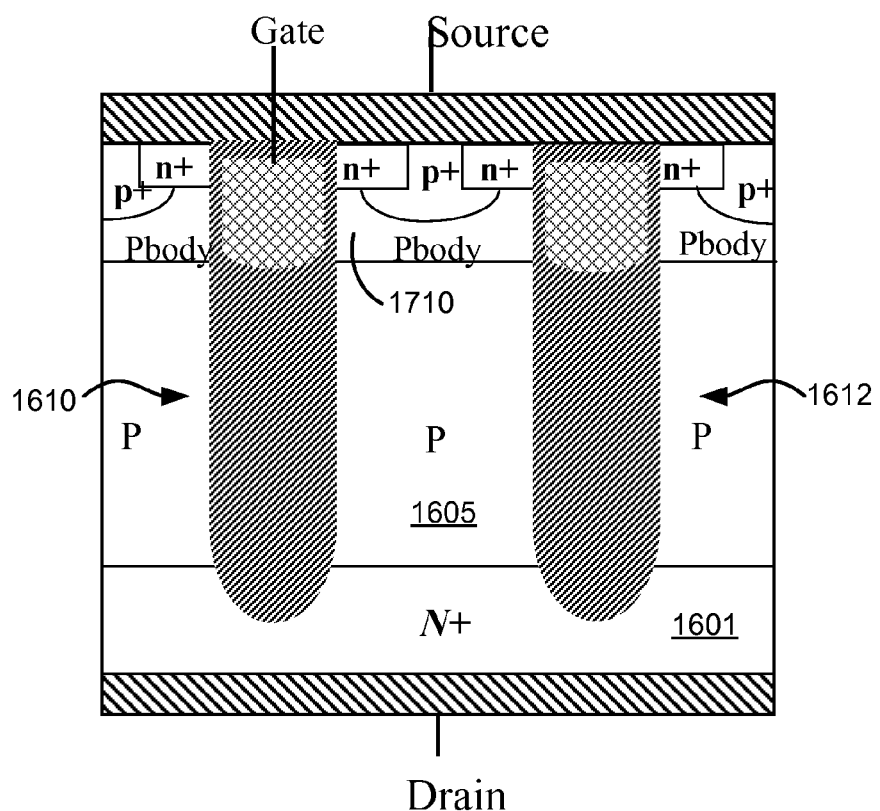
FIG. 17A is a simplified illustration of an n-channel trench MOS transistor with positive charge dielectric layer filled charge control trenches and p-body regions according to an embodiment of the present invention.

FIG. 17A is a simplified illustration of an n-channel trench MOS transistor with positive charge containing dielectric layer filled charge control trenches and p-body regions according to an embodiment of the present invention. The additional p-body layer 1710 is used to adjust the threshold voltage of the MOSFET and improve the punch through voltage.

Figure 17B:
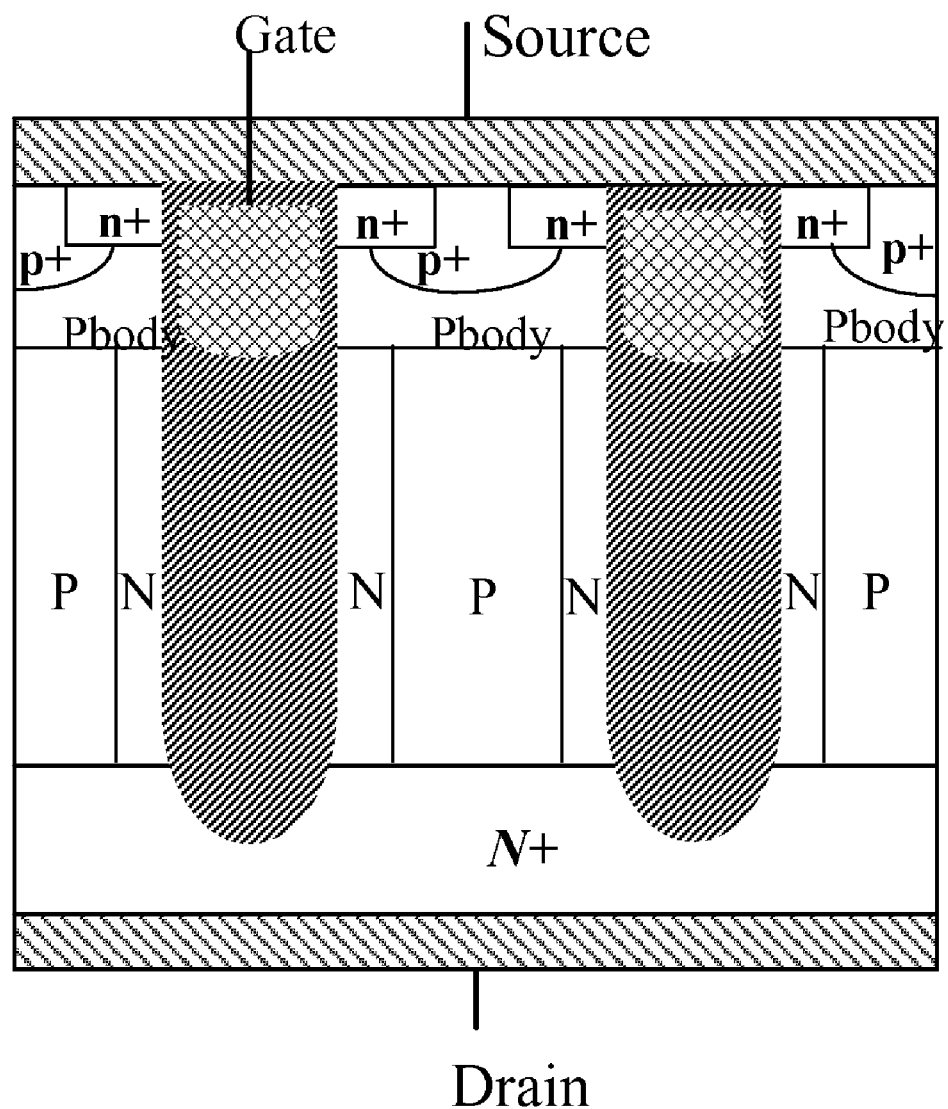
FIG. 17B is a simplified illustration of a combined super-junction trench MOS transistor with positive charge dielectric layer filled charge control trenches according to an embodiment of the present invention.

FIG. 17B is a simplified illustration of a combined superjunction trench MOS transistor with positive charge dielectric layer filled charge control trenches according to an embodiment of the present invention. Unlike conventional SJ devices, the negative charge of the depleted P pillar layer is only partially compensated by the positive charge of the N pillar. In other words the P Pillar negative depletion charge is balanced by both the positive fixed and the N pillar depletion charges. This can provide a means to have better control of charge balance and improve carrier mobility.

It will be noted that in principle, the superjunction trench MOS transistor could utilize negative charge dielectric layer filled charge control trenches. In these alternative designs, PMOS transistors can be fabricated. It should also be noted that although the embodiment illustrated in FIG. 17B utilized trenches extending into the N+ substrate, this is not required by embodiments of the present invention.

Figure 43A:
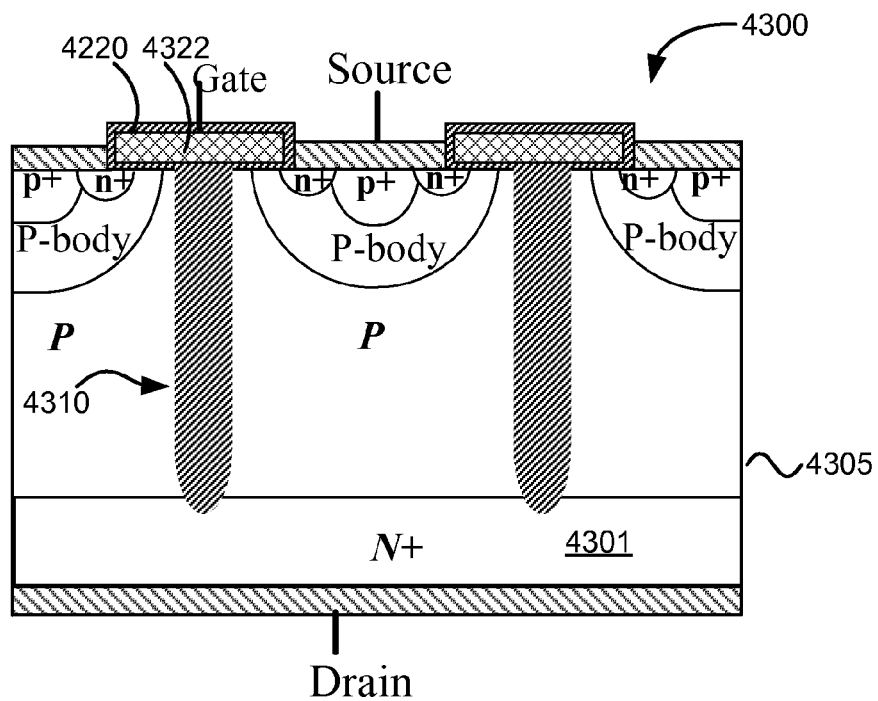
FIG. 43A is a simplified illustration of a planar n-channel DMOS transistor according to an embodiment of the present invention.

FIG. 43A is a simplified illustration of a planar n-channel DMOS transistor 4300 according to an embodiment of the present invention. Although FIG. 43A illustrates an n-channel DMOS transistor, embodiments of the present invention are applicable to other MOSFET designs including p-channel MOSFETs, IGBTs, and the like. In the embodiment illustrated in FIG. 43A, the basic cell of an n-channel MOSFET 4300 is illustrated on a p-type epitaxial layer 4305 grown over a heavily doped n+ substrate 4301. As illustrated in FIG. 43A, the device has a planar control gate 4320 and a deep charge control trench 4310 having a positive charge. In this embodiment, the Charge Control (CC) trench 4310 extends from a surface of the device into the heavily doped n+ substrate 4301. In one embodiment, the p-drift region formed in the p-type epitaxial layer 4305 is uniformly doped. In another embodiment, the p-drift region in the p-type epitaxial layer 4305 is non-uniformly doped. For example, the doping profile can be graded to have higher doping at substrate that decreases towards the surface or vice versa depending on the device parameters. In another embodiment, the p-type epitaxial layer is grown over a n-type epitaxial layer that is grown over a heavily doped n+ substrate. In yet another embodiment, the p-body region and the channel extends to the CC trench. Moreover, a deep P+ region that is deeper than P-body can be included in the area below the contact to improve the device ruggedness.

Positive charge is located in dielectric layer present in the trenches 4310. In the on-state, electron current flows from the source through the surface channel and the electron inversion layer induced by the positive charge along the CC trench into the N+ substrate 1601. Although the device illustrated in FIG. 43A utilizes only two CC trenches, embodiments of the present invention are not limited to one or two CC trenches, but may utilize a number of CC trenches greater than two. One of ordinary skill in the art would recognize many variations, modifications, and alternatives.

Referring to FIG. 43A, the top of the CC trenches 4310 is covered with a layer of the first dielectric material and the polysilicon planar gate material illustrated as layer 4220. Additionally, the planar gate 4320 is insulated using the first dielectric material in the embodiment illustrated in FIG. 43A. A layer of gate conducting material 4322, typically doped polysilicon, is illustrated in FIG. 43A.

As illustrated in FIG. 43A, diffused body and source regions are provided in the devices. These n+, p+, and p-type layers are formed using conventional fabrication processes such as implantation, diffusion, annealing, and the like. The fabrication of these layers is discussed in additional detail throughout the present specification.

In accordance with embodiments of the present invention, the presence of the fixed charges in the trench dielectric results in a "built-in" depletion of carriers in the drift region. As illustrated by various embodiments of the present invention, fixed charges present near the dielectric interface between the trench and the drift region balance charge present in the drift region. In another embodiment the positive charge $Q_f$ is such that the p-region below the CG is fully depleted at the breakdown voltage. Generally, the positive charge in the dielectric layer is provided by cesium, potassium, or other suitable atoms.

Referring to FIG. 43A, the integrated charge between the two CC trenches 4310 can be measured. In some embodiments, the integrated charge density ($Q_{P/q}$) measured between the set of trenches along a line parallel to the surface ranges from about $1\times10^{12}$ cm$^{-2}$ to about $5\times10^{12}$ cm$^{-2}$, where q is the electron charge. In a particular embodiment, the integrated charge measured between the set of trenches 4310 is about $2\times10^{12}$ cm$^{-2}$. To obtain highest performance, the integrated charge is preferably balanced by fixed charge provided via the CC trenches.

As will be evident to one of skill in the art, other embodiments described herein are also suitable for computation of the integrated charge density between sets of trenches. Although, for purposes of clarity, the discussion of integrated charge density is not discussed in relation to each and every figure illustrated herein, computation of integrated charge is applicable to multiple embodiments described herein. Since in some applications, multiple trenches will be utilized in a power transistor device, the integrated charge density can be measured between one or more sets of adjacent trenches. When the integrated charge is preferably balanced by fixed charge provided via the CC trenches, the breakdown voltage between the source and drain terminals is independent of the separation of adjacent trenches 4310. Additionally, the breakdown voltage is independent of the width of the trenches 4310.

Figure 43B:
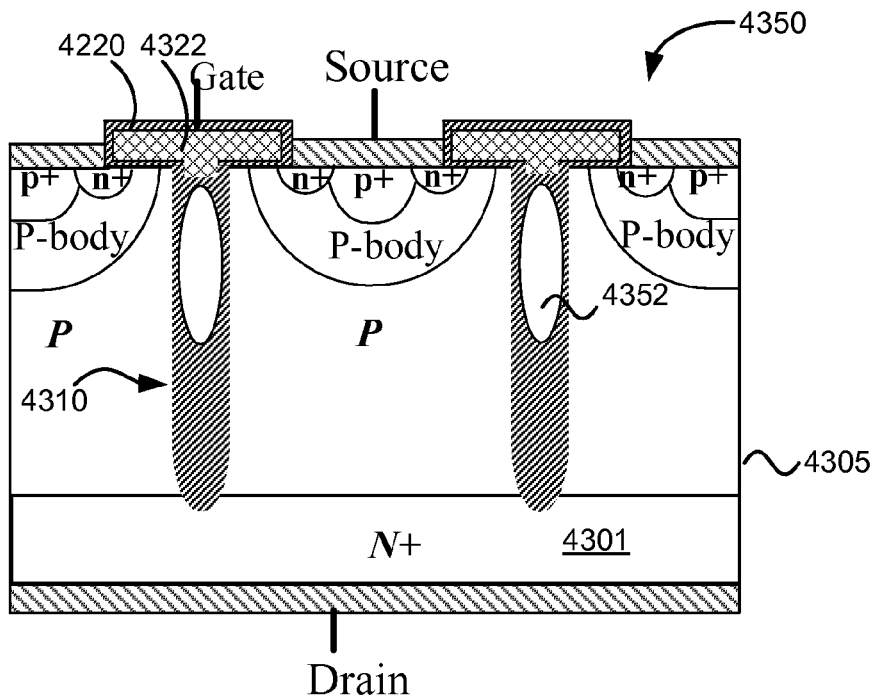
FIG. 43B is a simplified illustration of a planar n-channel DMOS transistor including a void according to an embodiment of the present invention.

FIG. 43B is a simplified illustration of a planar n-channel DMOS transistor 4350 including a void according to an embodiment of the present invention. As discussed previously, void 4352 may be formed during dielectric formation processes in high aspect ratio trenches either intentionally or as a byproduct of the deposition process utilized during device fabrication. The depth and width of the void will depend on the particular process flows utilized during device fabrication. Although a single void is illustrated in FIG. 43B, this is not required by embodiments of the present invention, as multiple voids may be utilized in other embodiments. Additionally, although voids 4352 are illustrated as completely encapsulated by the dielectric layer provided in the CC trenches, this is not required by embodiments of the present invention.

Referring to FIG. 43B, the gate material conducting material 4322 includes a notch extending into the CC trench 4310. The notch results from the variation in the surface features of the dielectric fill as a result of the void 4352 illustrated in the CC trench. Accordingly, the dimensions of the notch including the width and depth will depend on the characteristics of the void and the surrounding dielectric material.

Figure 43C:
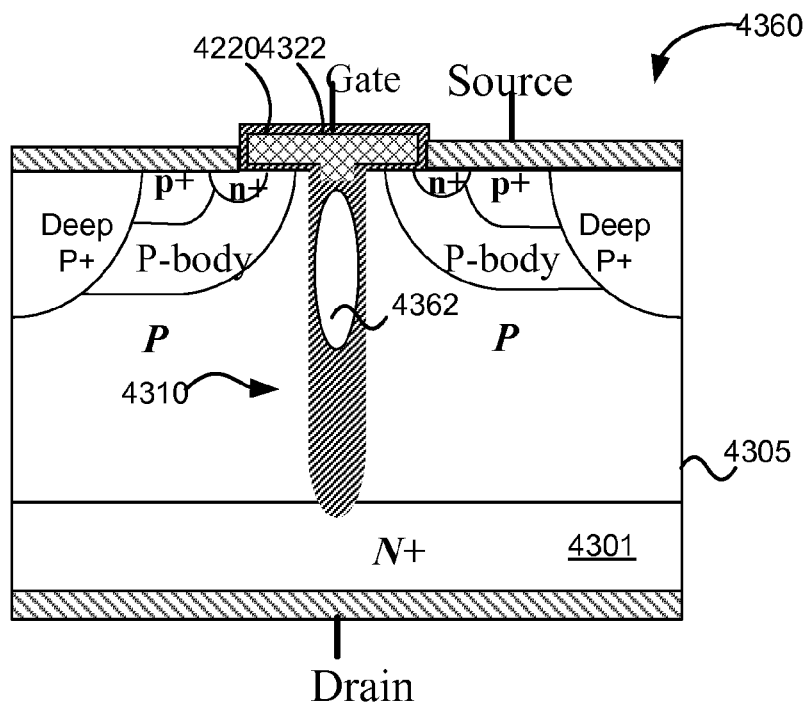
FIG. 43C is a simplified illustration of a planar n-channel DMOS transistor including a deep p region according to an embodiment of the present invention.

FIG. 43C is a simplified illustration of a planar n-channel DMOS transistor 4360 including a deep p region according to an embodiment of the present invention. As illustrated in FIG. 43C, the deep p region improves voltage clamping and device ruggedness as described in more detail in the present specification. The deep p region extends below the p-body in the illustrated embodiment although this is not required by embodiments of the present invention. One of ordinary skill in the art would recognize many variations, modifications, and alternatives. The device illustrated in FIG. 43C also includes a void 4362 formed in the CC trench. Additionally, a notch is formed in the gate conducting material 4322 as discussed previously.

Figure 43D:
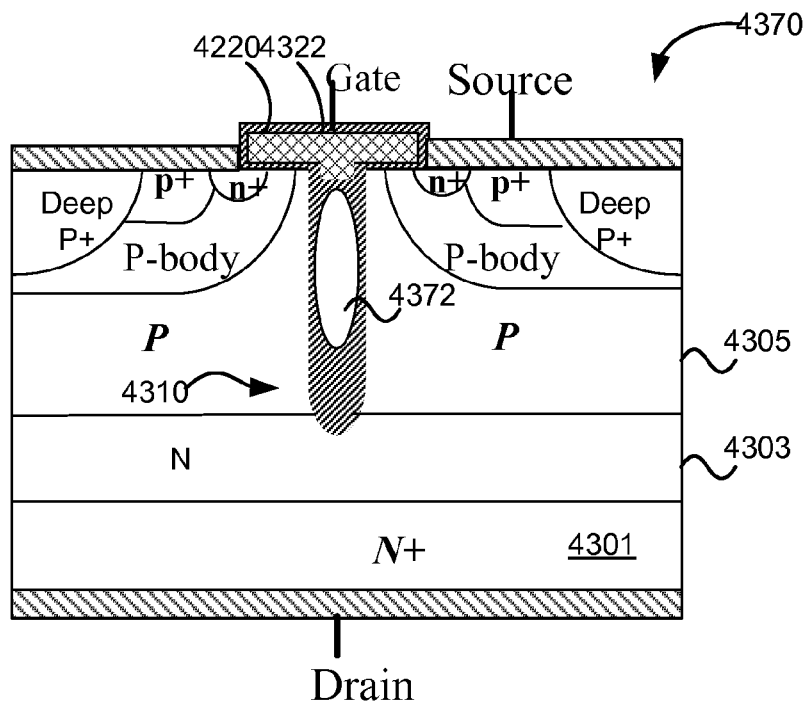
FIG. 43D is a simplified illustration of a planar n-channel DMOS transistor including an n-type layer abutting the substrate according to an embodiment of the present invention.

FIG. 43D is a simplified illustration of a planar n-channel DMOS transistor 4370 including an n-type layer 4303 abutting the substrate according to an embodiment of the present invention. The n-type layer 4303, which may be fabricated as part of an epitaxially grown substrate, provides for reduced trench depth. The use of an n-type layer is described in more detail throughout the present specification. The device illustrated in FIG. 43D also includes a void 4372 formed in the CC trench. Additionally, a notch is formed in the gate conducting material 4322 as discussed previously.

Figure 18A:
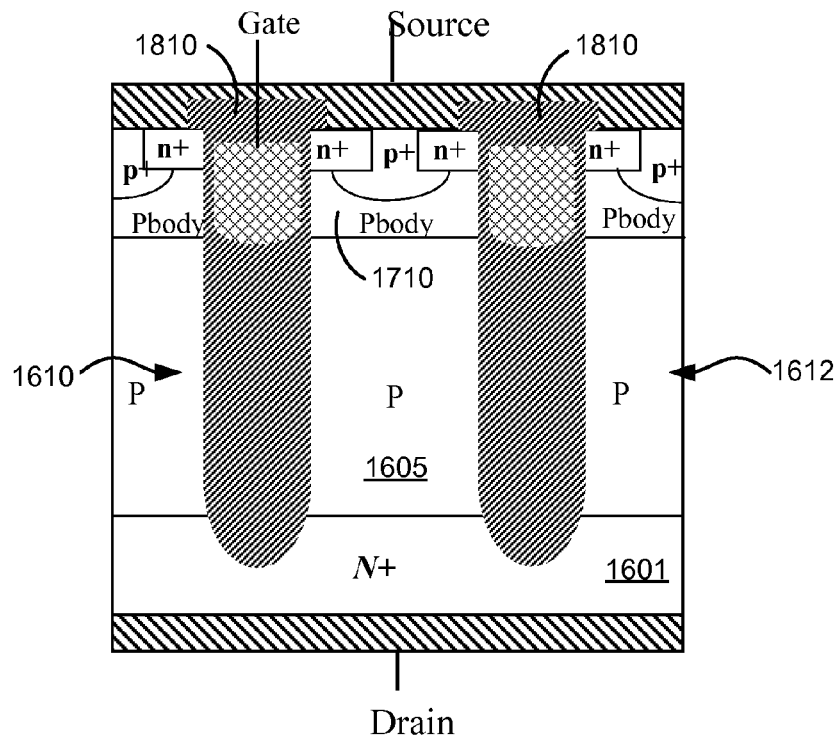
FIG. 18A is a simplified illustration of a trench MOS transistor as illustrated in FIG. 17A with dielectric layer above the trenches according to an embodiment of the present invention.

FIG. 18A is a simplified illustration of a trench MOS transistor as illustrated in FIG. 17A with dielectric layer above the trenches according to an embodiment of the present invention. The thicker layer 1810 formed from the first dielectric material is positioned above the gate polysilicon material to cover the top of the trenches. In some embodiments, the first dielectric material is a silicon oxide material (e.g., $SiO_2$) although this is not required by the present invention.

Figure 18B:
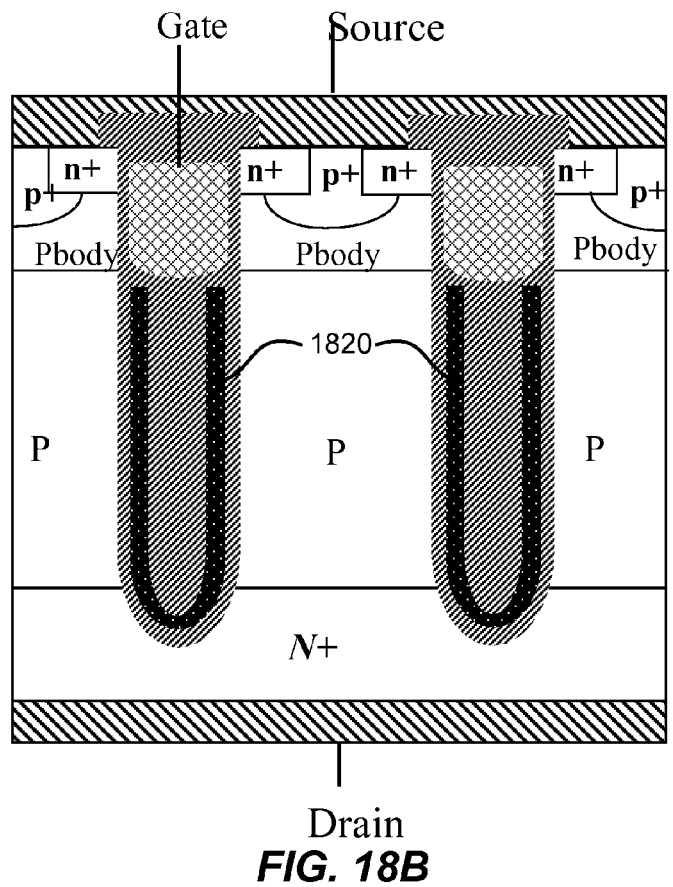
FIG. 18B is a simplified illustration of a trench MOS transistor as illustrated in FIG. 18A with an additional dielectric layer in the trenches according to an embodiment of the present invention.

FIG. 18B is a simplified illustration of a trench MOS transistor as illustrated in FIG. 18A with an additional dielectric layer in the trenches according to an embodiment of the present invention. The additional dielectric layer 1820, which may be silicon nitride or other suitable dielectric materials, is formed in the trenches 1610 and 1612, extending from near the bottom of the trenches to the bottom of the control gate material. Utilizing the embodiment illustrated in FIG. 18B, an oxide layer is adjacent to the walls of the trench as well as the bottom of the trench. Interior to this oxide layer, the second dielectric layer, such as silicon nitride ($Si_3N_4$), is provided next to the oxide layer. The second dielectric layer is used either to generate a fixed charge or as a cap layer to ensure that the charges used to deplete p-region are maintained near the oxide-silicon surface during device fabrication. The thickness of the second dielectric layer is selected to not completely fill the trench, but to leave room for another dielectric layer (such as an oxide layer) as illustrated in FIG. 18B. Thus, embodiments of the present invention provide for multi-layer dielectric layers, providing support for fixed charges as well as undoped insulating layers.

Figure 18C:
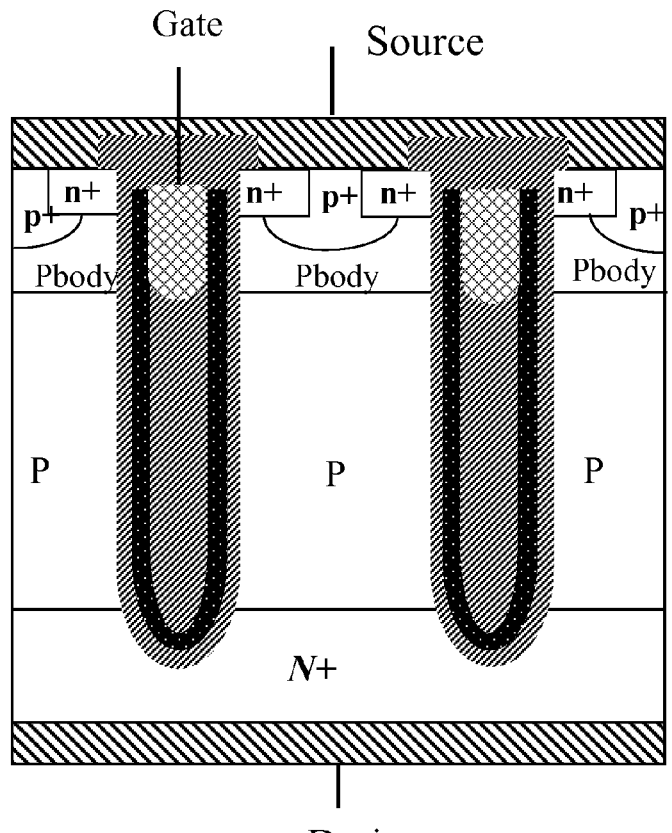
FIG. 18C is a simplified illustration of a trench MOS transistor as illustrated in FIG. 18A with an additional dielectric layer in the trenches and adjacent the control gate material according to an embodiment of the present invention.

FIG. 18C is a simplified illustration of a trench MOS transistor as illustrated in FIG. 18A with an additional dielectric layer in the trenches and adjacent the control gate material according to an embodiment of the present invention. By forming the second dielectric layer in the upper portions of the trenches, additional insulating material is formed around the control gate material. As illustrated in FIG. 18C, the top of the second dielectric layer, for example, silicon nitride, is parallel to the top of the control gate material. However, this particular geometry is not required by embodiments of the present invention. In other designs, the thickness and coverage of the second additional dielectric material is selected to provide insulating properties as appropriate to the particular application. It will be appreciated that in the various designs described herein, multiple dielectric layers may be substituted for single dielectric layers as appropriate to the particular application. Thus, the embodiment illustrated in FIGS. 18B and 18C is representative of various designs in which a single layer of dielectric material (e.g., oxide) is replaced by multiple layers (e.g., oxide/silicon-nitride/oxide layers).

Figure 19:
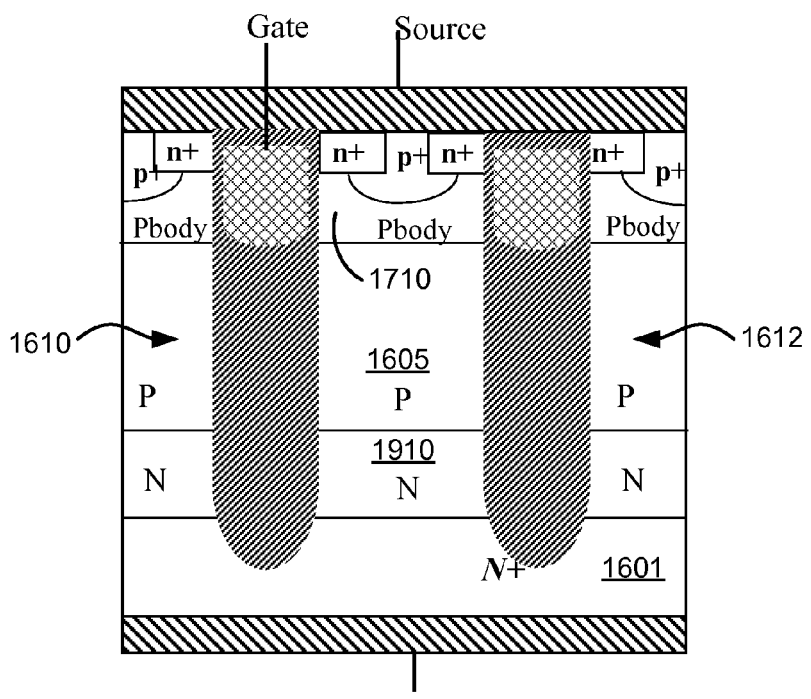
FIG. 19 is a simplified illustration of a trench DMOS transistor as illustrated in FIG. 20 with a trench depth extending into the n-drift region according to an embodiment of the present invention.
Figure 20:
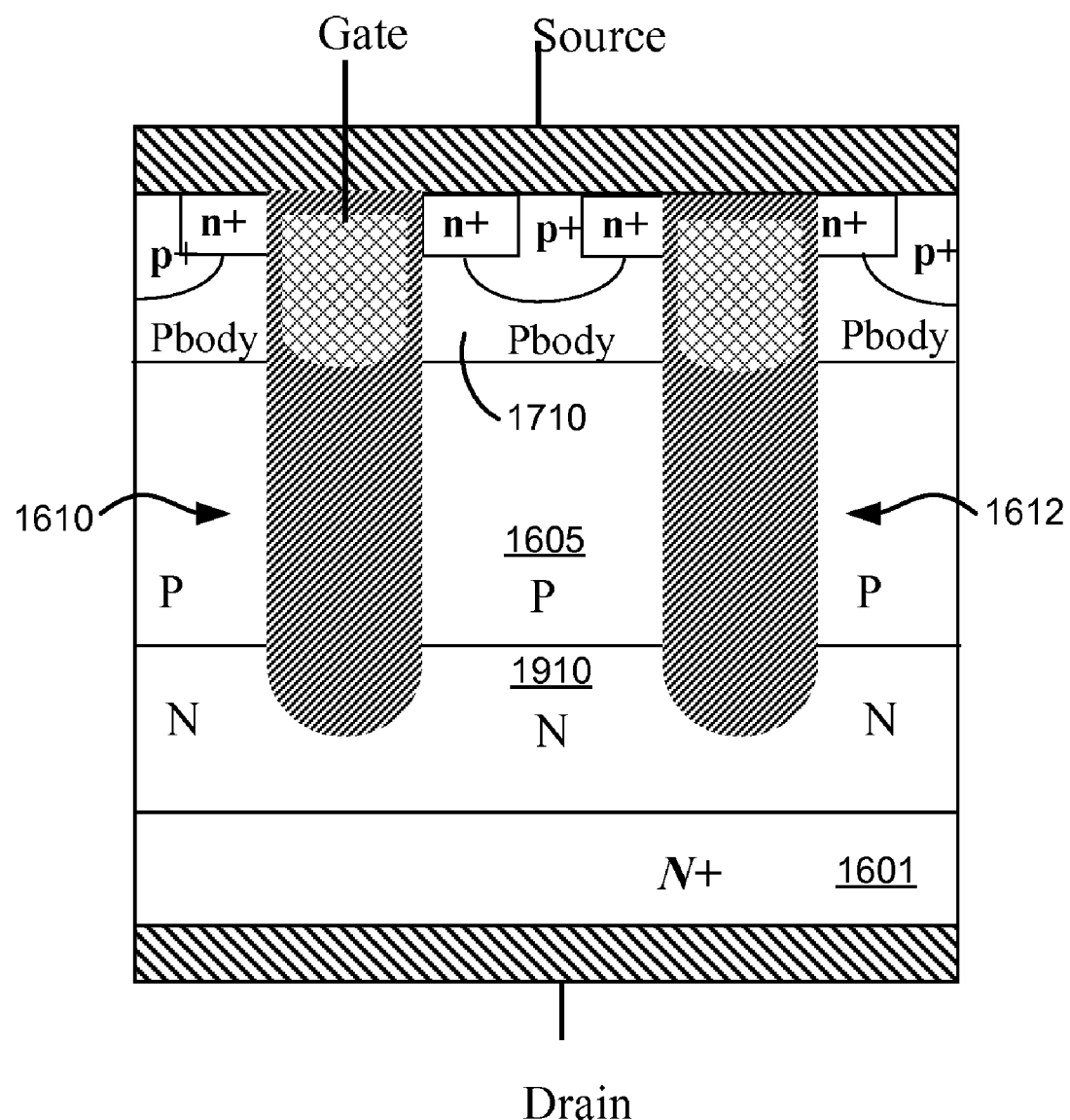
FIG. 20 is a simplified illustration of a trench MOS transistor as illustrated in FIG. 17A with an n-drift region between the p-region and the substrate according to an embodiment of the present invention.

FIG. 19 is a simplified illustration of a trench MOS transistor as illustrated in FIG. 17A with an n-drift region 1910 between the p-region present in the p-type epitaxial layer 1605 and the n+ substrate 1601 according to an embodiment of the present invention. FIG. 20 is a simplified illustration of a trench MOS transistor as illustrated in FIG. 19 with a trench depth extending into the n-drift region 1910 and not into the n+ substrate 1601.

Figure 21A:
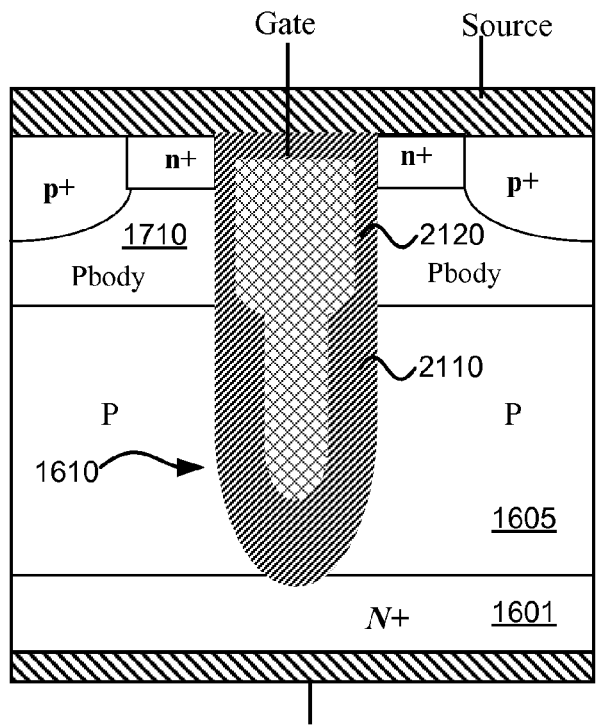
FIG. 21A is a simplified illustration of a trench MOS transistor as illustrated in FIG. 18 with a stepped gate oxide according to an embodiment of the present invention.

FIG. 21A is a simplified illustration of a trench MOS transistor as illustrated in FIG. 18 with a stepped gate oxide according to an embodiment of the present invention. For purposes of clarity, only a single trench is illustrated in FIG. 21A. The trench 1610 has a stepped gate oxide layer with a thicker layer 2110 on the lower portion of the trench and a thinner layer 2120 on the upper portion of the trench. Although the step in the gate dielectric is illustrated at the interface between the p-type epitaxial layer 1605 and the p-body layer 1710 in FIG. 21A, this is not required by the present invention. In FIG. 20, the trench depth extends into the n-drift region 1910 and not into the n+ substrate 1601 as in FIG. 19.

Figure 21B:
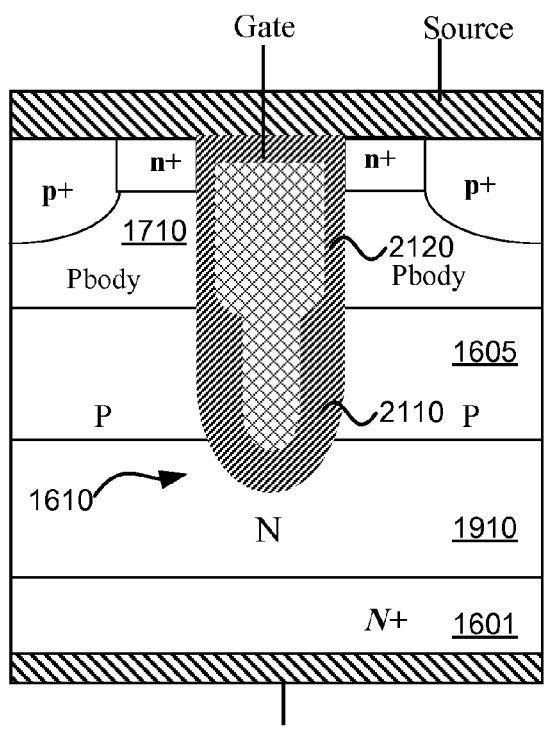
FIG. 21B is a simplified illustration of a trench MOS transistor as illustrated in FIG. 20 with a stepped gate oxide according to an embodiment of the present invention.

FIG. 21B is a simplified illustration of a trench MOS transistor as illustrated in FIG. 20 with a stepped gate oxide according to an embodiment of the present invention. As discussed in relation to FIG. 20, the trench depth extends into the n-drift region 1910 and not into the n+ substrate 1601. In the embodiments illustrated in FIGS. 21A and 21B, the stepped gate oxide thickness provides a reduction in the gate-drain capacitance $C_{gd}$.

Figure 22A:
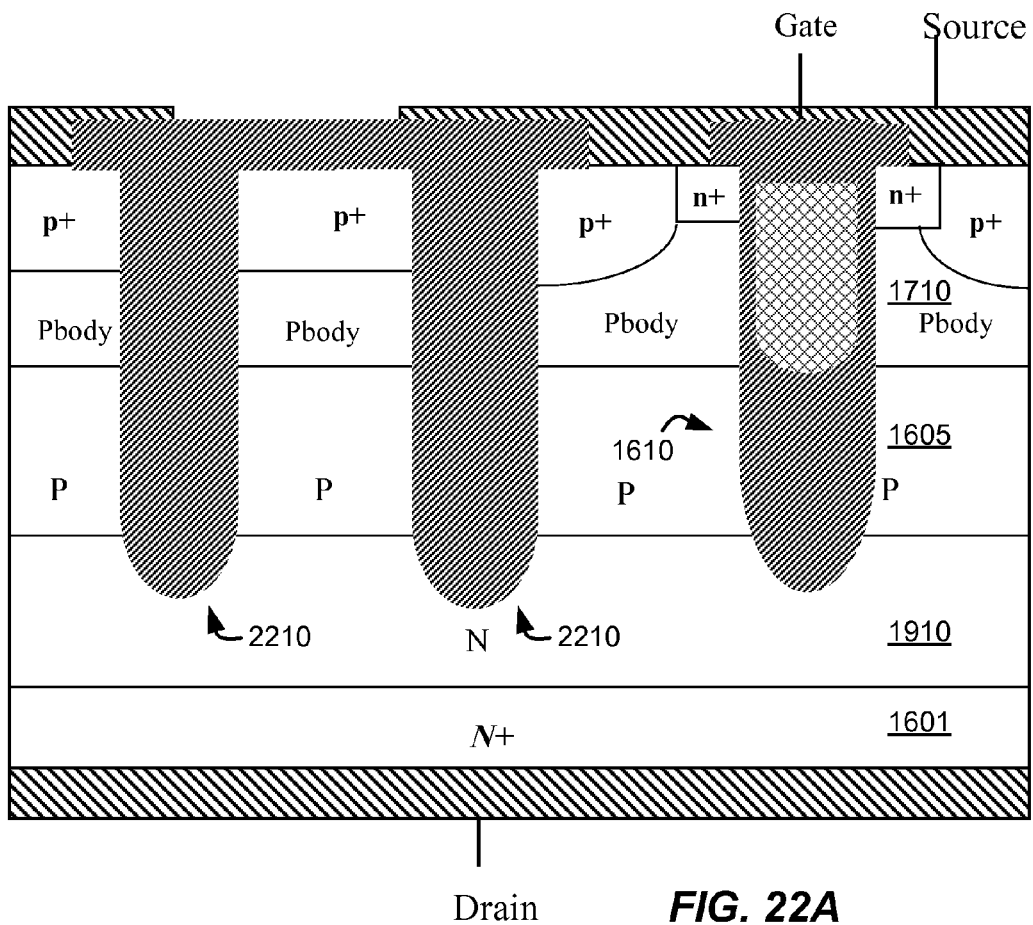
FIG. 22A is a simplified illustration of a trench MOS transistor as illustrated in FIG. 20 with dielectric filled trenches for device termination according to an embodiment of the present invention.

FIG. 22A is a simplified illustration of a trench MOS transistor as illustrated in FIG. 20 with dielectric filled trenches for device termination according to an embodiment of the present invention. The one or more trenches 2210 illustrated in FIG. 22A may be filled with a dielectric material such as silicon oxide and are used to terminate the device. The termination trenches can be of the same or different widths and depths than those of the charge control trenches.

Figure 22B:
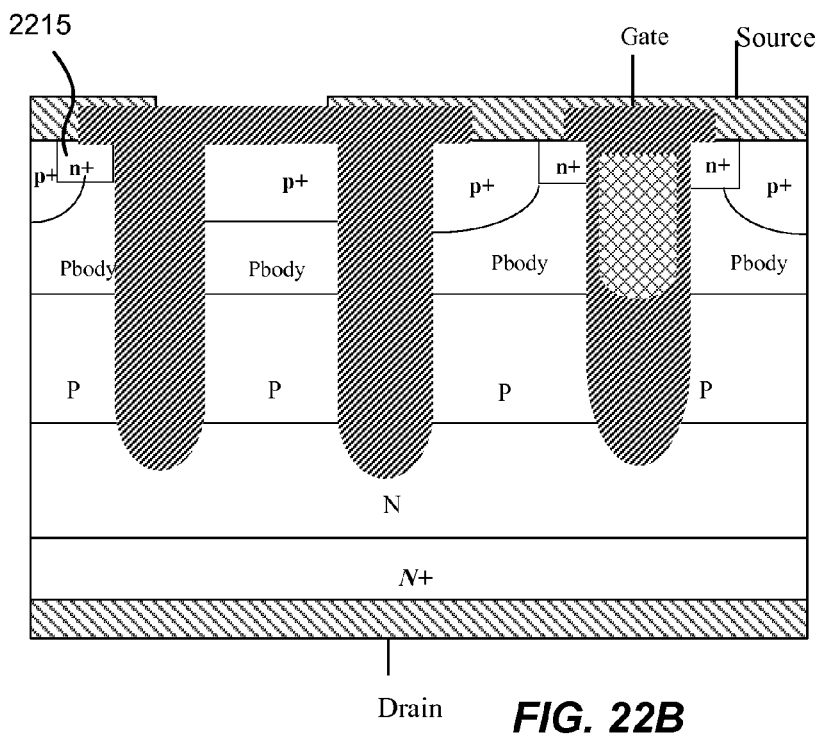
FIG. 22B is a simplified illustration of a trench MOS transistor as illustrated in FIG. 20 with dielectric filled trenches for device termination with an n+ and p-region short contact at the edge of the device according to an embodiment of the present invention.

FIG. 22B is a simplified illustration of a trench MOS transistor as illustrated in FIG. 20 with dielectric filled trenches for device termination and a body-source short according to an embodiment of the present invention. As illustrated in FIG. 22B, the n+ region 2215 abuts the trench and is shorted to the p+ diffusion region. The shorting of the body to the source improves device termination. One of ordinary skill in the art would recognize many variations, modifications, and alternatives.

Figure 23A:
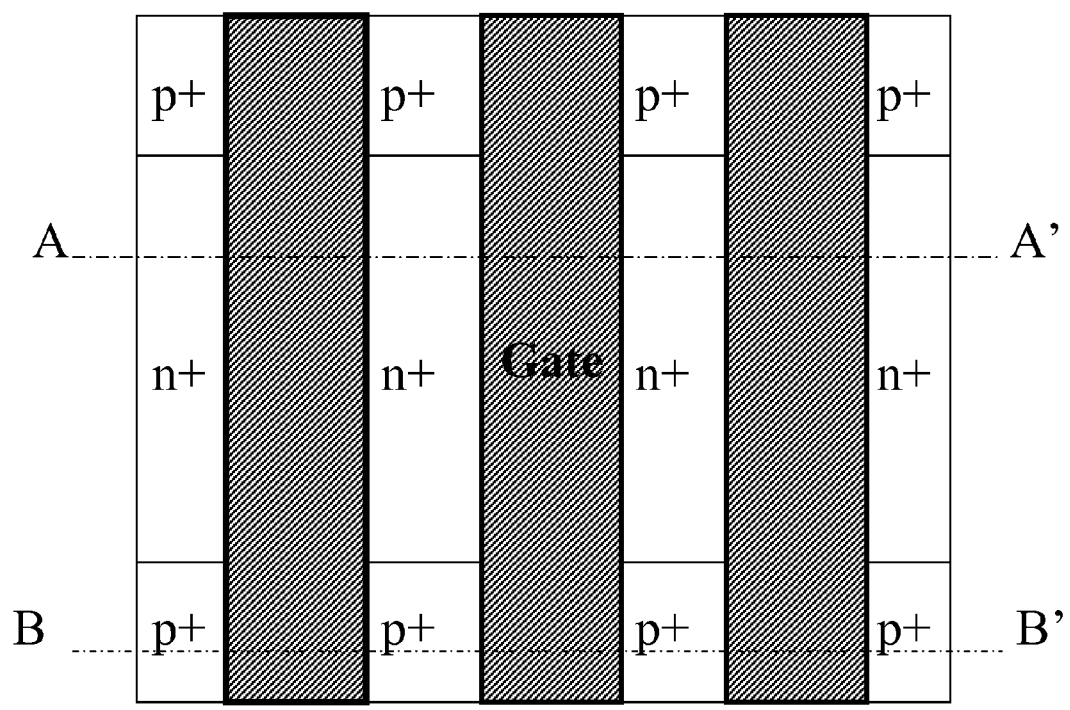
FIG. 23A is a simplified top view illustration of a power MOSFET structure as illustrated in FIG. 18A with an alternative layout of the n+ region and the and p+ region according to an embodiment of the present invention.
Figure 23B:
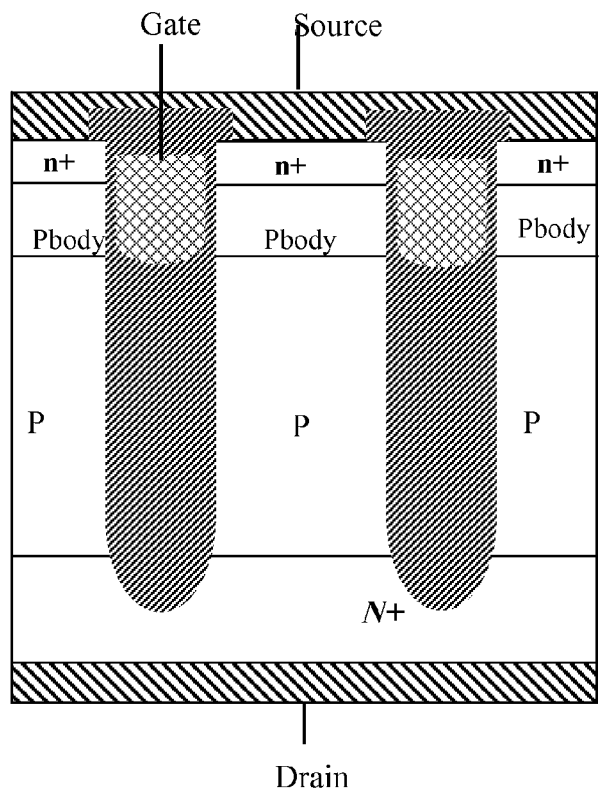
FIG. 23B is a simplified cross-sectional illustration along line AA' of FIG. 23A.
Figure 23C:
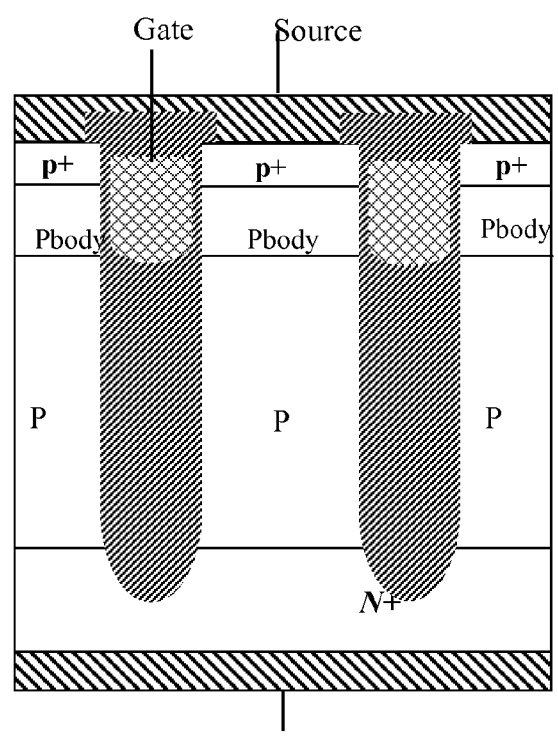
FIG. 23C is a simplified cross-sectional illustration along line BB' of FIG. 23A.

FIG. 23A is a simplified top view illustration of a power MOSFET structure as illustrated in FIG. 18 with an alternative layout of the n+ region and the and p+ region according to an embodiment of the present invention. FIGS. 23B and 23C are simplified cross-sectional illustrations along lines AA' and BB' of FIG. 23A, respectively. The placement of the p+ and n+ at the contact regions are provided in the illustrated embodiment, although this is not required by the present invention.

Figure 24:
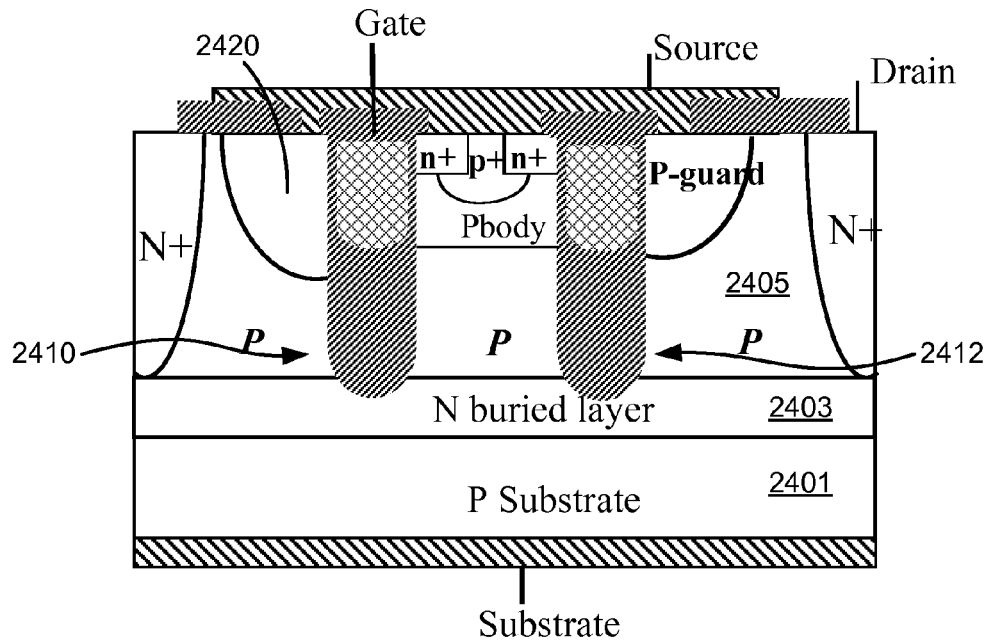
FIG. 24 is a simplified illustration of a quasi-vertical power MOSFET configuration with a conventional termination structure according to an embodiment of the present invention.

FIG. 24 is a simplified illustration of a quasi-vertical power MOSFET configuration with a conventional termination structure according to an embodiment of the present invention. As illustrated in FIG. 24, the quasi-vertical power MOSFET is fabricated on a p-type substrate 2401 and includes an n-type buried layer 2403. A p-type epitaxial layer 2405 is formed on the n-type buried layer 2403. The device illustrated in FIG. 24 shares some similarities with the device illustrated in FIG. 18.

In the on-state, electron current flows from the source through the channel, the electron inversion layer induced by the positive charge present in the charge control region of the trench to the n-type buried layer 2403 and the n+ regions to the drain contact at the surface of the device. In the embodiment illustrated in FIG. 24, a conventional termination is used and for simplicity only two trenches 2410 and 2412 are shown. Other structures with multiple parallel cells can also be implemented. One of ordinary skill in the art would recognize many variations, modifications, and alternatives. P-guard rings 2420 are provided to keep the drain from punching through to the adjacent control gate region.

Figure 25:
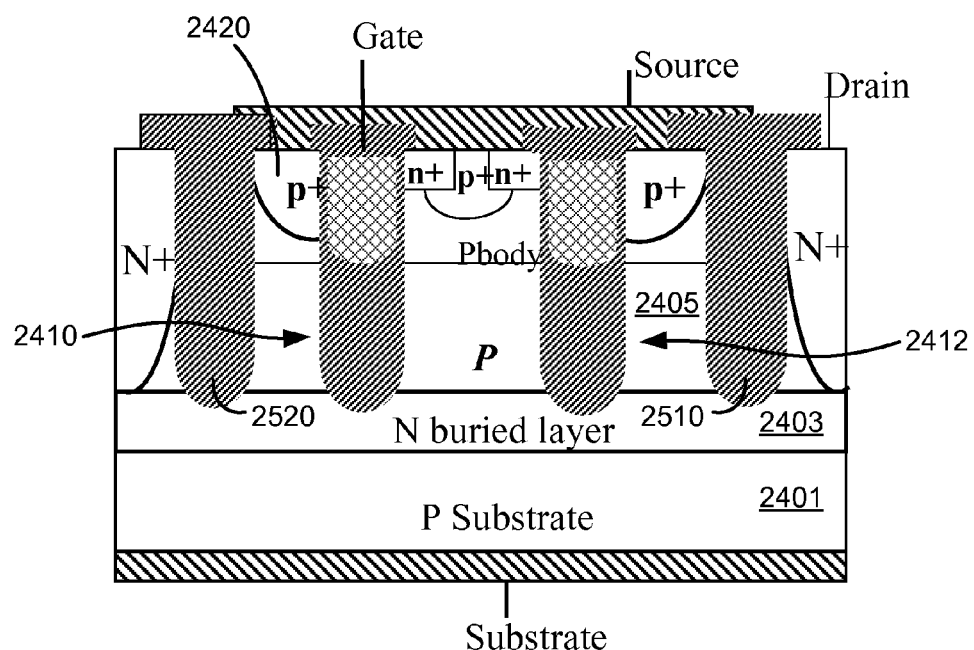
FIG. 25 is a simplified illustration of a quasi-vertical power MOSFET configuration using dielectric material filled trenches for termination according to an embodiment of the present invention.

FIG. 25 is a simplified illustration of a quasi-vertical power MOSFET configuration using dielectric material filled trenches for termination according to an embodiment of the present invention. Referring to FIG. 25, deep trenches 2510 and 2520 are filled with a first dielectric material such as silicon oxide, which are used to terminate the quasi-vertical power MOSFET. Other structures with multiple cells and or termination using multiple trenches filled by dielectric material are included within other embodiments of the present invention. The termination trenches can be of the same or different widths and depths than those of the charge control trenches.

Figure 26A:
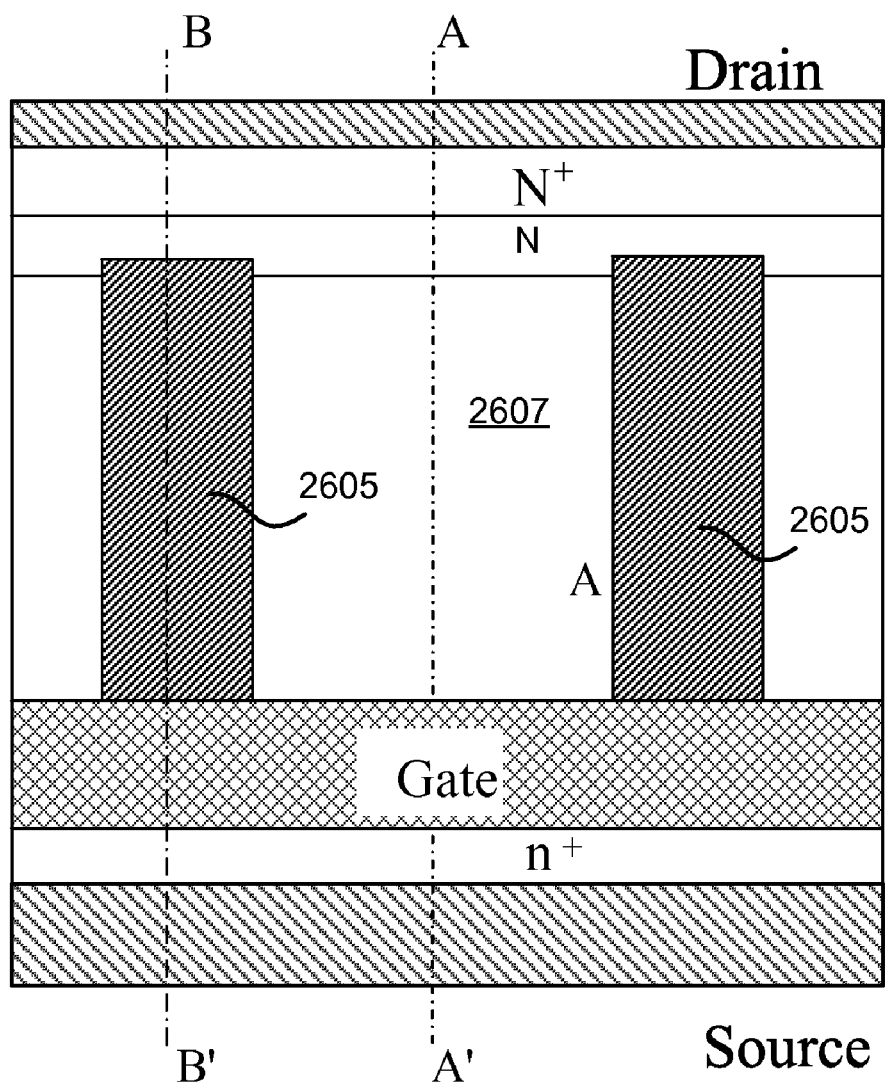
FIG. 26A is a simplified top view illustration of a lateral power MOSFET structure according to an alternative embodiment of the present invention.
Figure 26B:
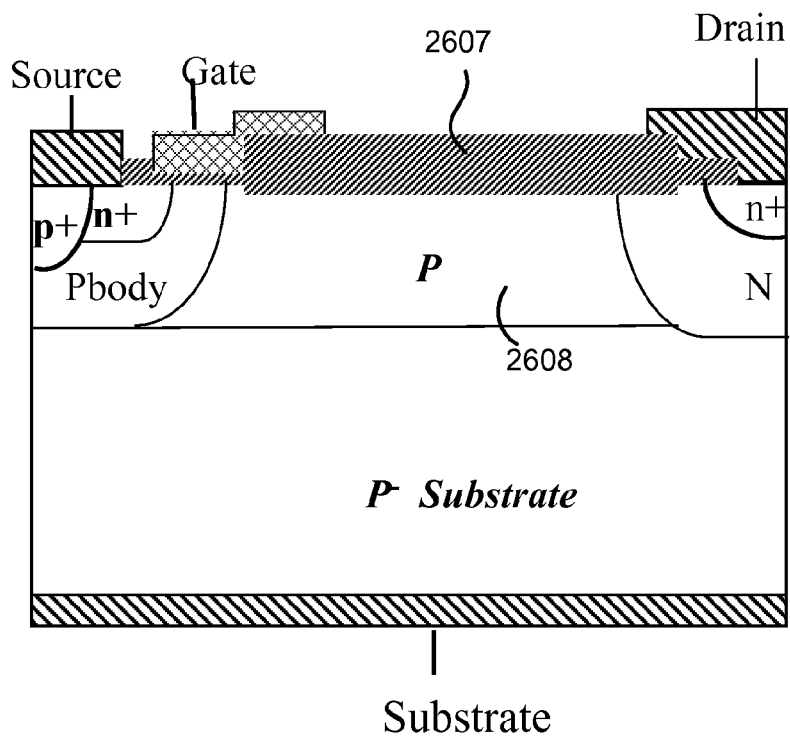
FIG. 26B is a simplified cross-sectional illustration along line AA' of FIG. 26A.
Figure 26C:
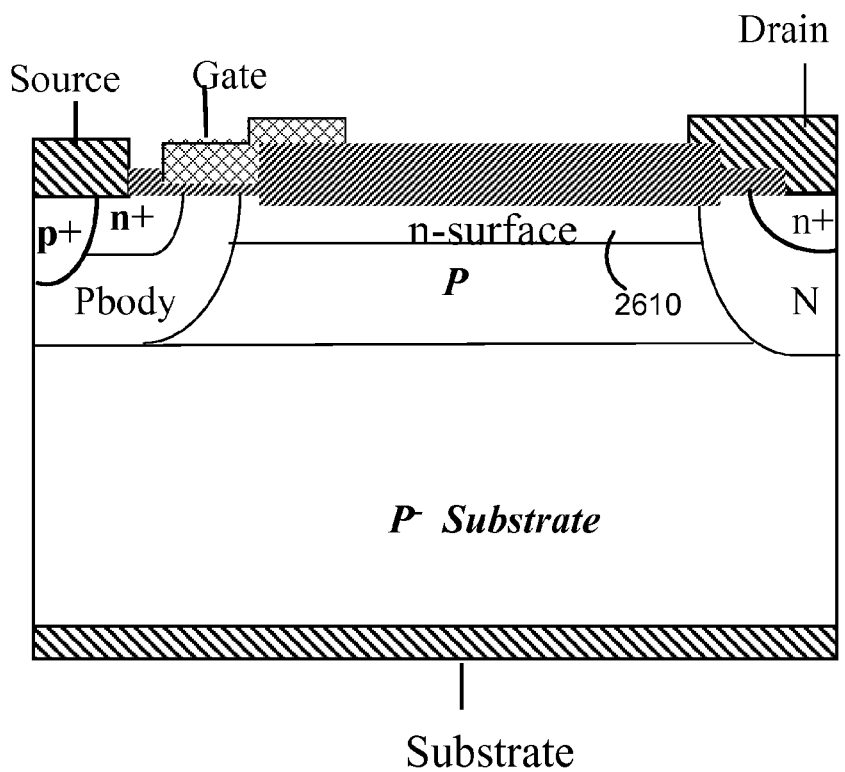
FIG. 26C is a simplified alternative cross-sectional illustration along line AA' of FIG. 26A.
Figure 26D:
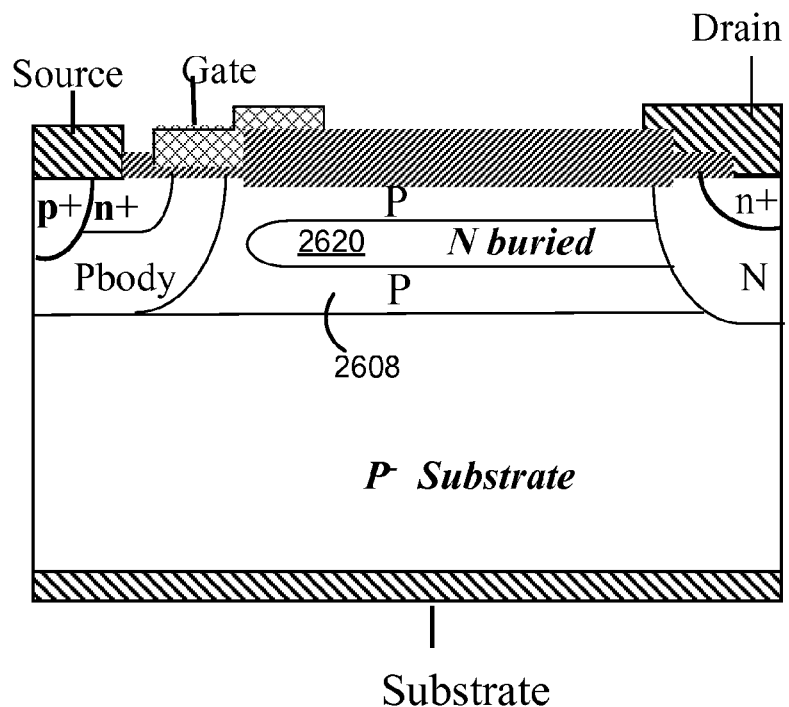
FIG. 26D is a simplified second alternative cross-sectional illustration along line AA' of FIG. 26A.
Figure 26E:
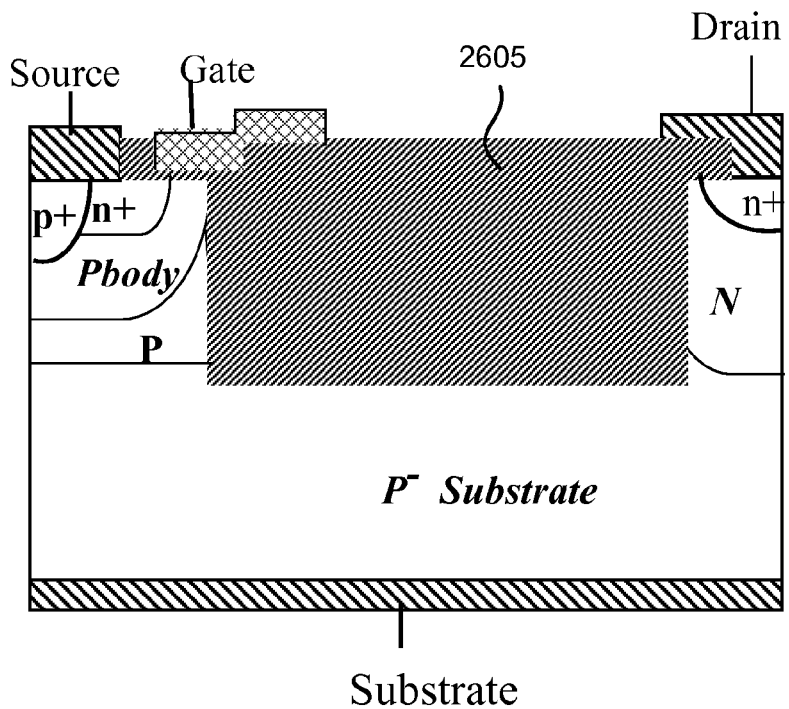
FIG. 26E is a simplified cross-sectional illustration along line BB' of FIG. 26A.

FIG. 26A is a simplified top view illustration of a lateral power MOSFET structure according to an alternative embodiment of the present invention. FIGS. 26B-D are simplified cross-sectional illustrations along line AA' of FIG. 26A for several different embodiments of the present invention. FIG. 26E is a simplified cross-sectional illustration along line BB' of FIG. 26A.

Referring to FIG. 26A, the lateral power MOSFET structure includes CC trenches 2605 filled with a first dielectric material such that the oxide in the trenches (e.g., SiO$_2$) has positive charges included therein. The CC trenches 2605 extend laterally from the source side (the lower portion of FIG. 26A) towards the drain (the upper portion of FIG. 26A). As illustrated in the various different embodiments, the first dielectric layer thickness at the bottom, source and drain side walls of the CC trenches can be different from the side walls facing the p-drift region and the n-drift region. Additionally, various doping alternatives for the mesa region are provided. Moreover, although the CC trenches shown in FIG. 26A are filled by a dielectric material, other embodiments include dielectric material that includes two or more dielectric layers such as, for example, silicon oxide/silicon nitride/silicon-dioxide. For example, although FIG. 18B is related to a vertical device, it illustrates the use of multiple dielectric layers in the trench. Such a design is also applicable to the structures illustrated in FIG. 26A.

The entire structure is covered by a dielectric layer, 2607, as shown in FIGS. 26A-D. This layer is used to passivate the semiconductor device. A p-type drift region 2608 is disposed between the drain and the body and the positive charge in the CC trench induces an inversion layer at the interface between the CC trench and the semiconductor material. In normal operation, electrons travel from the n+ source through the channel, along the walls and bottom of the CC trench and into the n+ drain. A necessary consequence of this is that the gate must overlap the CC trench to maintain continuity of current. In another embodiment (not illustrated), a device sharing similar features to the one shown in FIGS. 26A-E has an additional positive charge in the dielectric layer that covers the mesa region surface. This adds an additional conduction channel along the top surface of the p-type drift region.

As shown in FIG. 26C, one structure provided by one embodiment has an additional n-surface layer 2610 and another structure provided by another embodiment has an n-buried layer 2620 as shown in FIG. 26D. The n-surface layer 2610 and the n-buried layer 2620 are added to lower the Rsp of the device. The n-surface or n-buried layers are completely depleted at breakdown voltage by the p-body and the p-type regions.

Figure 26F:
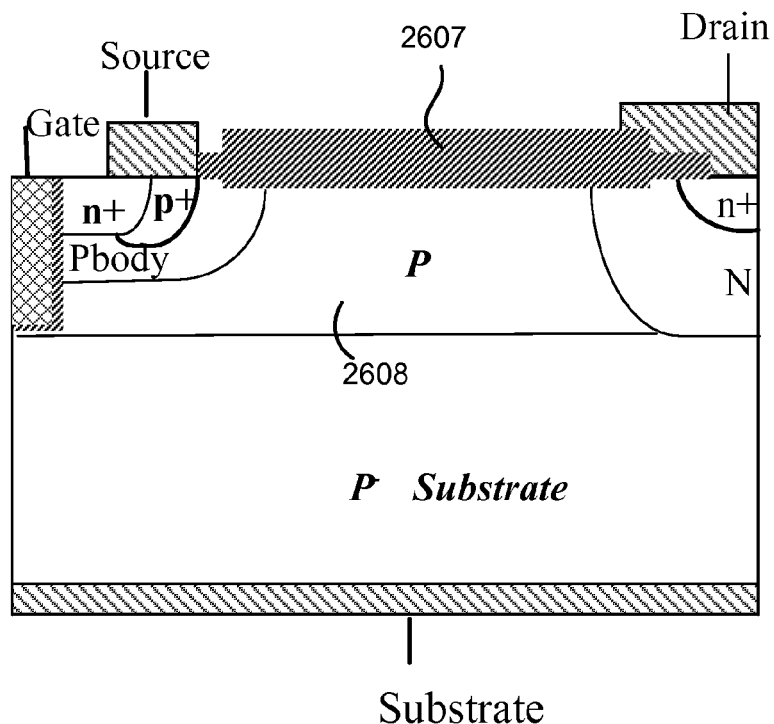
FIG. 26F is a simplified cross-sectional illustration of a lateral power MOSFET structure according to an alternative embodiment of the present invention.

FIG. 26F is a simplified illustration of a lateral power MOSFET similar to that of FIG. 26B except with a trench Control Gate CG. Electron current flow in this structure starts from the n+ source, vertically along the channel, laterally along the walls, bottom, and top of the CC trench to the n+ drain. The CC trench extends very close to the trench gate in order for continuity of electron current to be maintained. In an alternative embodiment, region 2608 is n-type with negative charge in the CC trench so the CC trench need not extend fully to the CG since electron current flow is in the n-type drift region. One of ordinary skill in the art would recognize many variations, modifications, and alternatives.

Figure 26G:
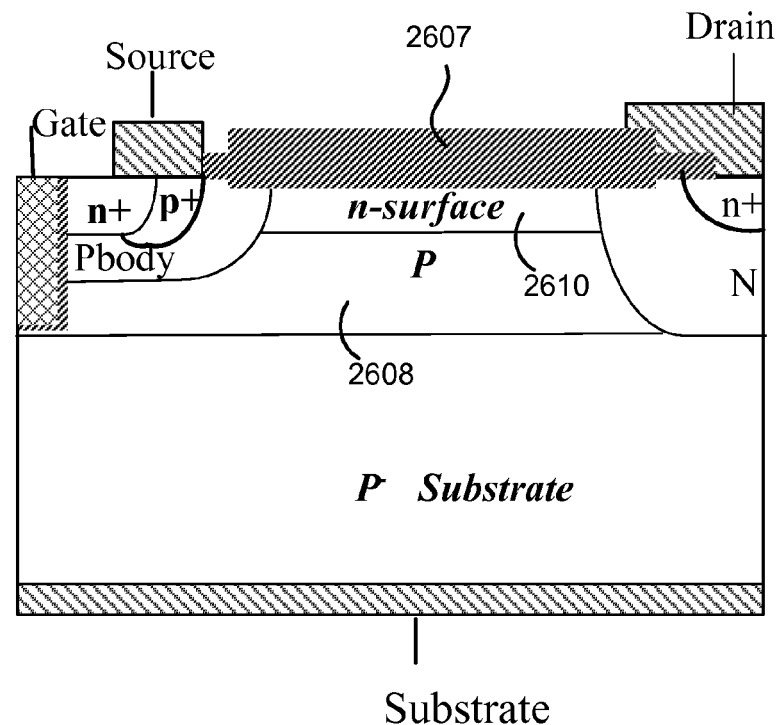
FIG. 26G is a simplified cross-sectional illustration of a lateral power MOSFET structure according to another alternative embodiment of the present invention.

FIG. 26G is a simplified illustration of a lateral power MOSFET similar to that of FIG. 26C except with a trench CG. Electron current flow in this structure starts from the n+ source, vertically along the channel, laterally along the walls of the CC trench to the n+ drain. The CC trench extends very close to the trench gate in order for continuity of electron current to be maintained. In an alternative embodiment, region 2608 is n-type with negative charge in the CC trench so the CC trench need not extend fully to the CG since electron current flow is in the n-type drift region. One of ordinary skill in the art would recognize many variations, modifications, and alternatives.

Figure 26H:
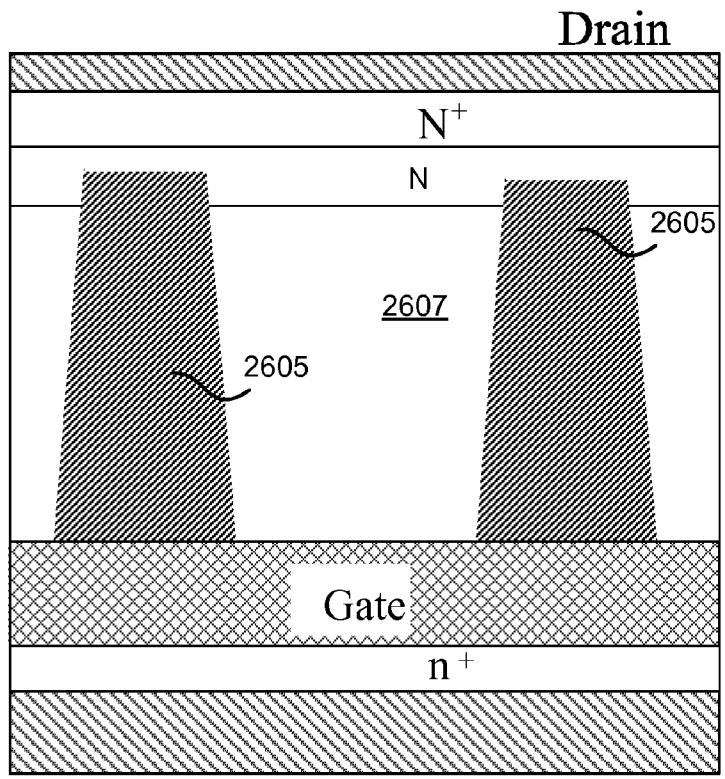
FIG. 26H is a simplified top view illustration of a lateral power MOSFET structure according to an alternative embodiment of the present invention.

FIG. 26H is a simplified top view illustration of a lateral power MOSFET structure according to an alternative embodiment of the present invention. The CC trenches in this embodiment are tapered with the CC trench being wider at the source end and narrower at the drain end. This varies the charge balance and thereby the electric field between the source and the drain under reverse bias. This effect can be used to optimize the device characteristics further and to account for the depletion charge of the substrate as understood by one of ordinary skill in the art.

Figure 26I:
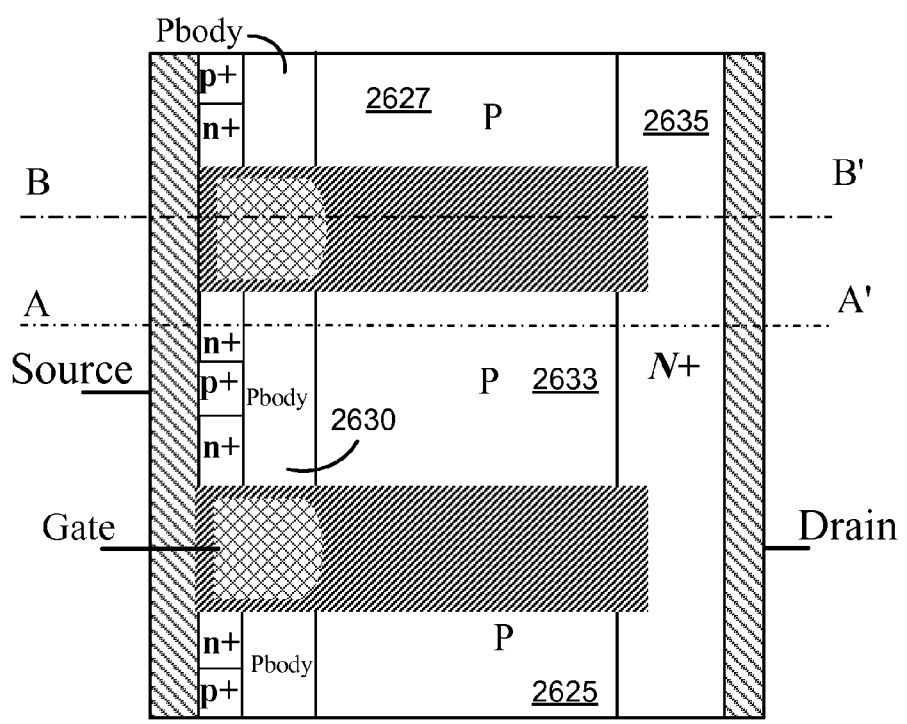
FIG. 26I is a simplified top view illustration of a lateral power MOSFET structure according to another alternative embodiment of the present invention.

FIG. 26I is a simplified top view illustration of a lateral power MOSFET structure according to another alternative embodiment of the present invention. It should be noted that the gate conducting material, for example, polysilicon, is connected between the cells. The structure differs from 26A in that the CG is formed within the CC trench rather than at the surface as shown in FIGS. 26A-E. Referring to FIGS. 17 and 26I, similarities in structure can be observed. This effect can be used to optimize the device characteristics further as understood by one of ordinary skill in the art.

Figure 26J:
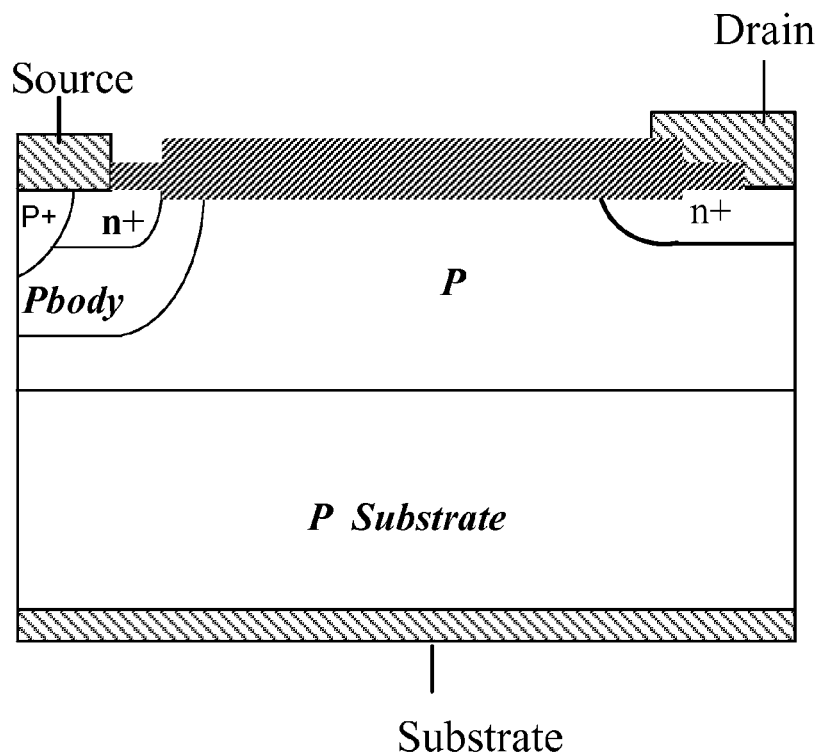
FIG. 26J is a simplified cross-sectional illustration along line AA' of FIG. 26I.
Figure 26K:
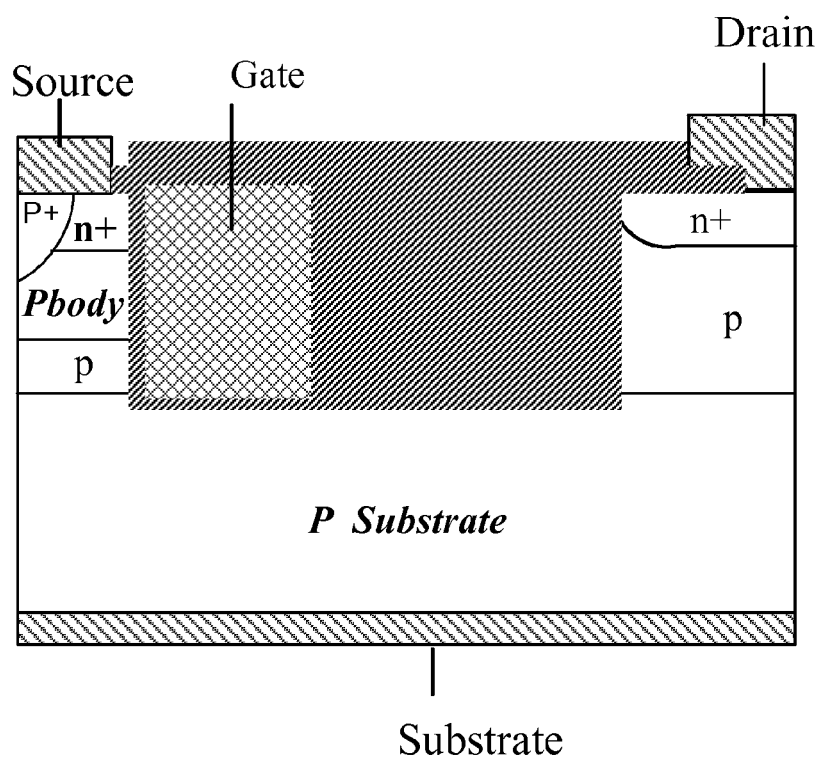
FIG. 26K is a simplified cross-sectional illustration along line BB' of FIG. 26I.

FIG. 26J is a simplified cross-sectional illustration along line AA' of FIG. 26I. FIG. 26K is a simplified cross-sectional illustration along line BB' of FIG. 26I. As illustrated in FIG. 26K, the CG and the CC trench are integrated in the same trench in this lateral design. It should be noted that the CG regions will generally be provided with electrical connectivity using a polysilicon, metal, or other layer (not shown) as will be evident to one of skill in the art.

Figure 27A:
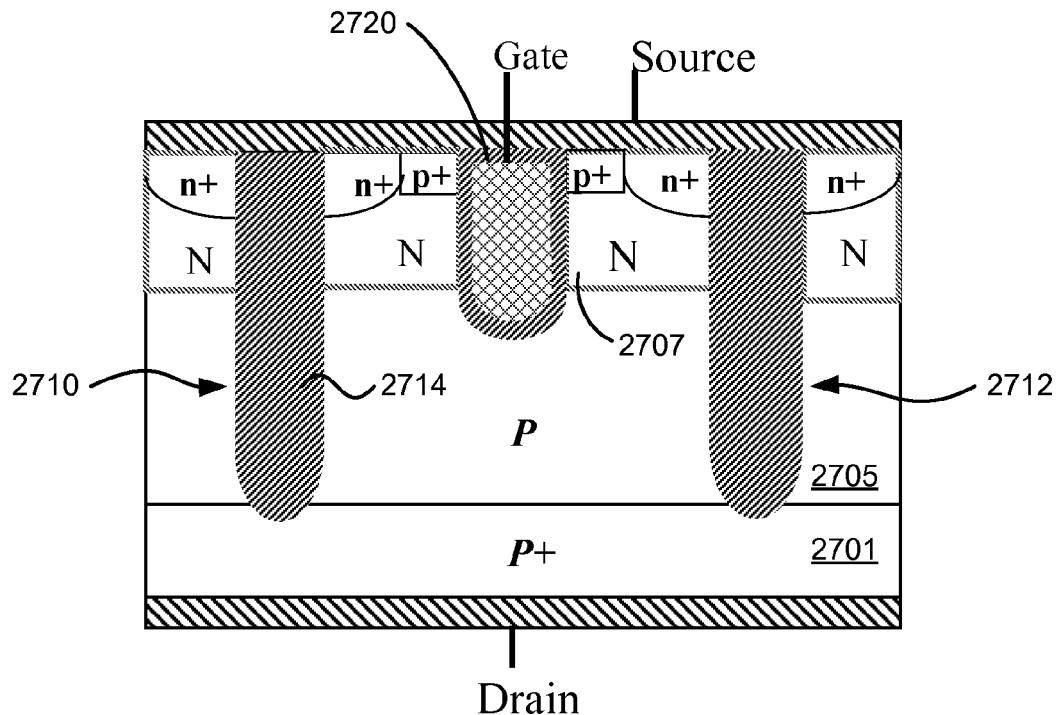
FIG. 27A is a simplified illustration of a p-channel trench MOS transistor with a control gate trench and dielectric layer filled charge control trenches according to an embodiment of the present invention.

Although some embodiments of the present invention have been described with reference to n-channel MOSFETs, other embodiments of the present invention are p-channel MOSFETs. FIG. 27A is a simplified illustration of a p-channel trench MOS transistor with a control gate trench and dielectric layer filled charge control trenches according to an embodiment of the present invention. The p-channel transistor is fabricated on a p+ substrate upon which a p-type epitaxial layer 2705 is deposited. An n-body layer 2707 extends into the p-type epitaxial layer 2705. Two CC trenches 2710 and 2712 extend from a surface of the device through the n-body layer 2707 and the p-type epitaxial layer 2705 into the p+ substrate 2701. The CC trenches 2710 and 2712 are filled with a dielectric material 2714 such as silicon dioxide that includes a fixed (e.g., a positive) charge. A trench CG 2720 extends through the n-type layer 2707 into the p-type epitaxial layer 2705.

Figure 27B:
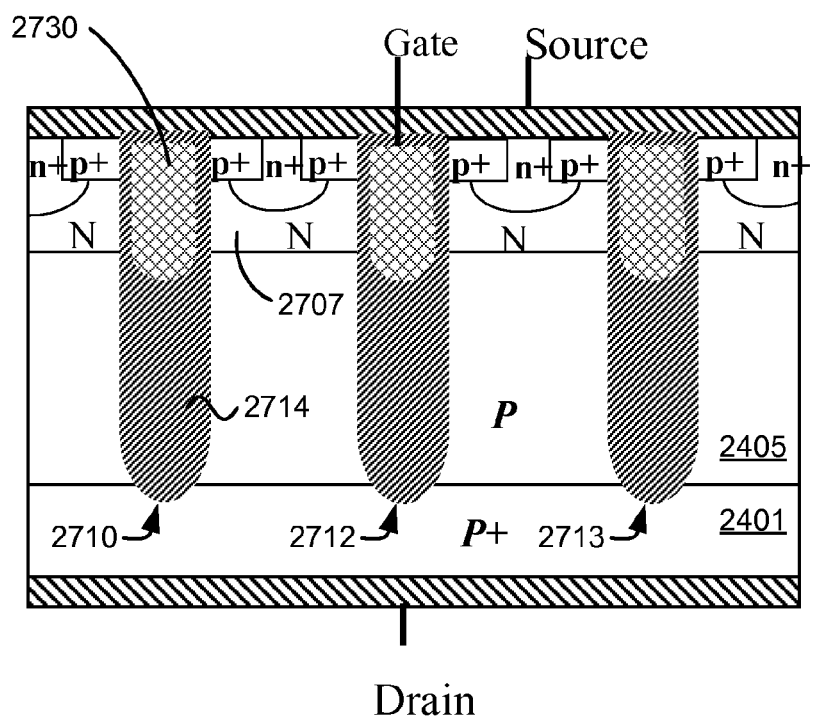
FIG. 27B is a simplified illustration of a p-channel trench MOS transistor with common control gate and the charge control trenches according to an embodiment of the present invention.

FIG. 27B is a simplified illustration of a p-channel trench MOS transistor with common control gate and the charge control trenches according to an embodiment of the present invention. In the embodiment illustrated in FIG. 27B, the gate overlap over the p-drift region and/or the charge in the dielectric layer is located below the CG by a distance sufficient to allow current to flow from the channel to the p-drift region. In a manner similar to the trenches illustrated in FIG. 16, the transistor includes a CG 2730 and CC (dielectric having a positive charge 2714) constructed in the same trench (trenches 2710, 2712, and 2713).

Figure 28:
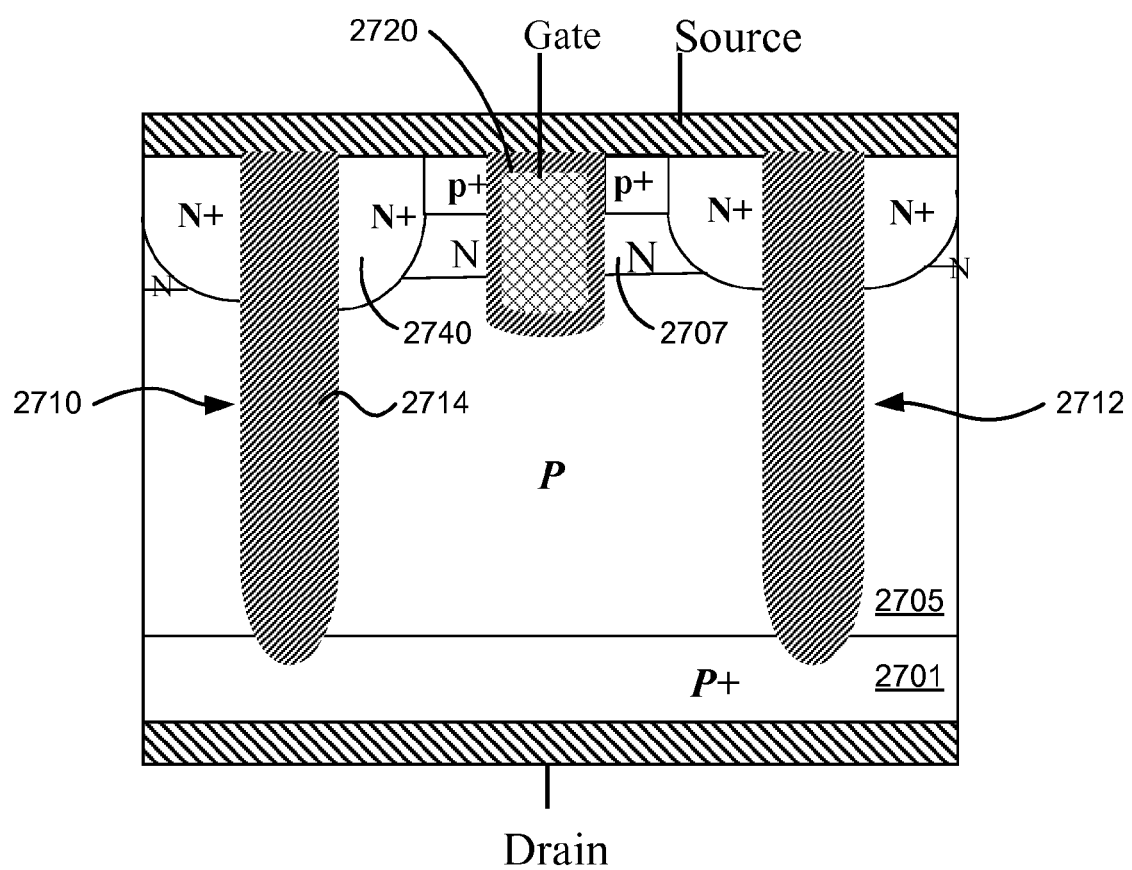
FIG. 28 is a simplified illustration of a p-channel trench MOS transistor as illustrated in FIG. 27A with a deep n+ layer according to an embodiment of the present invention.

FIG. 28 is a simplified illustration of a p-channel trench MOS transistor as illustrated in FIG. 27A with a deep n+ region according to an embodiment of the present invention. As illustrated in FIG. 28, the CC trenches 2710 and 2712 are disposed between an n+ region 2740 that is deeper than the n-body region 2707. This design is used to clamp the breakdown voltage to a predetermined value that is lower than that of the n-body 2707 to the p+ substrate 2701. In this embodiment, the CC trenches 2710 and 2712 extend from a surface of the device into the p+ substrate 2701. In an alternative embodiment (not illustrated), a variation of this embodiment utilizes a n+ region deeper than the trench CG 2720.

Figure 29A:
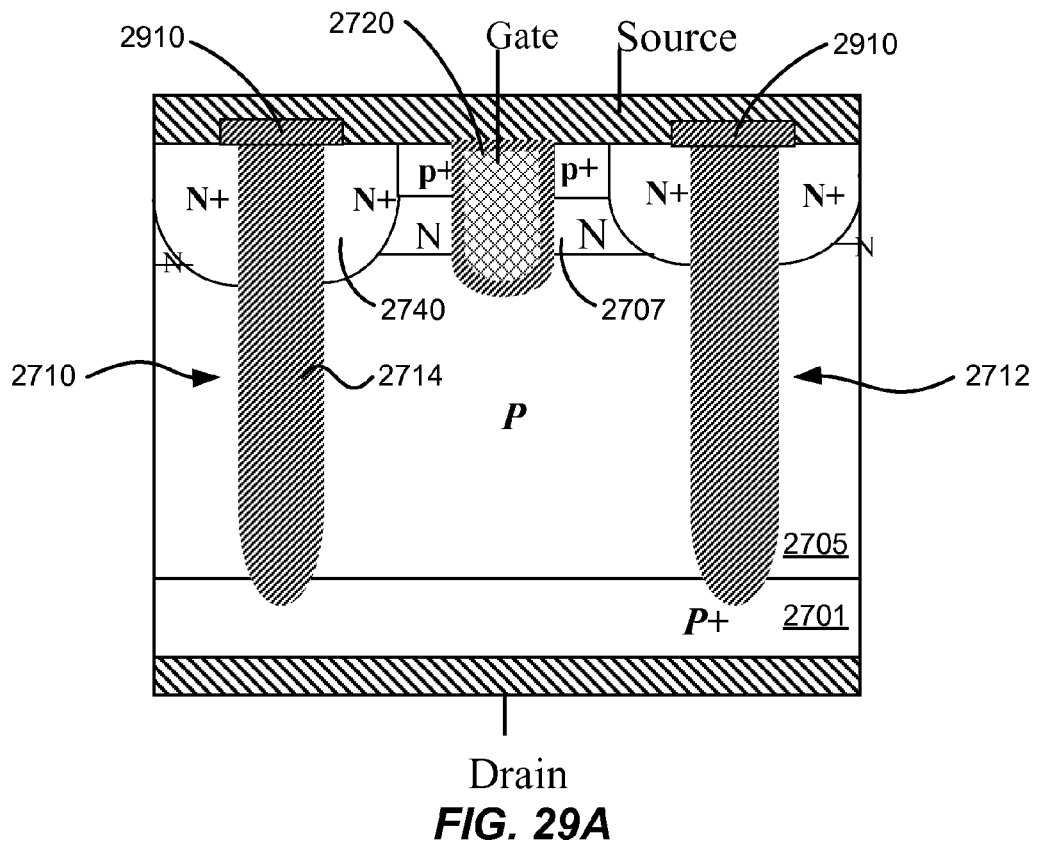
FIG. 29A is a simplified illustration of a p-channel trench MOS transistor with Charge Control trenches covered with dielectric layers according to an embodiment of the present invention.

FIG. 29A is a simplified illustration of a p-channel trench MOS transistor with Charge Control trenches covered with dielectric layers according to an embodiment of the present invention. The embodiment illustrated in FIG. 29A utilizes a similar structure to the device illustrated in FIG. 28. Additionally, as illustrated in FIG. 29A, a layer of the first dielectric material 2910 is formed on top of the CC trenches 2710 and 2712. In some embodiments, the layer of the first dielectric material 2710 may have a thickness ranging from 0.05 µm to 0.7 µm.

Figure 29B:
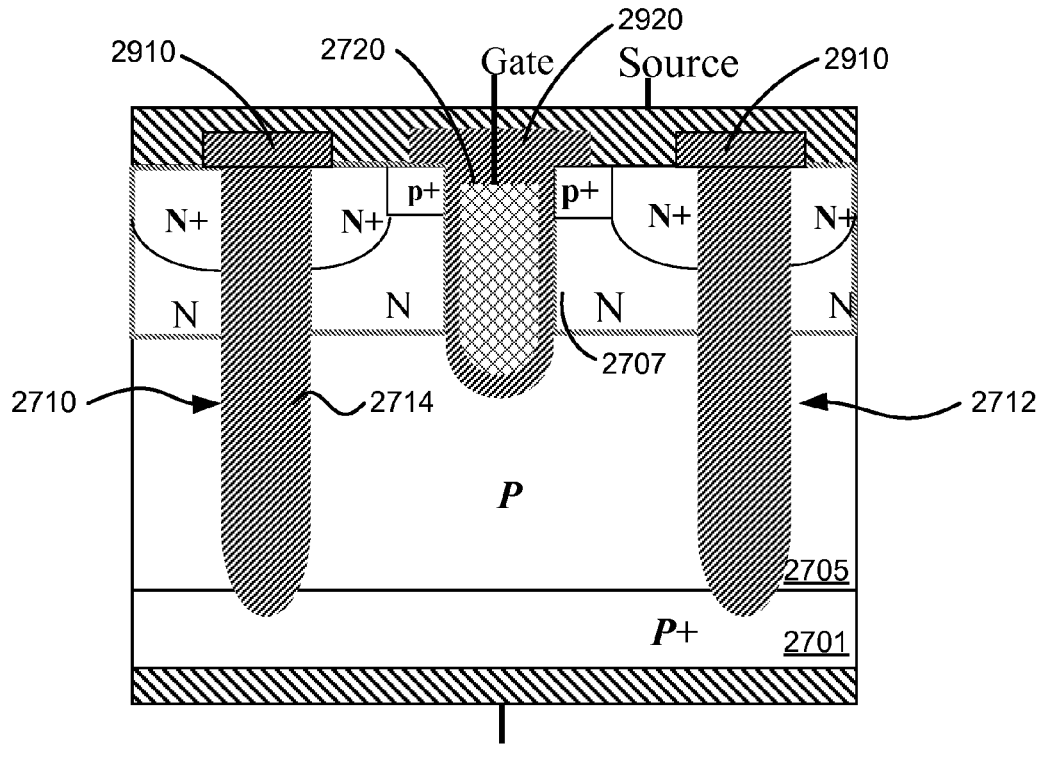
FIG. 29B is a simplified illustration of a p-channel trench MOS transistor with both the Control Gate and Charge Control trenches covered with dielectric layers according to an embodiment of the present invention.

FIG. 29B is a simplified illustration of a p-channel trench MOS transistor with both the Control Gate and Charge Control trenches covered with dielectric layers according to an embodiment of the present invention. Another portion of the layer of the first dielectric material 2920 is formed on top of the trench CG 2720. In some embodiments, the layer of the first dielectric material 2920 may have a thickness ranging from 0.05 µm to 0.7 µm.

Figure 30:
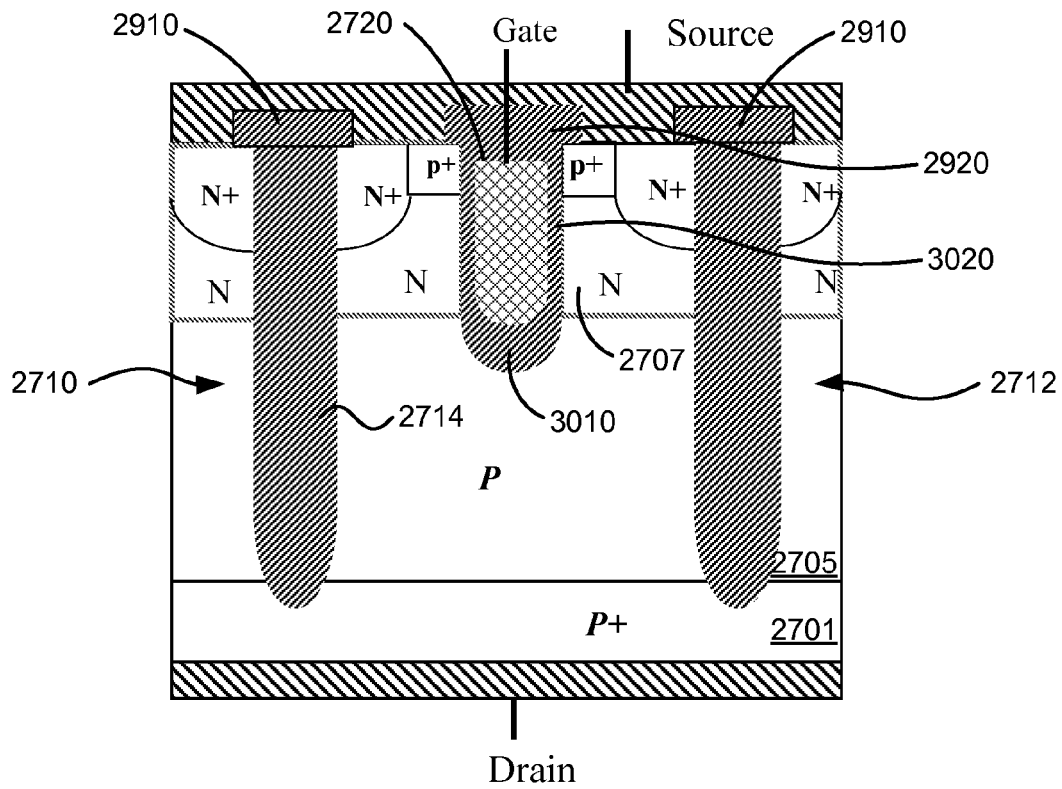
FIG. 30 is a simplified illustration of a p-channel trench MOS transistor as illustrated in FIG. 27A with a thick bottom oxide in the control gate trench according to an embodiment of the present invention.
Figure 31:
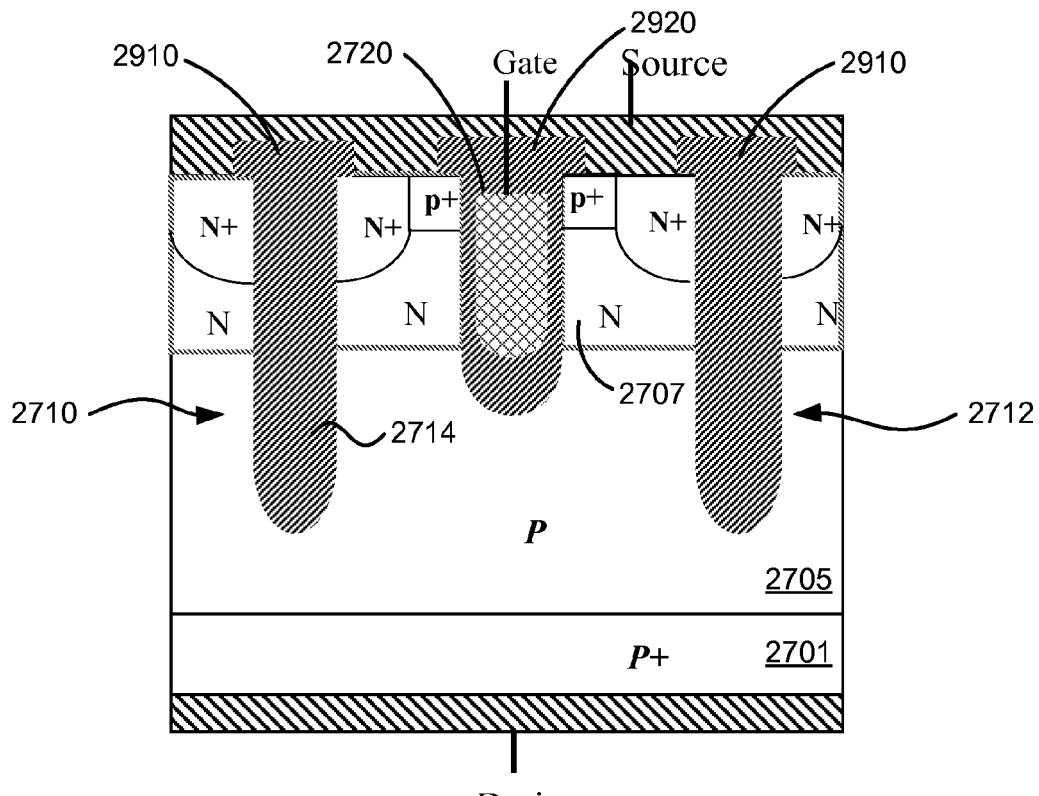
FIG. 31 is a simplified illustration of a p-channel trench MOS transistor as illustrated in FIG. 30 with Charge Control trenches that extend into the p-drift region according to an embodiment of the present invention.

FIG. 30 is a simplified illustration of a p-channel trench MOS transistor as illustrated in FIG. 27A with a thick bottom oxide in the control gate trench according to an embodiment of the present invention. As illustrated in FIG. 30, the first dielectric material layer 3010 in the bottom of the CG trench is thicker than the first dielectric material 3020 formed on the sides of the CG trenches 2720. The increased dielectric (e.g., oxide) thickness of layer 3010 lowers the gate-drain capacitance $C_{gd}$ in comparison with other devices. For example, the layer of the first dielectric material 3010 may have a thickness ranging from 0.1 µm to 1.0 µm. As illustrated in FIG. 31, another embodiment is a p-channel trench MOS transistor with Charge Control trenches that extend only into the p-drift region 2705.

Figure 32:
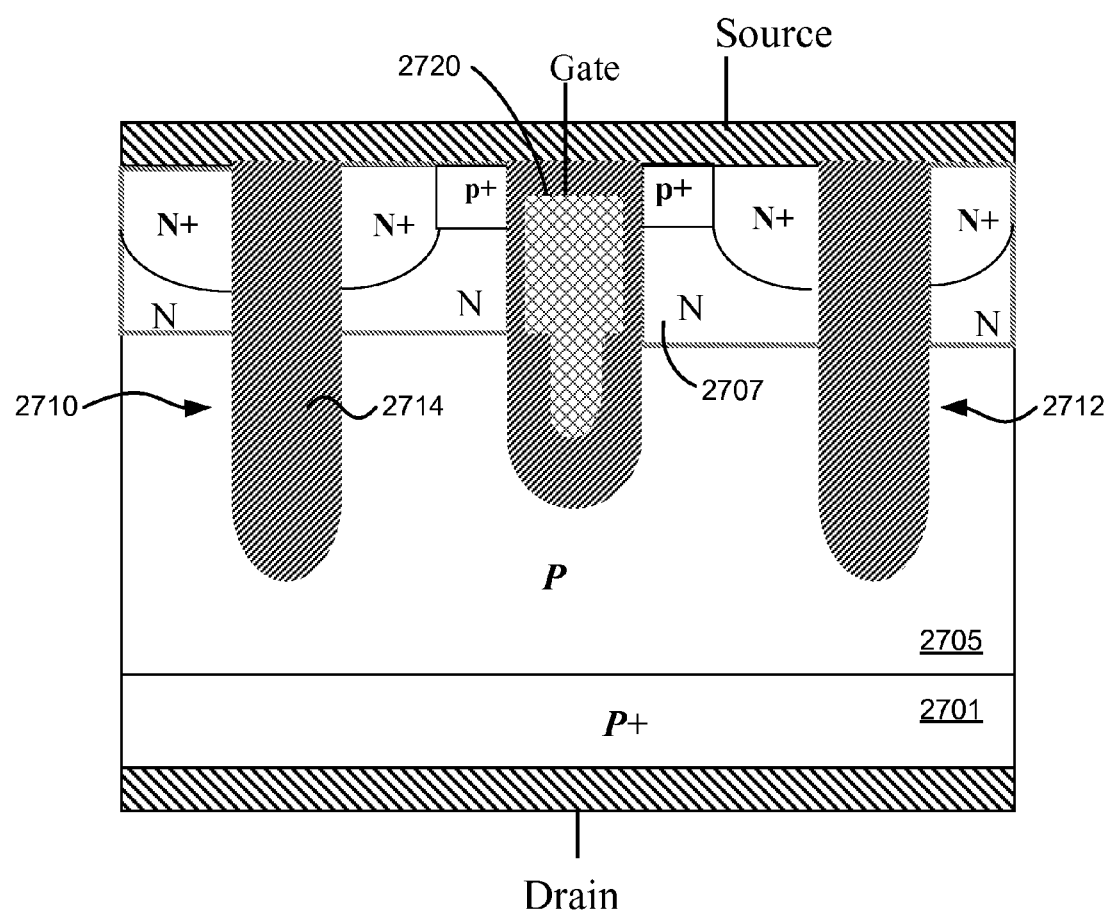
FIG. 32 is a simplified illustration of a p-channel trench MOS transistor as illustrated in FIG. 31 with a Control Gate trench with a stepped gate oxide according to an embodiment of the present invention.
Figure 33A:
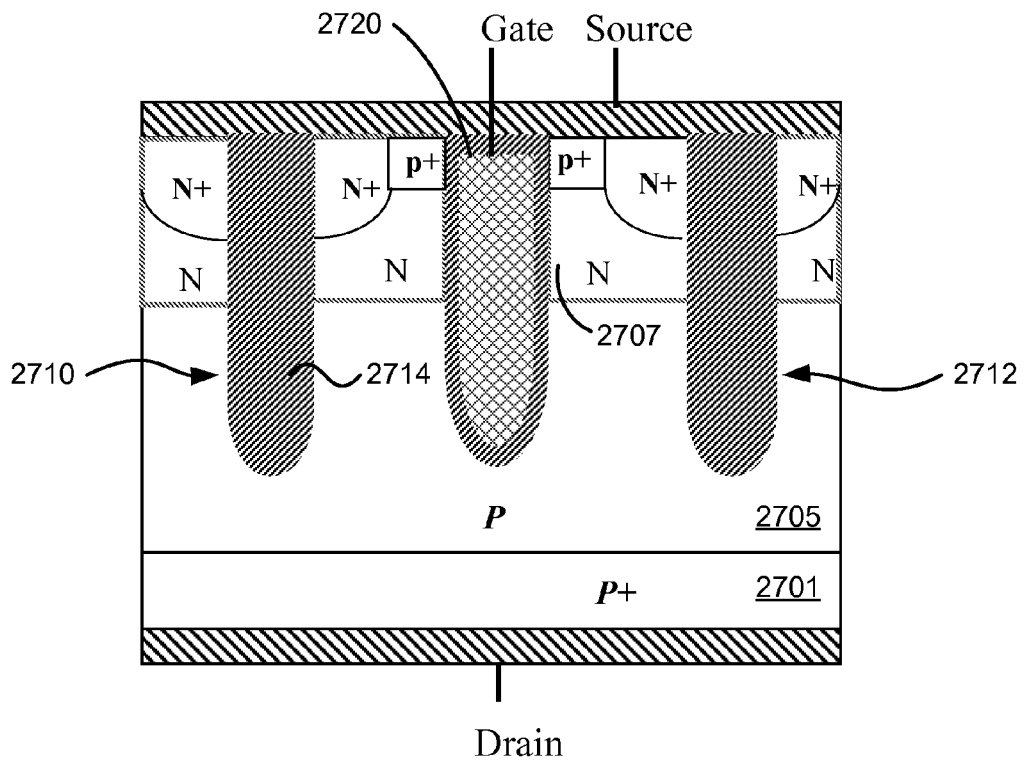
FIG. 33A is a simplified illustration of a p-channel trench MOS transistor with Control Gate trench and Charge Control trenches having the same trench depth according to an embodiment of the present invention.

FIG. 32 is a simplified illustration of a p-channel trench MOS transistor as illustrated in FIG. 31 with a Control Gate trench with a stepped gate oxide according to an embodiment of the present invention. FIG. 33A is a simplified illustration of a p-channel trench MOS transistor with Control Gate trench and Charge Control trenches having the same trench depth according to an embodiment of the present invention.

Figure 33B:
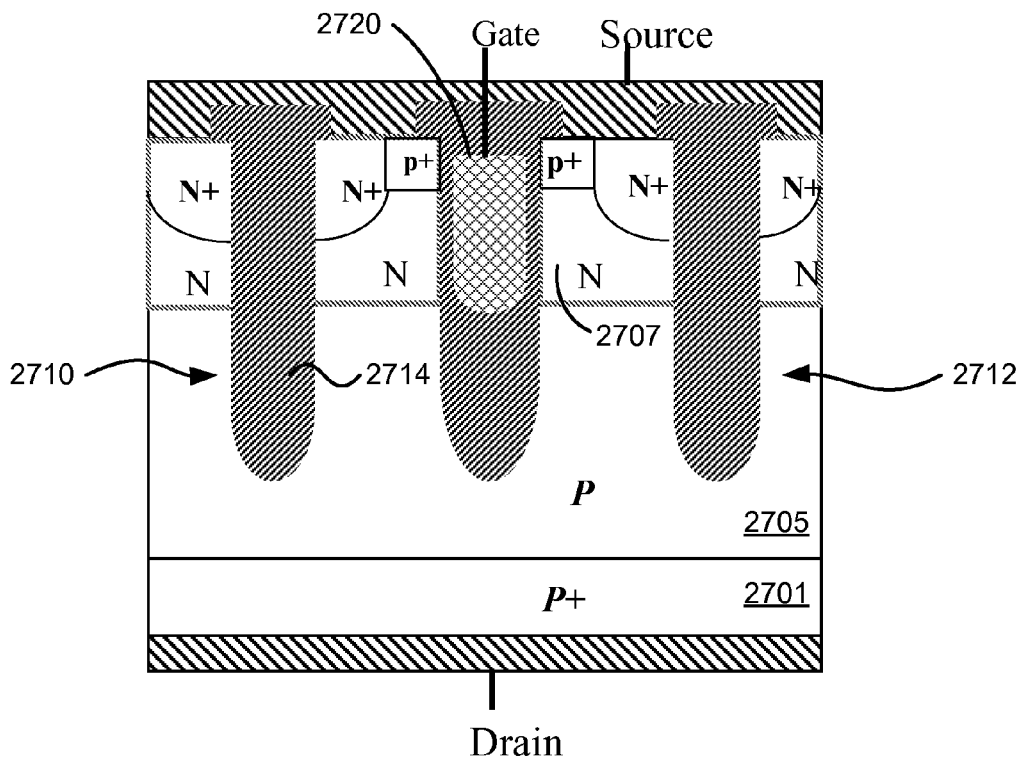
FIG. 33B is a simplified illustration of a p-channel trench MOS transistor with Control Gate trench and Charge Control trenches having the same trench depth and a thick control gate bottom gate oxide according to an embodiment of the present invention.

FIG. 33B is a simplified illustration of a p-channel trench MOS transistor with Control Gate trench and Charge Control trenches having the same trench depth and a thick control gate bottom gate oxide according to an embodiment of the present invention.

In the various embodiments of p-channel MOSFETs illustrated herein, it is possible to have a P-epitaxial drift region that is non-uniformly doped. For example, the doping concentration can be graded to have higher doping at substrate and decreases towards the surface or vice versa depending on the device parameters. One of ordinary skill in the art would recognize many variations, modifications, and alternatives.

Figure 34A:
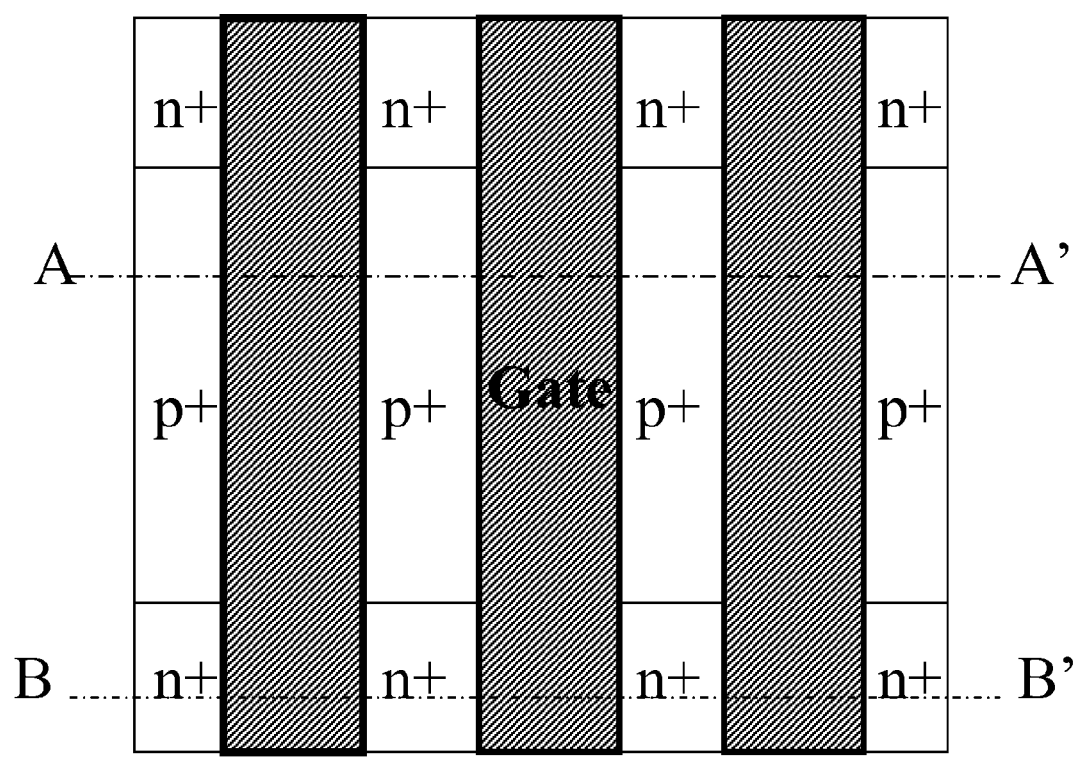
FIG. 34A is a simplified top view illustration of a p-channel power MOSFET structure according to an embodiment of the present invention.
Figure 34B:
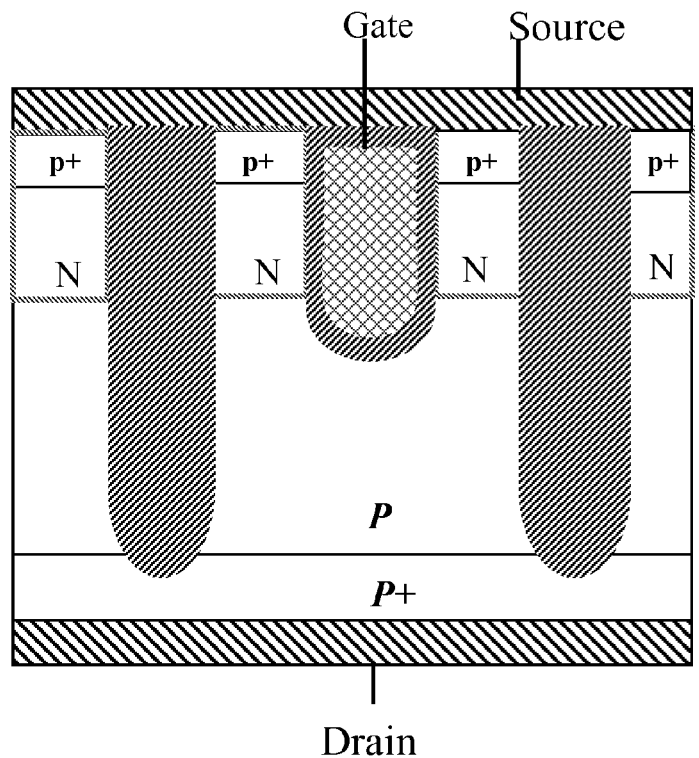
FIG. 34B is a simplified cross-sectional illustration along line AA' of FIG. 34A.
Figure 34C:
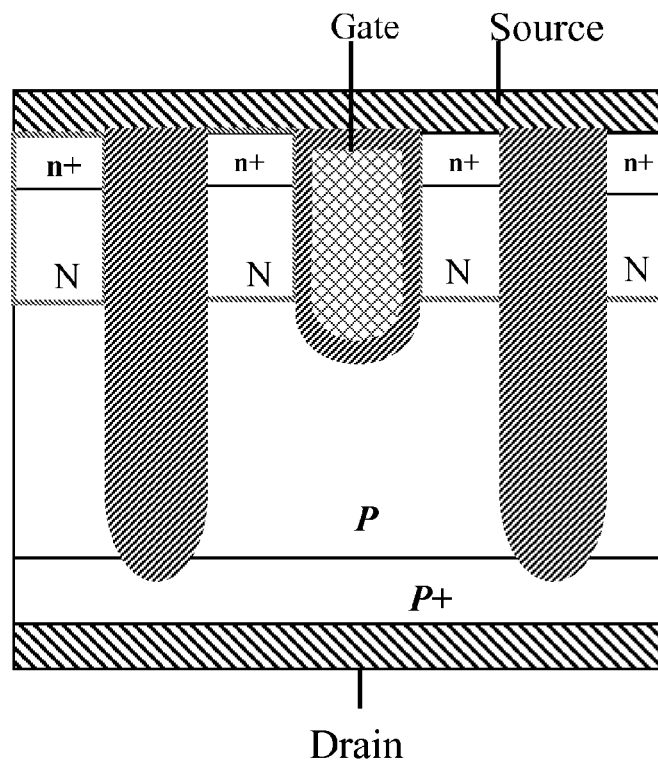
FIG. 34C is a simplified cross-sectional illustration along line BB' of FIG. 34A.

FIG. 34A is a simplified top view illustration of a p-channel power MOSFET structure according to an embodiment of the present invention. FIGS. 34B and 34C are simplified cross-sectional illustrations along lines AA' and BB' of FIG. 34A, respectively.

Figure 35:
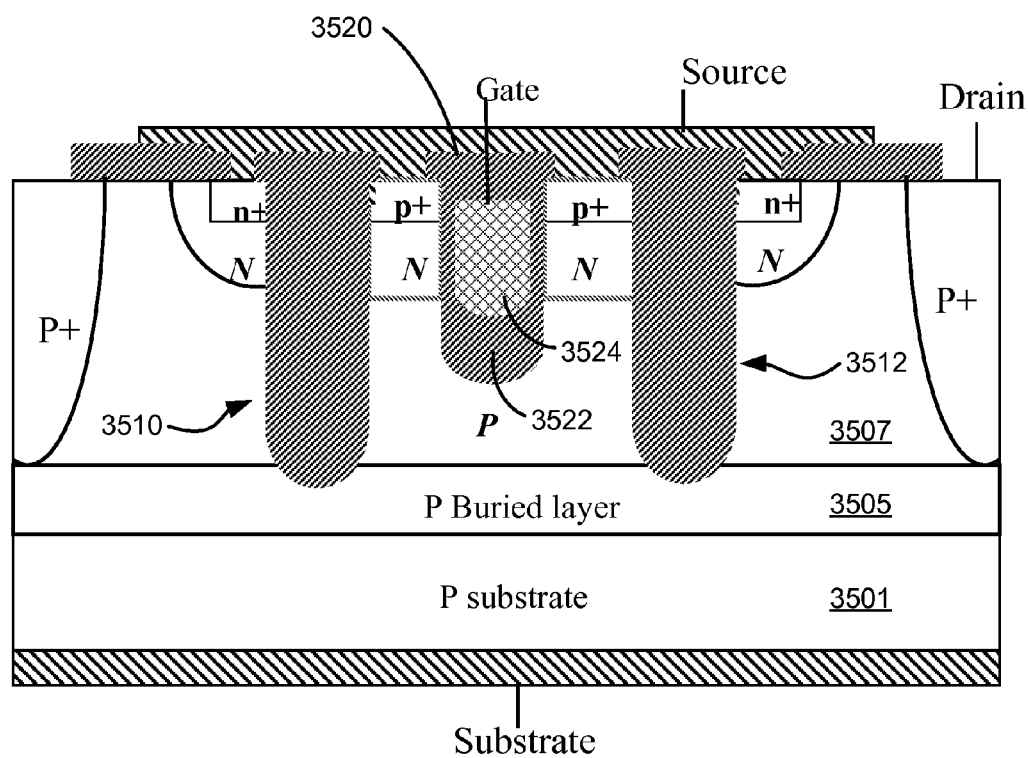
FIG. 35 is a simplified illustration of a single cell of a quasi-vertical p-channel power MOSFET configuration with Control Gate and Charge Control trenches according to an embodiment of the present invention.

FIG. 35 is a simplified illustration of a single cell of a quasi-vertical p-channel power MOSFET configuration with Control Gate and Charge Control trenches according to an embodiment of the present invention. As illustrated in FIG. 35, the power MOSFET structures provided by embodiments of the present invention can be implemented in a quasi-vertical configuration. In the on-state, hole current flows from the source through the channel and the p-drift region 3507, p-buried layer 3505 and p+ regions to the drain contact at the surface of the device. For purposes of clarity, only a single cell is shown in FIG. 35, but other structures with multiple parallel cells can also be implemented. One of ordinary skill in the art would recognize many variations, modifications, and alternatives. A deep n-well or n-guard ring and field plating is used for termination.

In the quasi-vertical power MOSFET illustrated in FIG. 35, a p-type substrate 3501 is utilized and CC trenches 3510 and 3512 include a dielectric layer that includes a positive charge. The trench CG 3520 includes polysilicon 3524 and a thicker layer of dielectric 3522 on the bottom of the control gate (CG) trench.

Figure 36A:
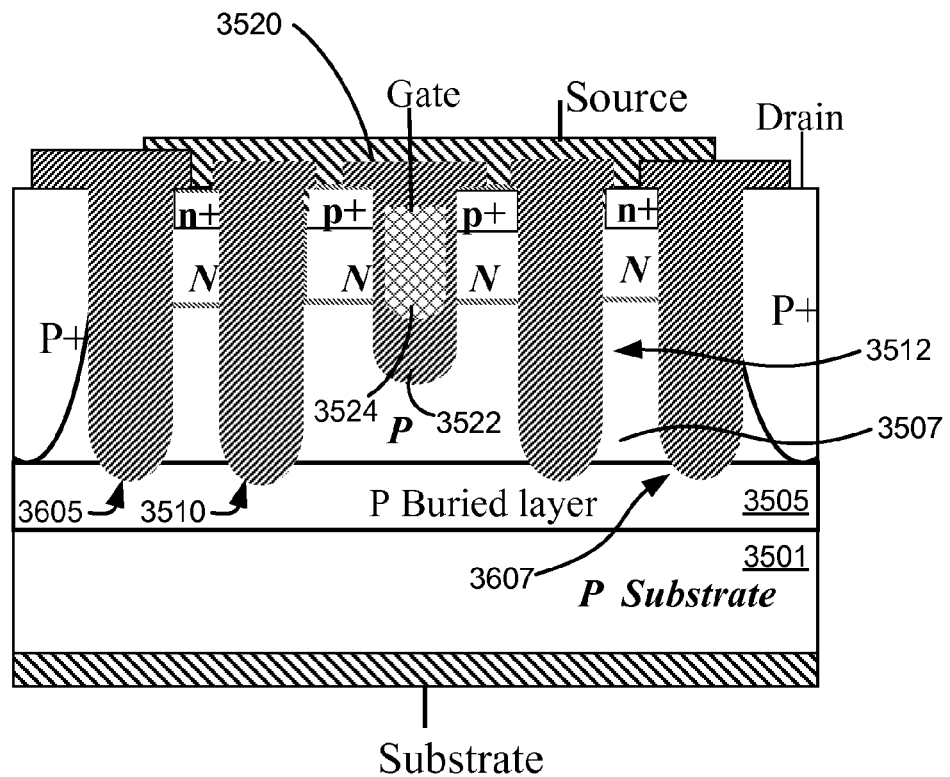
FIG. 36A is a simplified illustration of a single cell of a Quasi vertical p-channel power MOSFET as illustrated in FIG. 35 with termination trenches filled with a dielectric material and a control gate with a thick bottom oxide according to an embodiment of the present invention.

FIG. 36A is a simplified illustration of a single cell of a quasi-vertical p-channel power MOSFET as illustrated in FIG. 35 with termination trenches filled with a dielectric material and a control gate with a thick bottom oxide according to an embodiment of the present invention. The termination trenches 3605 and 3607 are filled with a dielectric material such as silicon oxide. The termination trenches can be of the same or different widths and depths than those of the charge control trenches.

Figure 36B:
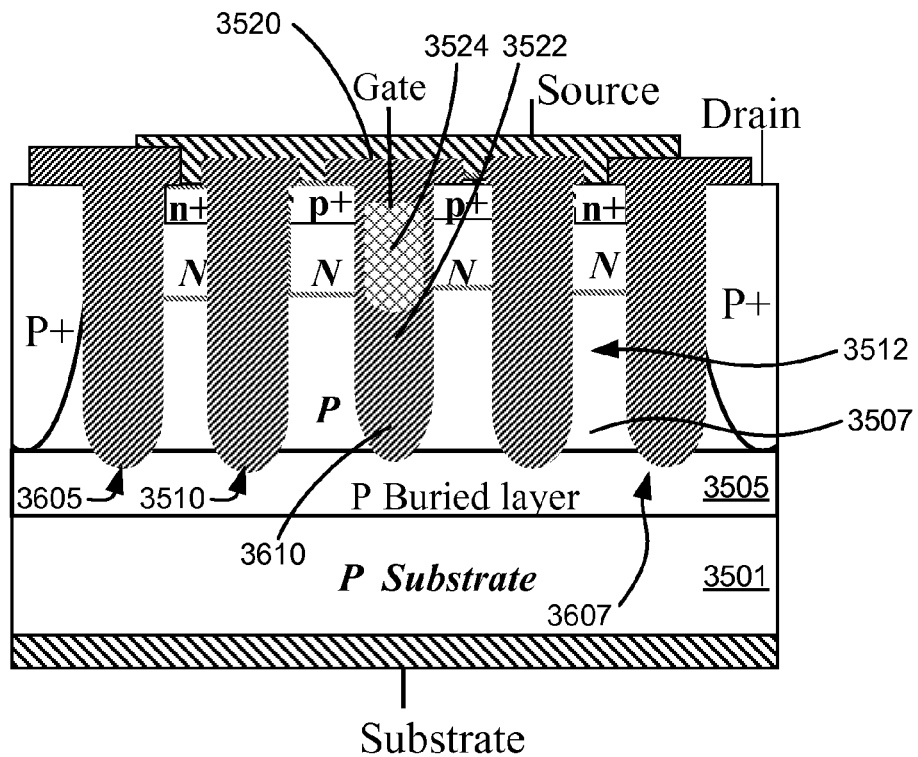
FIG. 36B is a simplified illustration of a single cell of a quasi-vertical p-channel power MOSFET as illustrated in FIG. 35 with termination trenches filled with a dielectric material and all trenches with the same trench depth according to an embodiment of the present invention.

FIG. 36B is a simplified illustration of a single cell of a quasi-vertical p-channel power MOSFET as illustrated in FIG. 35 with termination trenches filled with a dielectric material and all trenches with the same trench depth according to an embodiment of the present invention. As illustrated in FIG. 36B, the bottom 3610 of the trench CG is thicker than the embodiment illustrated in FIG. 36A. Accordingly, the depth of the CC trenches, the trench CG, and the termination trenches are the same in this embodiment. In FIGS. 36A and 36B, only a single cell is shown for purposes of clarity, but other structures with multiple cells can also be implemented.

Figure 37A:
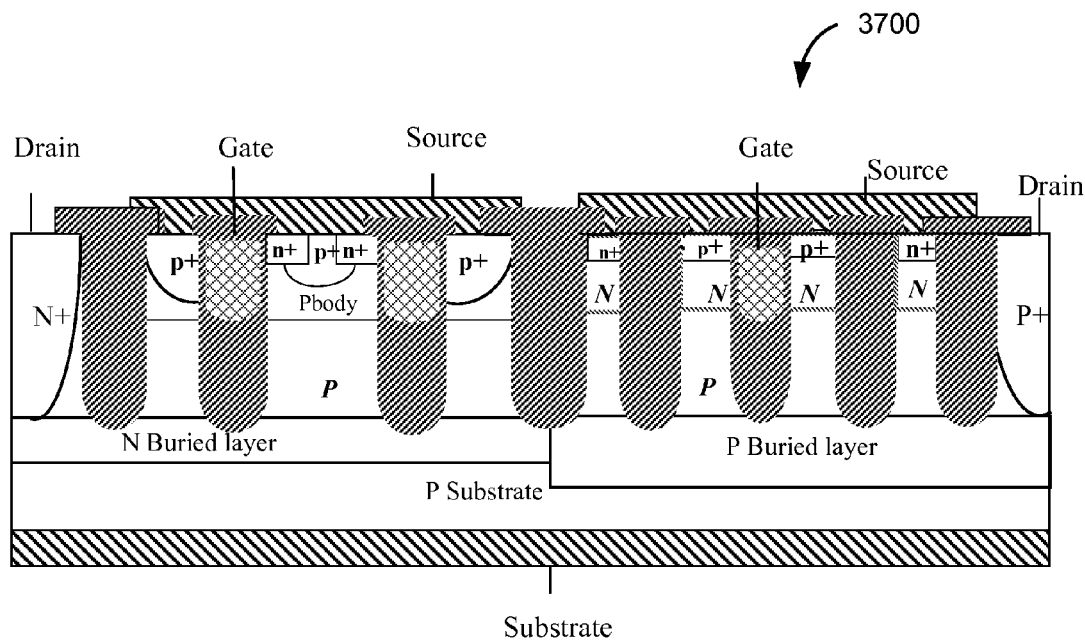
FIG. 37A is a simplified illustration of monolithically integrated n-channel and p-channel power transistors with positive charge in charge control trenches having dielectric layers according to an embodiment of the present invention.

FIG. 37A is a simplified illustration of monolithically integrated n-channel and p-channel power transistors with fixed (e.g., positive) charge in charge control trenches having dielectric layers according to an embodiment of the present invention. As illustrated in FIG. 37A, the quasi-vertical n-channel and p-channel MOSFETs are integrated in the same substrate. Other embodiments include using lateral devices as shown in previous embodiments and described in additional detail throughout the present specification.

For the structures shown in FIG. 37A, the p-type epitaxial layer as well as the CC trenches are identical between p-channel and n-channel MOSFETs. This is one of several advantages provided by embodiments of the present invention in which charge balance is achieved compared to other techniques, as it greatly simplifies fabrication and reduces manufacturing complexity. In other embodiments, the monolithically integrated n-channel and p-channel transistors are integrated monolithically with other active and passive devices such MOS, CMOS, bipolar and JFET transistors, diodes, capacitors, inductors, resistors, combinations thereof, and the like. Additionally, all of the embodiments described herein can be realized in stripe or cellular geometry layout. Furthermore, it will be appreciated that different combinations of the above embodiments may also be realized and are included within the scope of embodiments of the present invention. One of ordinary skill in the art would recognize many variations, modifications, and alternatives.

Figure 37B:
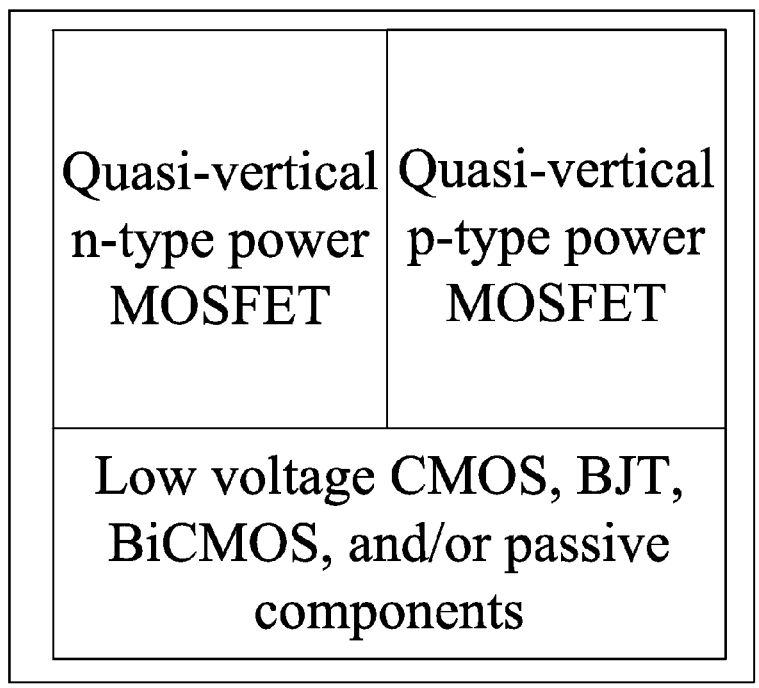
FIG. 37B is a simplified top view block diagram showing integrated n-channel and p-channel power transistors along with low voltage circuitry monolithically integrated in a single die.

Referring to FIG. 37B, a schematic top view is shown depicting the quasi-vertical NMOS and PMOS transistors from FIG. 37A adjacent to a CMOS circuit block. Since a p-type substrate is used, it is possible to integrate the power MOSFETs with many other device structures such as CMOS, BJT, JFET, diodes, capacitors, and the like with less complexity compared to other charge balance methods.

In an embodiment, the charge in a single dielectric layer in a CC trench is equal to the effective doping charge in the p-drift region located in the mesa between CC trenches. In another embodiment, the magnitude of the charge in a single dielectric layer in a CC trench is in the range of 0.5 to 2 times the charge due to the effective doping concentration in the p-drift region in the mesa between the CC trenches. In yet another embodiment, the dielectric charge density per unit area (ion density) ($Q_{fq}$) along the silicon-dielectric interface is in the range of $1 \times 10^{12}$ cm$^{-2}$ to $5 \times 10^{12}$ cm$^{-2}$.

Figure 38A:
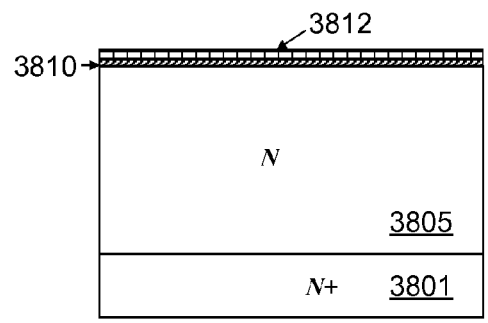
FIGS. 38A-M illustrate a simplified process flow for fabricating a semiconductor device according to an embodiment of the present invention.

FIGS. 38A-M illustrate a simplified process flow for fabricating a semiconductor device according to an embodiment of the present invention. In the following process flow, a method of making an n-channel transistor with a trench CG and CC trenches filled with oxide and compound material to provide negative charge is described. A heavily doped n+ substrate 3801 is provided. The substrate 3801 may be doped with phosphorus, antimony, arsenic, or other suitable n-type dopants. An n-type epitaxial layer 3805 is grown on top of the n+ substrate 3801 as illustrated in FIG. 38A. Next, a thin oxide layer 3810 is grown over the epitaxial layer and a thin silicon nitride layer 3812 is then deposited on top of the oxide layer. In a specific embodiment, the oxide layer 3810 is 30 nm thick and the silicon nitride layer 3812 is 100 nm thick.

Figure 38B:
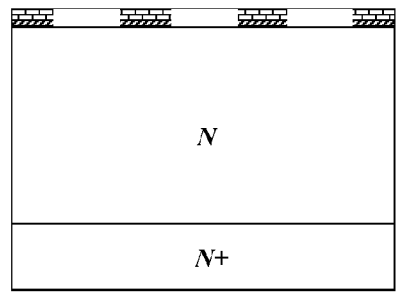
Figure 38C:
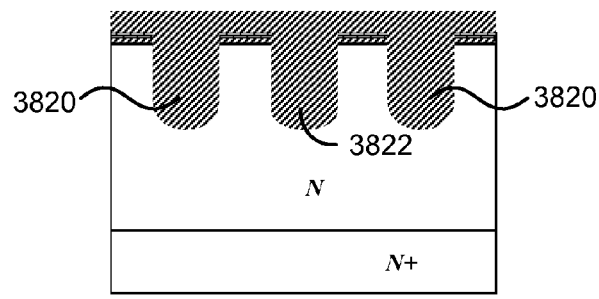

The oxide layer and the silicon nitride layer are masked and etched as shown in FIG. 38B. Although embodiments of the present invention are not limited by the use of photoresist mask, this is one possible masking layer used in some embodiments. The CC trench 3820 and the trench CG 3822 are then etched as shown in FIG. 38C, using the oxide/nitride multilayer mask previously fabricated. After the etch step, a thin thermal oxide layer (not shown) is then grown. For example, the thin oxide layer may be 30 nm thick. Both the CC trenches and the trench CG are then filled with a deposited dielectric material 3824, such as silicon dioxide formed using either a low temperature oxide growth process, a TEOS process, or other suitable dielectric formation process.

Figure 38D:
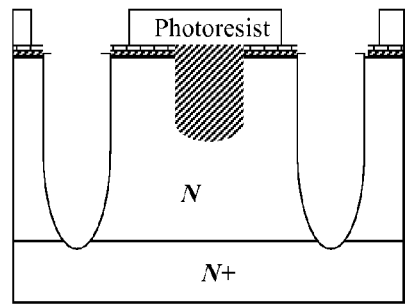

FIG. 38D illustrates the removal of the oxide formed on the upper surface of the device. The removal of the oxide on the upper surface of the device may be performed using an etch back process, a dry plasma etch, a CMP process, combinations thereof, or the like. After oxide removal, the silicon nitride layer 3812 is once again exposed. For devices having different CG and CC trench depths, the oxide in the CC trenches is then etched using a masking layer (e.g., a photoresist mask). Typically, etching of the CC trenches is performed using a dry plasma etching technique to produce the structure illustrated in FIG. 38D.

Figure 38E:
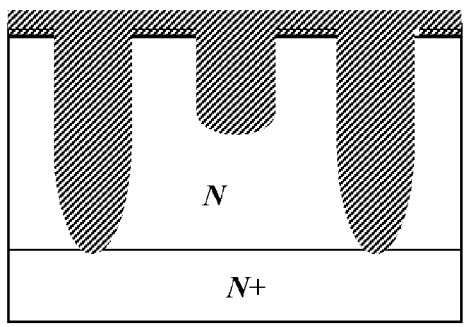
Figure 38F:
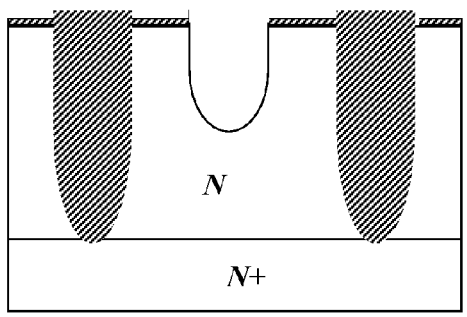

The masking layer (e.g., photoresist) is removed, a thin thermal oxide (not shown) is grown and then another dielectric layer such as oxide is deposited to fill the CC trenches as shown in FIG. 38E. To form the structure illustrated in FIG. 38F, the surface oxide is etched down to the level of the silicon nitride and the dielectric (e.g., oxide) in the trench CG is then removed using an etching process.

Figure 38G:
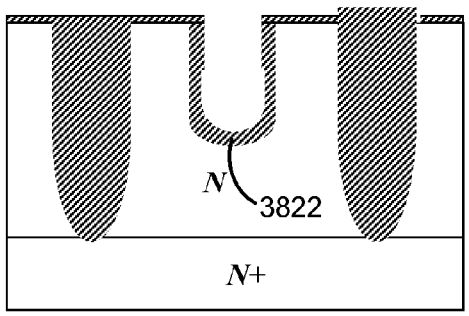
Figure 38H:
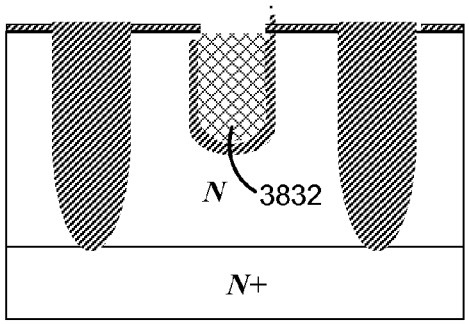

A thermal gate oxide 3822 is grown in the trench CG and on the upper surface of the device as shown in FIG. 38G. In order to form the trench CG, polysilicon 3832 is then deposited and is doped using an n-type doping process such as phosphorus doping and etched back to the level or below that of the gate oxide by an etching process such as plasma dry etching, by the use of CMP techniques, by a combination of the two or by other processes. The structure at this stage of fabrication is illustrated in FIG. 38H.

Figure 38I:
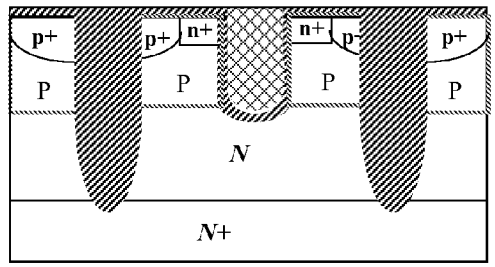

Several masking steps are then performed to implant the p-body and p+ layers using p-type doping such as boron, the n+ source using arsenic, antimony, phosphorus, or a combination thereof as shown in FIG. 38I. Additionally, a deep p+ layer may also be implanted as one of these processing steps. Various masking, implantation, annealing, and other processing steps used to form the diffused junctions illustrated in FIG. 38I are not illustrated for purposes of clarity. One of ordinary skill in the art would recognize many variations, modifications, and alternatives.

Figure 38J:
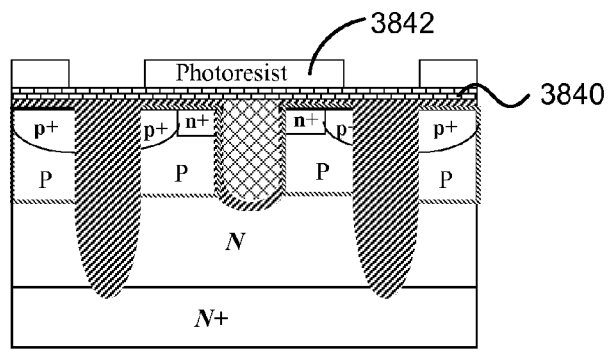
Figure 38K:
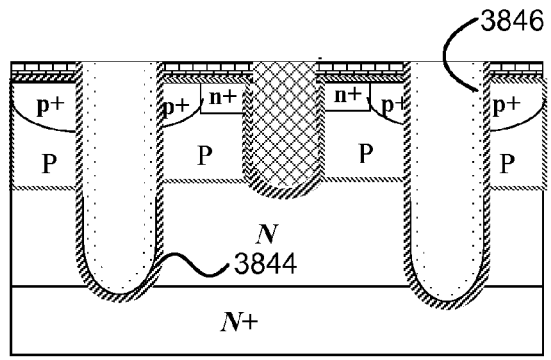
Figure 38L:
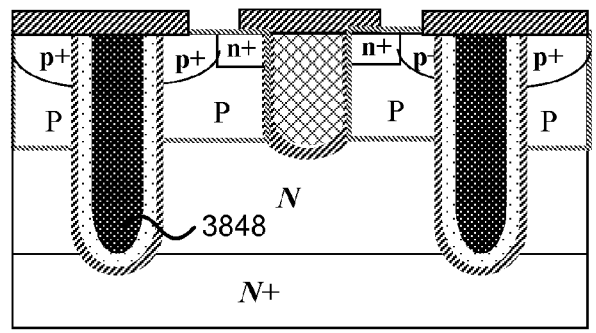
Figure 38M:
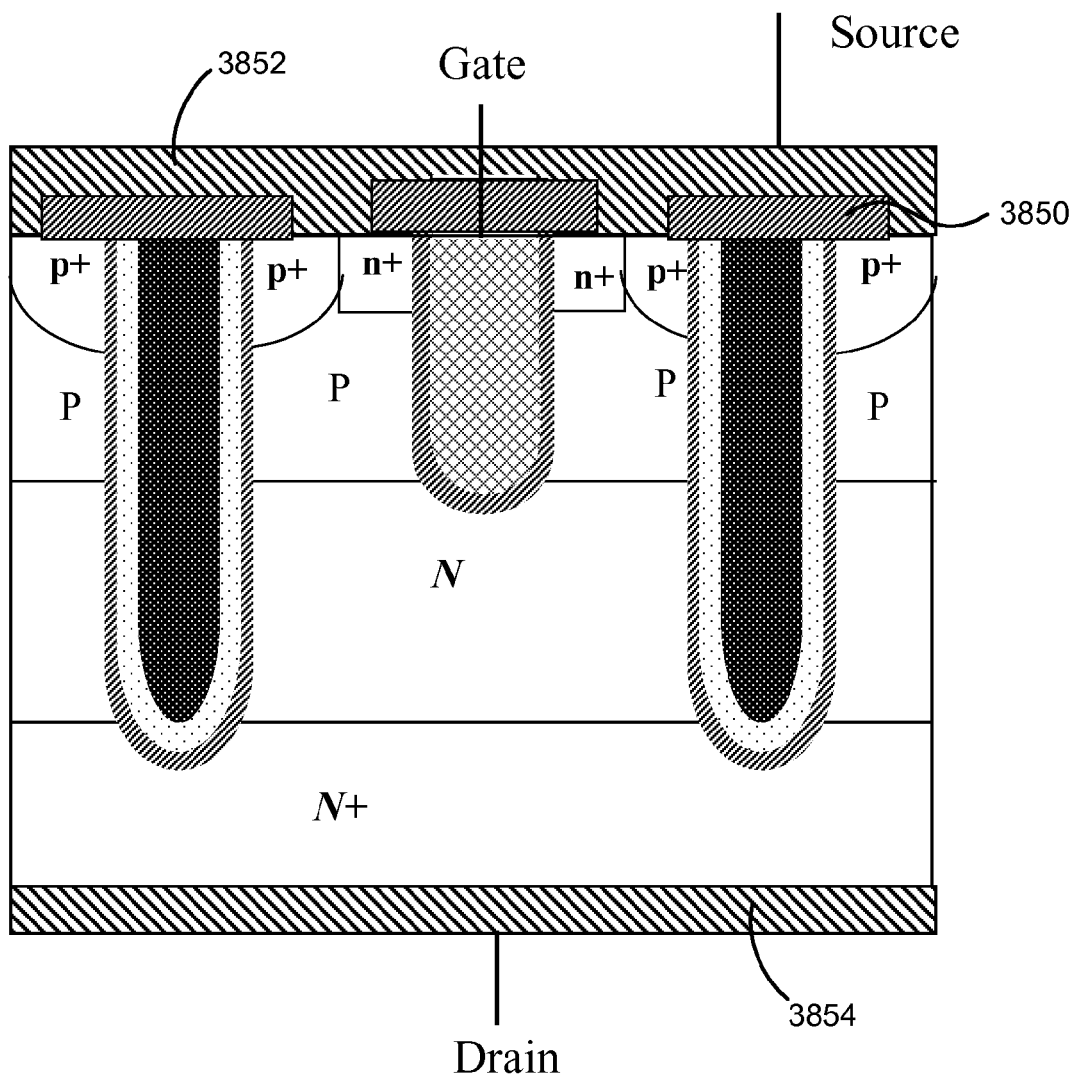

In order to provide for electrical contact regions, the insulating layers formed on portions of the upper surface of the device are removed, typically by use of an etching process, an oxide layer 3850 is deposited, the oxide layer 3850 is patterned, and contact metallization 3852 and 3854 is formed after lapping to complete the device fabrication process. The resulting device is shown in FIG. 38M.

An alternative method can be used to introduce the negative charge into the CC trench instead of implanting negative ions. Following the steps shown in FIG. 38I an optional protective layer 3840 is then deposited (e.g., silicon nitride) and another masking layer 3842 is patterned as illustrated in FIG. 38J. In the embodiment illustrated in FIG. 38J, the masking layer is photoresist although this is not required by embodiments of the present invention. The masking layer 3742 is used during the removal of the dielectric (e.g., oxide) present in the CC trenches as shown in FIG. 38K. A thin oxide 3844 is grown in the CC trenches and then a compound material 3846 such aluminum fluoride (AlF$_3$ or AlF$_x$) is deposited in the CC trenches. At this stage of processing, one embodiment features the growth of a thin layer of the compound material 3846. Another embodiment (not shown) features the complete filling of the CC trench with the compound material. As illustrated in FIG. 38L, one embodiment fills the CC trench with a second dielectric material 3848.

It should be appreciated that the specific steps illustrated in FIGS. 38A-M provide a particular method of fabricating a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIGS. 38A-M may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 38N:
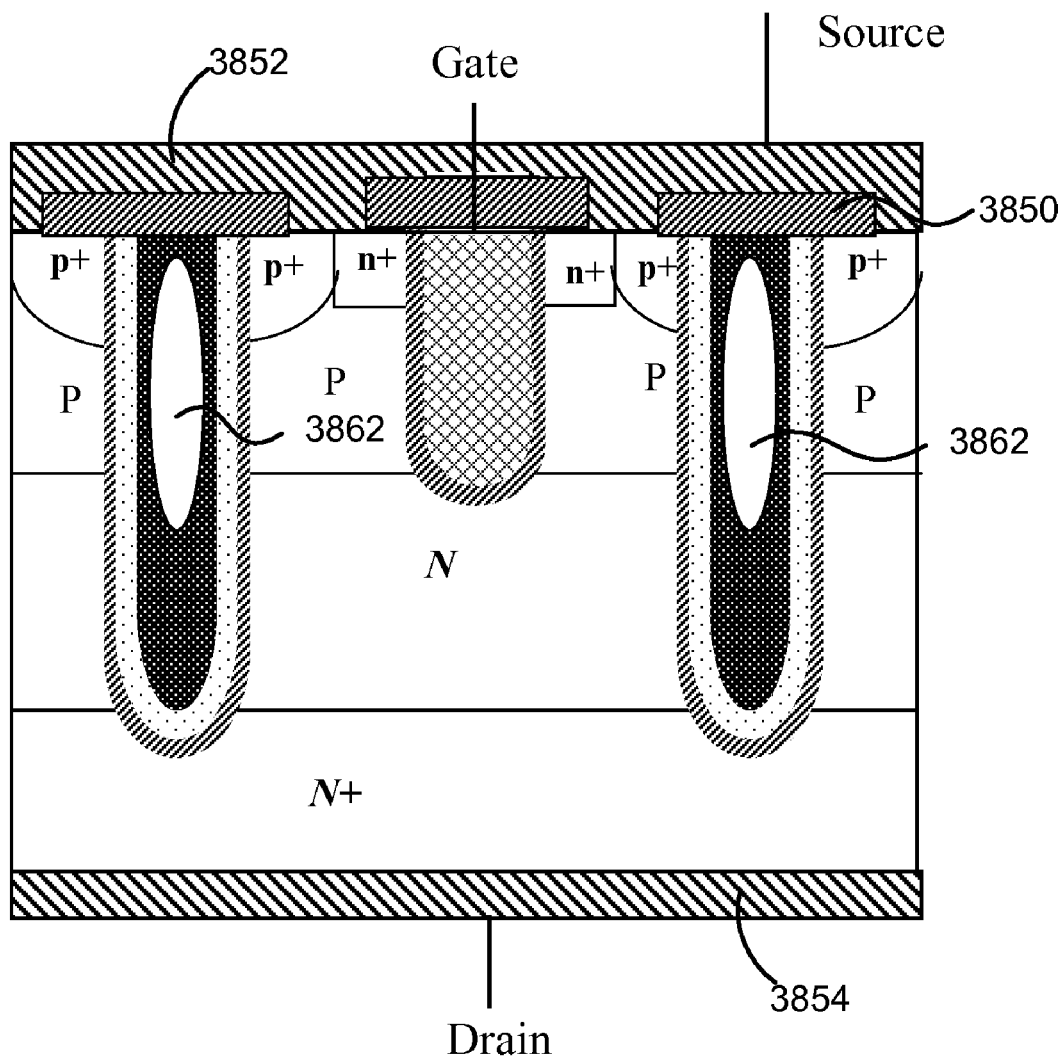
FIG. 38N is a simplified illustration of a device fabricated according to the process flow of FIGS. 38A-M including a void according to an embodiment of the present invention.

FIG. 38N is a simplified illustration of a device fabricated according to the process flow of FIGS. 38A-M including a void according to an embodiment of the present invention. As illustrated in FIG. 38N, a void 3862 is formed in each of the CC trenches during device fabrication. As an example of a process flow that would form the voids illustrated in FIG. 38N, the voids could be formed after step 38K as the dielectric layer 3848 is deposited as illustrated in FIG. 38L.

The void 3862, which may occur during dielectric formation processes in high aspect ratio trenches, provides for an additional dielectric material (e.g., air or an inert environment) interior to the dielectric materials illustrated in the CC trenches. In some embodiments, the one or more voids formed in the CC trench are intentionally introduced, whereas in other embodiments, they are a byproduct of the deposition process utilized during device fabrication. The depth and width of the void will depend on the particular process flows utilized during device fabrication. Although a single void is illustrated in FIG. 38N, this is not required by embodiments of the present invention, as multiple voids may be utilized in other embodiments. Additionally, although voids 3862 are illustrated as completely encapsulated by the dielectric layers provided in the CC trenches, this is not required by embodiments of the present invention. One of ordinary skill in the art would recognize many variations, modifications, and alternatives.

Figure 39A:
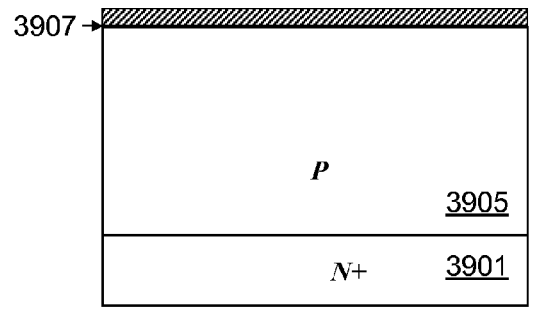
FIGS. 39A-I illustrate a simplified process flow for fabricating a semiconductor device according to another embodiment of the present invention.

According to another embodiment, a method of fabricating an n-channel transistor with a CG trench and CC trenches filled with oxide having a positive charge is provided. Steps of the method are illustrated in FIGS. 39A-H, which illustrate a process flow for the fabrication process. Starting with a substrate 3901, typically a heavily doped n-type (n+) silicon substrate, one or more epitaxial layers are grown on the substrate. In some embodiments, an n-type layer (not shown) (typically doped with phosphorus, antimony, arsenic, or the like) and a p-type layer 3905 (typically doped with boron or other suitable materials) are epitaxially grown. As illustrated in FIG. 39A, other embodiments utilize only a p-type layer grown on the n+ substrate. One of ordinary skill in the art would recognize many variations, modifications, and alternatives.

Figure 39B:
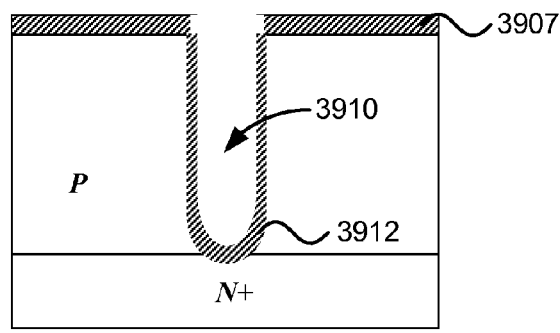

Referring to FIG. 39A, a thin insulating layer 3907 is grown over the epitaxial layer 3905. Typically, the thin insulating layer 3907 is a silicon oxide layer that is formed by a thermal growth process, a deposition process, or other suitable insulator formation processes. The surface of the device is masked and a trench 3910 is etched as shown in FIG. 39B. As will be evident to one of skill in the art, trenches are etched for multiple devices concurrently. Thus, although only a single trench is illustrated in FIG. 39B, it will be apparent that this figure illustrates only a portion of the substrate being processed. A thin thermal oxide layer 3912 (e.g., 50 nm thick) is then grown, forming an oxide layer in the trench.

Figure 39C:
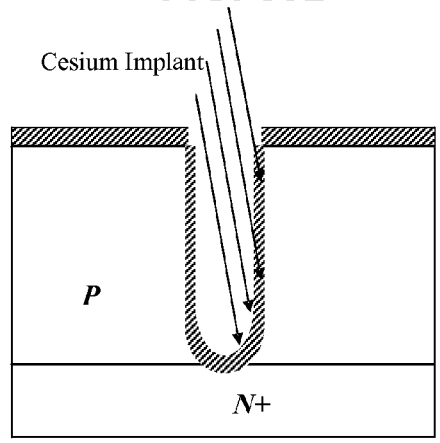
Figure 39D:
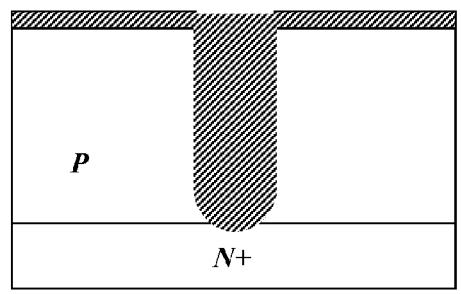

In order to introduce fixed positive charges into the thermal oxide layer 3912 an ion-implantation process is utilized as illustrated in FIG. 39C. Suitable ions, such as cesium or potassium are implanted at a predetermined energy for a predetermined time. Depending on the application, the implant dose is selected to provide adequate charge balance to the negative charge in the mesa. As shown in FIG. 39C, an angle implant may be used depending on the trench width and depth. After the implantation process, the trench is filled with a deposited oxide and etched back as shown in FIG. 39D. For example, a low temperature oxide or a TEOS deposition process can be used to completely fill the trench. In some embodiments, an etch back is used to planarize the surface after the oxide trench fill step. As discussed throughout the present specification, multiple dielectric layers may be used to form the dielectric trench fill layer illustrated in FIG. 39D. Thus, the deposited oxide illustrated here may be replaced with an oxide/nitride/oxide multilayer structure or other multilayer structures utilizing other dielectric materials. One of ordinary skill in the art would recognize many variations, modifications, and alternatives.

As an alternative to the process illustrated in FIGS. 39C and 39D, a process can be performed to implant cesium ions inside the trench after the trench fill with dielectric using lithography processes. The implantation of the cesium or other positive ions into the insulating layer 3912 provides for a fixed positive charge at the interface of the trench 3910 and the p-type region adjacent the trench. As a result of the fixed positive charge, at zero bias, the dielectric layer's fixed positive charge is partially balanced by the charge of an inversion layer that forms at the silicon-dielectric layer interface. The positive charge in the dielectric layer is preferably located at or close to the silicon-dielectric interface for maximum effectiveness. While the interface between the trench and the p-type region is referred to, it is known that the interface region is not distinct so the interfacial charge, while generally in the oxide, may extend somewhat into the semiconductor material as well.

Figure 39E:
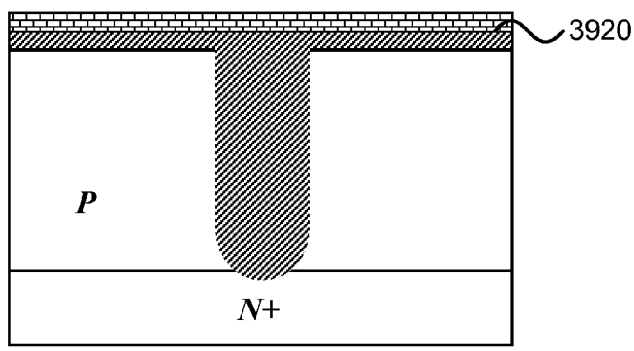
Figure 39F:
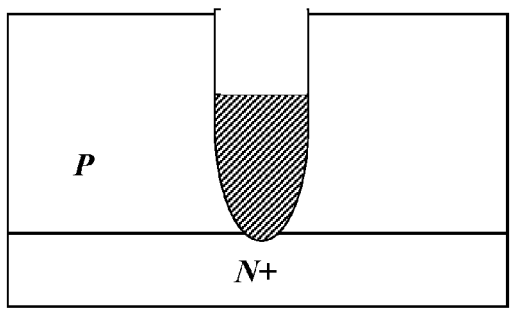

In embodiments utilizing an annealing process to drive the implanted ions (e.g., cesium) into the oxide layer 3912, a deposited layer 3920 (e.g., silicon nitride or polysilicon) is used to cap the oxide layer 3912 in the trench prior to a thermal annealing process. Such a process is illustrated in FIG. 39E. Referring to FIG. 39F, the cap layer 3920 and the surface oxide 3912 are removed to expose a portion of the oxide layer filling the trench and provide a cavity in which the control gate (CG) may be fabricated.

Figure 39G:
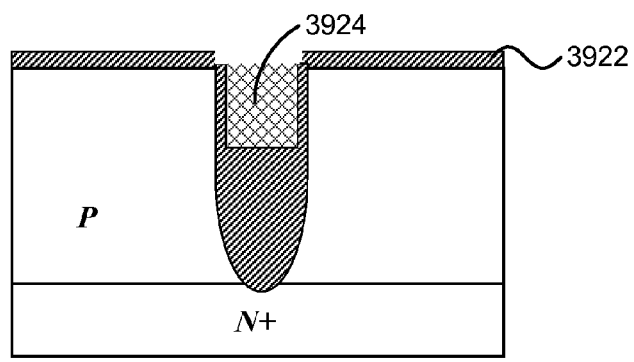
Figure 39H:
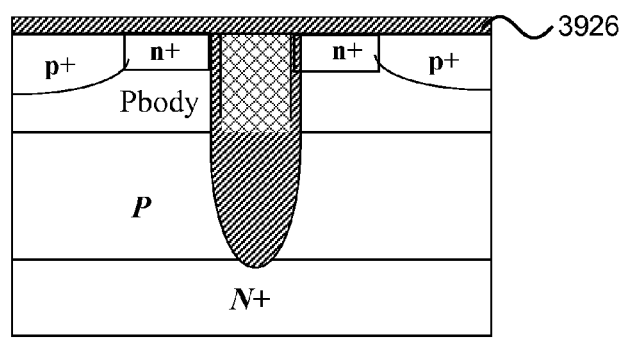
Figure 39I:
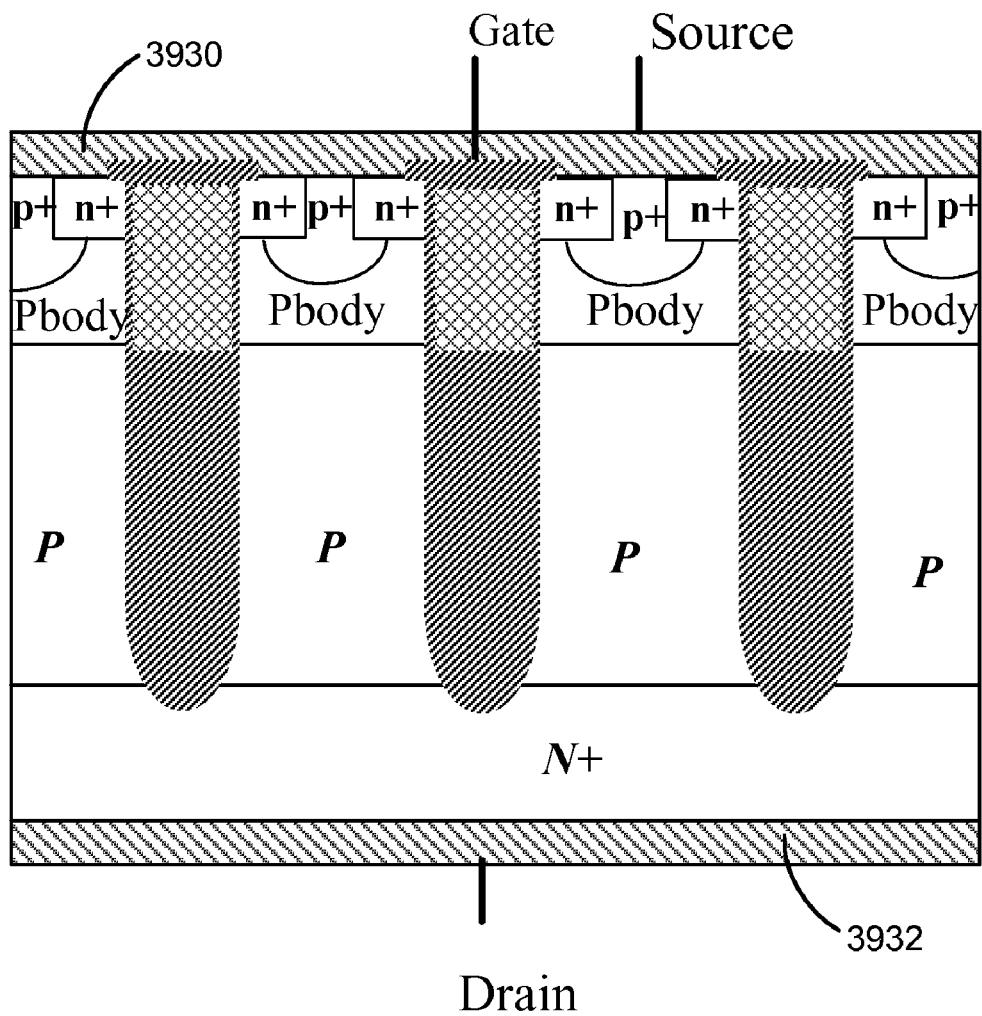

A gate oxide 3922 is formed, typically through a thermal growth process. The thickness of the gate oxide typically ranges from about 2 nm to about 200 nm. In a particular embodiment, the thickness of the gate oxide is about 30 nm. In order to form the CG, polysilicon 3924 is then deposited, doped and etched back as shown in FIG. 39G. Referring to FIG. 39H, several masking steps are illustrated in which, through implantation, anneal, diffusion, and other processing steps, the p-body, p+ layers, and n+ layers are formed. In some embodiments, p-type doping is provided by using boron, n-type doping for the n+ source region is provided by using arsenic, phosphorus, antimony, or a combination thereof. Additionally, a deep p+ layer may also be implanted as one of these processing steps. An oxide layer 3926 is deposited to provide an insulating layer on top of the polysilicon layer 3924. The oxide is patterned as illustrated in FIG. 39I and one or more metal layer 3930 is deposited and defined by one or more photoresist masks. The back side of the substrate is thinned (not shown) and backside metal 3932 is deposited (not shown) to form contacts for the drain. As shown in FIG. 39I, multiple trenches are typically utilized for the semiconductor device. The particular number of trenches will depend on the particular applications.

It should be appreciated that the specific steps illustrated in FIGS. 39A-I provide a particular method of fabricating a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIGS. 39A-I may include multiple sub-steps that may be performed in various sequences as appropriate to the individual step. Furthermore, additional steps may be added or removed depending on the particular applications. One of ordinary skill in the art would recognize many variations, modifications, and alternatives.

FIGS. 40A-I illustrate a simplified process flow for fabricating a semiconductor device according to yet another embodiment of the present invention. In the embodiment illustrated in these figures, an n-channel transistor with a CG and a CC fabricated in the same trench includes an oxide having a negative charge. Steps of the method of fabricating this transistor are illustrated in FIGS. 40A-I, which illustrate a process flow for the fabrication process. Starting with a substrate 4001, typically a heavily doped n-type (n+) silicon substrate, one or more epitaxial layers are grown on the substrate. In some embodiments, an n-type layer 4005 (typically doped with phosphorus, arsenic, or antimony) is epitaxially grown. One of ordinary skill in the art would recognize many variations, modifications, and alternatives.

Figure 40A:
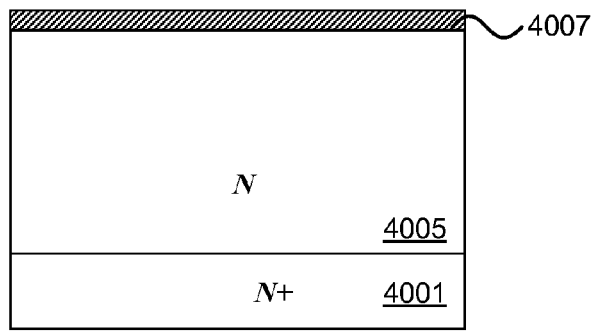
FIGS. 40A-I illustrate a simplified process flow for fabricating a semiconductor device according to yet another embodiment of the present invention.
Figure 40B:
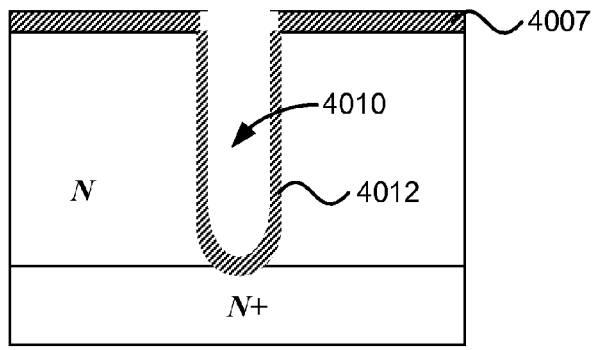

Referring to FIG. 40A, a thin insulating layer 4007 is grown over the epitaxial layer 4005. Typically, the thin insulating layer 4007 is a silicon oxide layer that is formed by a thermal growth process, a deposition process, or other suitable insulator formation processes. The surface of the device is masked and a trench 4010 is etched as shown in FIG. 40B. As will be evident to one of skill in the art, trenches are etched for multiple devices concurrently. Thus, although only a single trench is illustrated in FIG. 40B, it will be apparent that this figure illustrates only a portion of the substrate being processed. A thin thermal oxide layer 4012 (e.g., 100 nm thick) is then grown, forming an oxide layer in the trench.

Figure 40C:
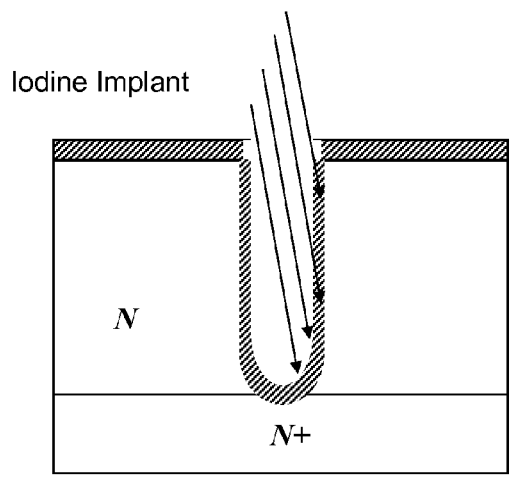
Figure 40D:
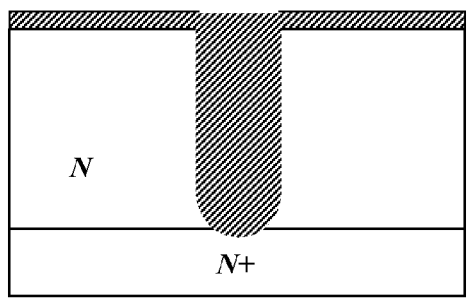

In order to introduce fixed negative charges into the thermal oxide layer 4012 an ion-implantation process is utilized as illustrated in FIG. 40C. Suitable ions, such as chromium, aluminum, bromine, or chlorine, are implanted at a predetermined energy for a predetermined time. Depending on the application, the implant dose is selected to provide adequate charge balance to the positive charge in the mesa. As shown in FIG. 40C, an angle implant may be used depending on the trench width and depth. After the implantation process, the trench is filled with a deposited oxide and etched back as shown in FIG. 40D. For example, a low temperature oxide or a TEOS deposition process can be used to completely fill the trench. In some embodiments, an etch back is used to planarize the surface after the oxide trench fill step. As an alternative to the process illustrated in FIGS. 40C and 40D, a process can be performed to implant iodine, bromine, chromium, aluminum, or chlorine ions inside the trench after the trench fill with dielectric using lithography processes. The implantation of the iodine, bromine, chromium, aluminum, chlorine, or similar ions into the insulating layer 4012 provides for a fixed negative charge at the interface of the trench 4010 and the n-type region adjacent the trench. As a result of the fixed negative charge in the trench, at zero bias, the dielectric layer's fixed negative charge is partially balanced by the charge of an inversion layer that forms at the silicon-dielectric layer interface. The charge in the dielectric layer is preferably located at or close to the silicon-dielectric interface for maximum effectiveness.

Figure 40E:
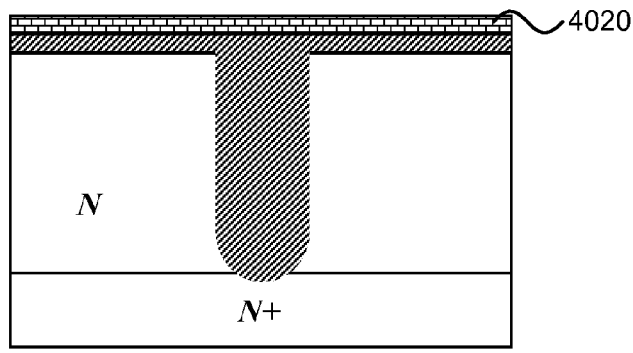
Figure 40F:
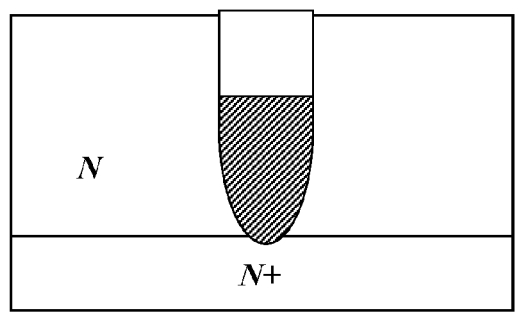

In embodiments utilizing an annealing process to drive the implanted ions (e.g., iodine, bromine, chromium, aluminum, or chlorine) into the oxide layer 4012, a deposited layer 4020 (e.g., silicon nitride, polysilicon, or the like) is used to cap the oxide layer 4012 in the trench prior to a thermal annealing process. Such a process is illustrated in FIG. 40E. Referring to FIG. 40F, the cap layer 4020 and the surface oxide 4012 are removed to expose a portion of the oxide layer filling the trench and provide a cavity in which the control gate (CG) may be fabricated.

Figure 40G:
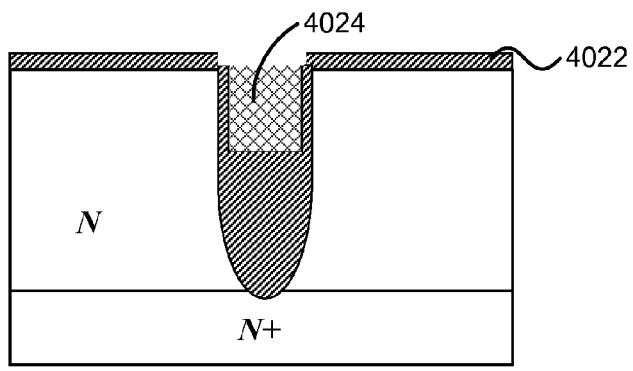
Figure 40H:
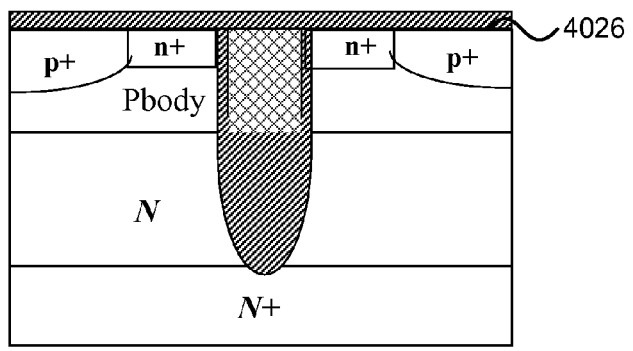
Figure 40I:
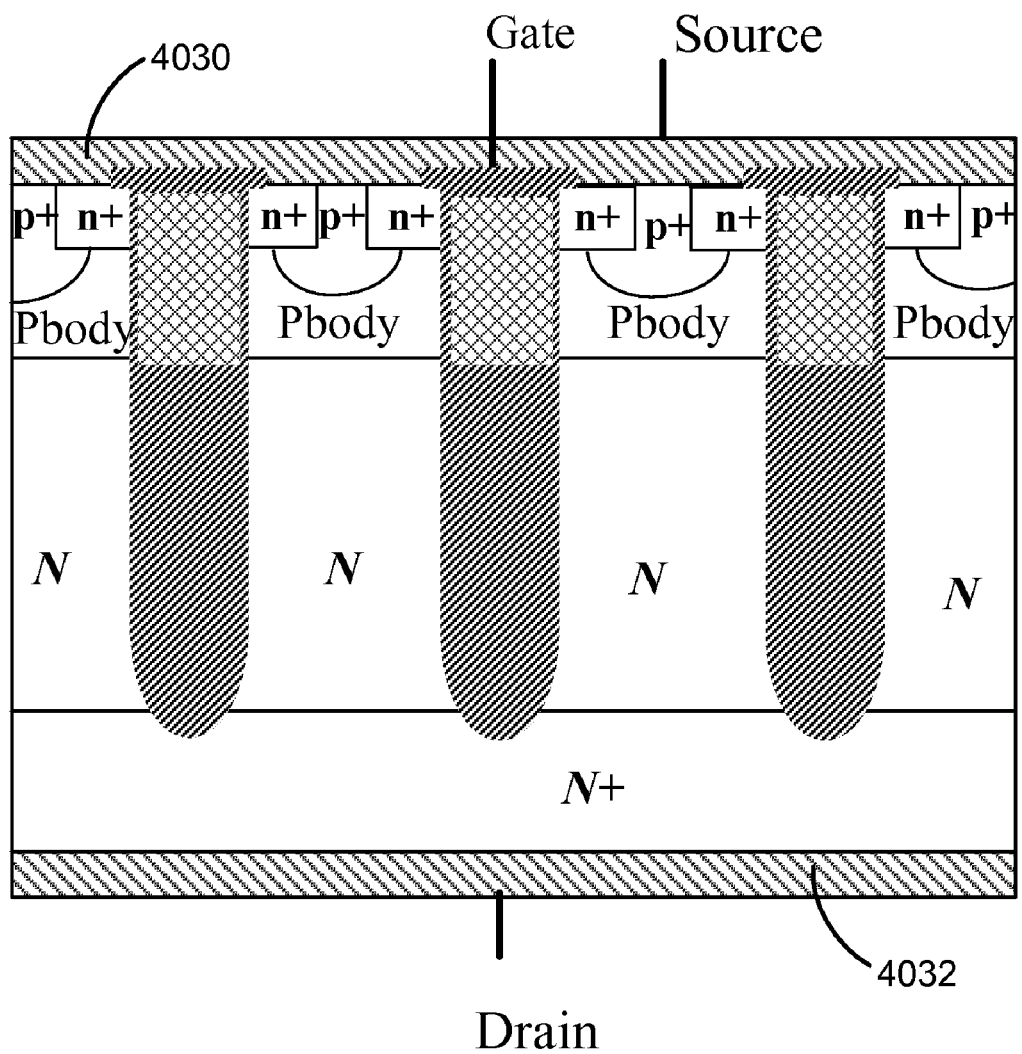

A gate oxide 4022 is deposited, typically through a thermal growth process. The thickness of the gate oxide typically ranges from about 2 nm to about 200 nm. In a particular embodiment, the thickness of the gate oxide is about 50 nm. In order to form the CG, polysilicon 4024 is then deposited, doped and etched back as shown in FIG. 40G. Referring to FIG. 40H, several masking steps are illustrated in which, through implantation, anneal, diffusion, and other processing steps, the p-body, p+ layers, and n+ layers are formed. In some embodiments, p-type doping is provided by using boron, n-type doping for the n+ source region is provided by using arsenic, phosphorus, antimony, or a combination thereof. Additionally, a deep p+ layer may also be implanted as one of these processing steps. An oxide layer 4026 is deposited to provide an insulating layer on top of the polysilicon layer 4024. The oxide is patterned as illustrated in FIG. 40I and one or more metal layer 4030 is deposited and defined by one or more photoresist masks. The back side of the substrate is thinned (not shown) and backside metal 4032 is deposited (not shown) to form contacts for the drain. As shown in FIG. 40I, multiple trenches are typically utilized for the semiconductor device. The particular number of trenches will depend on the particular applications.

It should be appreciated that the specific steps illustrated in FIGS. 40A-I provide a particular method of fabricating a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIGS. 40A-I may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 41A:
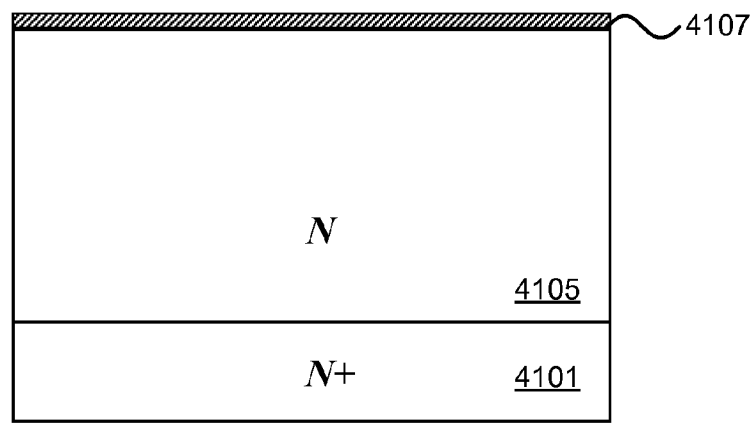
FIGS. 41A-I illustrate a simplified process flow for fabricating a semiconductor device according to an alternative embodiment of the present invention.
Figure 41B:
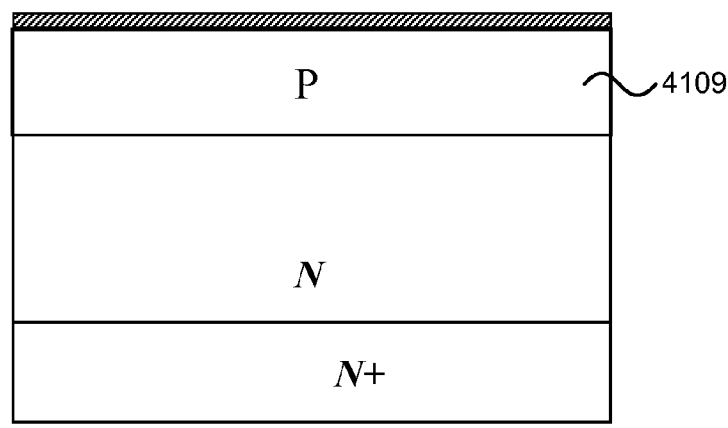
Figure 41C:
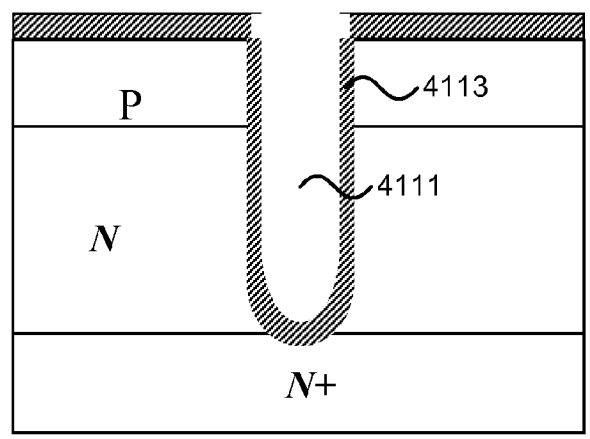
Figure 41D:
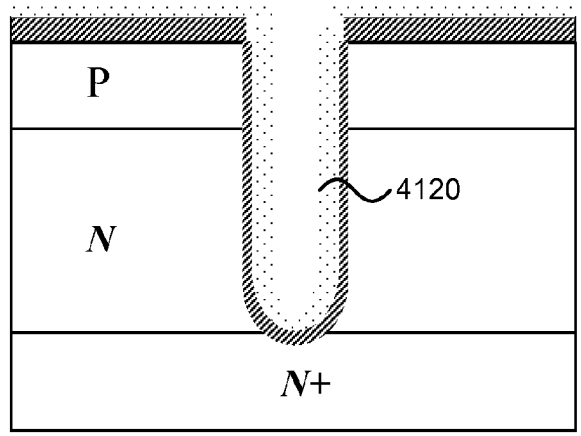
Figure 41E:
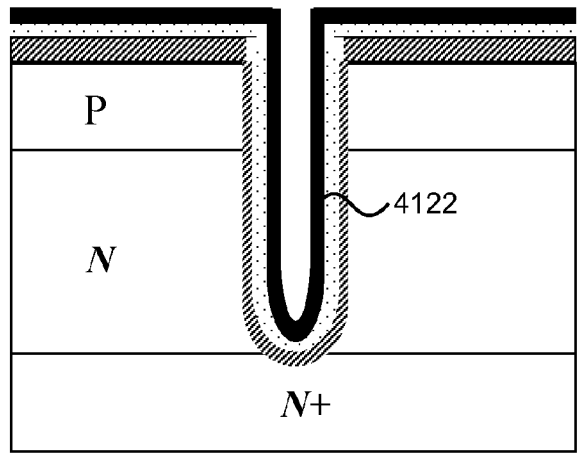
Figure 41F:
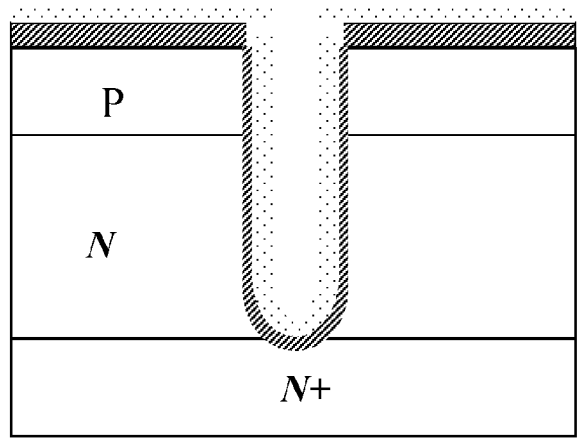
Figure 41G:
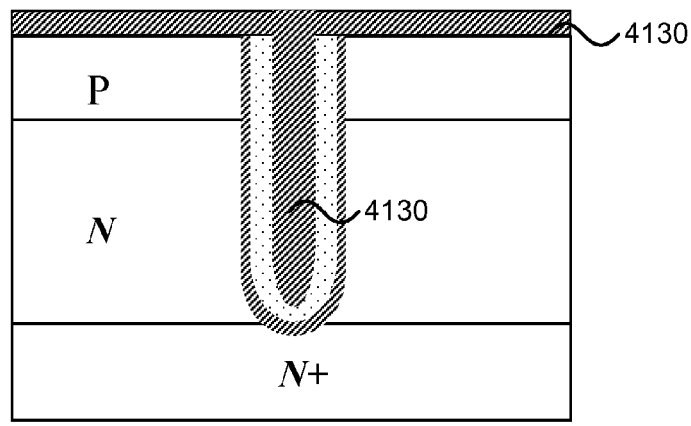
Figure 41H:
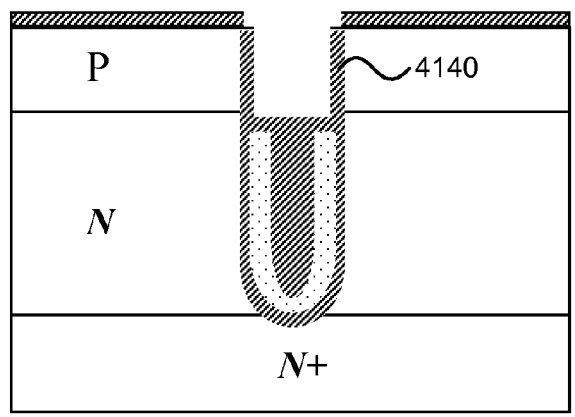
Figure 41I:
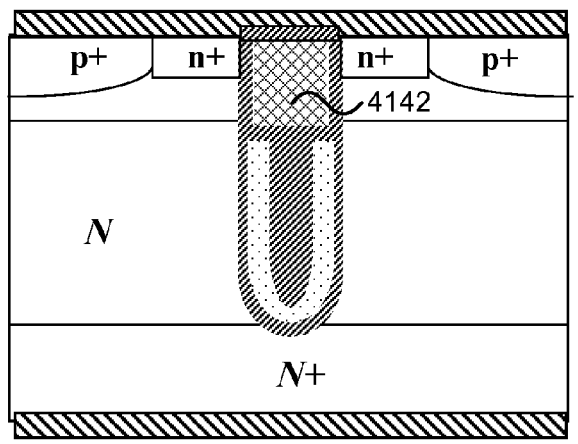

FIGS. 41A-I illustrate a simplified process flow for fabricating a semiconductor device according to an alternative embodiment of the present invention. As illustrated in FIG. 41I, this alternative embodiment provides a method of fabricating an n-channel transistor with a CG and a CC in the same trench. Starting with a substrate 4101, typically a heavily doped n-type (n+) silicon substrate, one or more epitaxial layers 4105 are grown on the substrate 4101. As illustrated in FIG. 41A, an n-type epitaxial layer 4105 (typically doped with phosphorus, arsenic, antimony, or the like) is grown on the substrate. One of ordinary skill in the art would recognize many variations, modifications, and alternatives.

Referring to FIG. 41A, a thin dielectric layer 4107 is grown over the epitaxial layer 4105. Typically, the thin dielectric layer 4107 is a silicon oxide layer that is formed by a thermal growth process, a deposition process, or other suitable insulator formation processes. In some embodiments, the thin dielectric layer 4107, which is typically a silicon dioxide layer and may be have a thickness of about 30 nm, is referred to as a screen oxide. The p-body layer 4109 is then implanted through the thin dielectric layer 4107 using boron with an implant dose of between about $5 \times 10^{12}$ and $1 \times 10^{14}$ ions/cm$^2$ in a particular embodiment. After implantation, an annealing process is used to drive the implanted ions into the device.

Referring to FIG. 41C, a trench 4111 is etched through the screen oxide, the p-body layer, the n-type epitaxial layer and into the substrate. It will be appreciated that in other embodiments, the depth of the trench 4111 may be varied as appropriate to the particular application. Additionally, as will be evident to one of skill in the art, trenches are etched for multiple devices concurrently. Thus, although only a single trench is illustrated in FIG. 41C, it will be apparent that this figure illustrates only a portion of the substrate being processed. A thin thermal oxide layer 4113 (e.g., 2 nm thick) is then grown, forming an oxide layer in the trench.

In order to introduce fixed negative charges into the trench, a highly-doped insulating layer 4120 is formed in the trench as illustrated in FIG. 41D. In an embodiment, the layer 4120 is formed using boron-doped spin-on-glass (SOG). Generally, the thickness of layer 4120 is about 10 nm. In other designs, other doped materials are used to form the layer 4120 that includes fixed positive charges. A protective layer 4122, for example, aluminum, is deposited on top of layer 4120 and an anneal process is performed. In a particular embodiment, the layer of aluminum is about 200 nm thick and the annealing is performed at a temperature of about 450° C. in a nitrogen environment. Other suitable metals or dielectric materials are utilized in other embodiments. FIG. 41F illustrates a wet etch process in which the protective layer 4122 is removed, exposing the underlying layer of doped SOG.

The trench is filled with dielectric material 4130 as illustrated in FIG. 41G. The dielectric material 4130 may be the same dielectric material used to fabricate layer 4113, such as SOG. In contrast with the doped insulating layer 4120, the dielectric material 4130 is not doped. Additionally, the dielectric material 4130 may be deposited on top of the p-body layer as shown in FIG. 41G. In other embodiments, other dielectric materials are used to fabricate fill and layer 4130, for example, silicon dioxide, silicon nitride, or other suitable materials.

Referring to FIG. 41H, portions of the dielectric layer 4130 along with doped insulating layer 4120 are removed to expose a portion of the dielectric material 4130 filling the trench and provide a cavity in which the control gate (CG) may be fabricated. For example, an etching process may be used to remove portions of the dielectric layer 4130 to a level approximately equal to the thickness of the p-body layer. After the etching process, a new gate oxide is deposited or grown on the interior portions of the trench as shown in FIG. 41H. The gate oxide 4140 may have a thickness ranging from about 2 nm to about 200 nm. In a particular embodiment, the thickness of the gate oxide is about 50 nm. In order to protect underlying layers from dopant migration or other temperature related effects, the gate oxide 4140 is typically formed using a low temperature process, for example a thermal growth temperature of about 850-900° C.

In order to form the CG, polysilicon 4142 is then deposited, doped, and etched back to fill the trench as shown in FIG. 41I. Referring to FIG. 41I, several masking steps are illustrated in which, through implantation, anneal, diffusion, and other processing steps, the various p+ layers and n+ layers are formed. In some embodiments, p-type doping is provided by using boron, n-type doping for the n+ source region is provided by using arsenic, phosphorus, antimony, or a combination thereof. An oxide layer is deposited to provide an insulating layer on top of the polysilicon layer. The oxide is patterned as illustrated in FIG. 41I and one or more metal layers are deposited and defined by one or more photoresist masks. The back side of the substrate is thinned (not shown) and backside metal is deposited (not shown) to form contacts for the drain. In the process illustrated in FIGS. 41H and 41I, low temperature processing is utilized to protect underlying layers from dopant migration or other temperature related effects. Accordingly, the processing steps illustrated in FIG. 41I are performed at temperatures less than or equal to about 850-900° C.

Figure 41J:
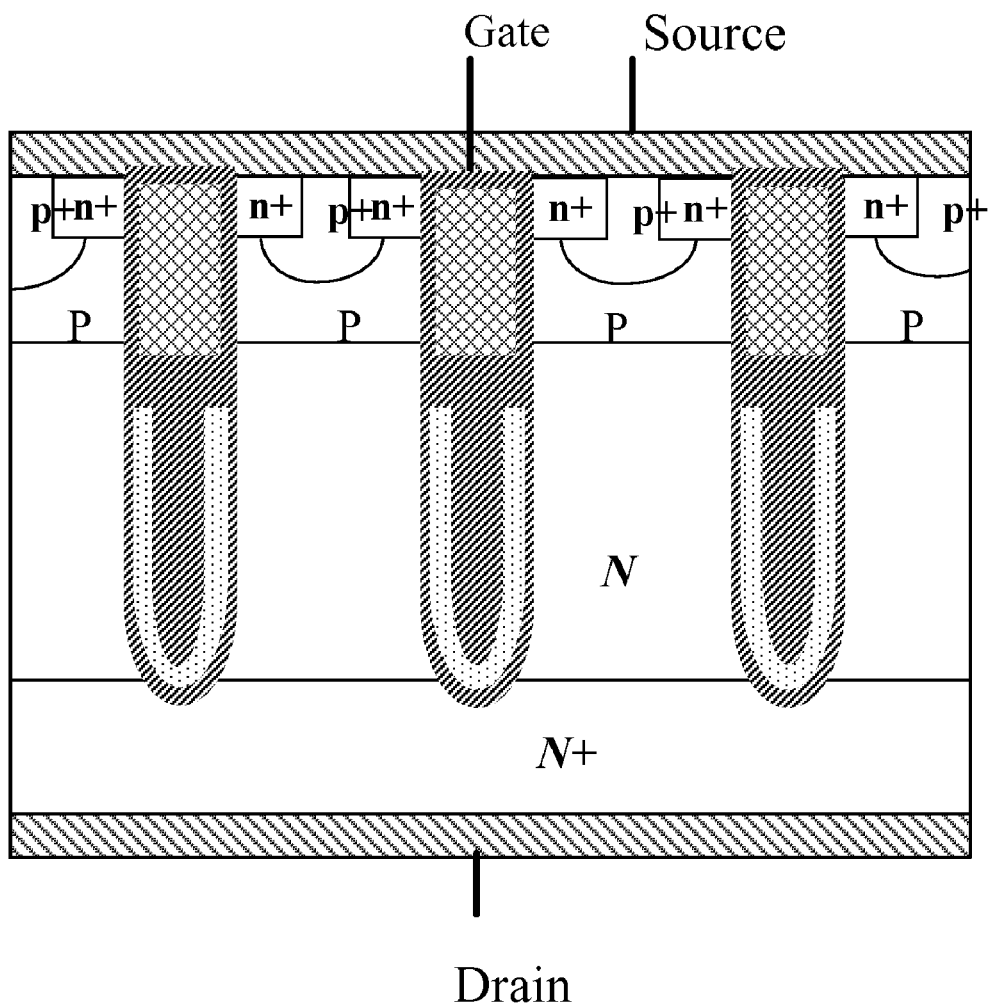
FIG. 41J is a simplified illustration of a semiconductor device fabricated according to the process flow illustrated in FIGS. 41A-I.

FIG. 41J illustrates a set of trench MOS transistors fabricated using the process flow illustrated in FIGS. 41A-I. The CG and the CC are provided in the same trench, with a fixed negative charge contained in the doped dielectric layer 4120. It should be appreciated that the specific steps illustrated in FIGS. 41A-I provide a particular method of fabricating a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIGS. 41A-I may include multiple sub-steps that may be performed in various sequences as appropriate to the individual step. Furthermore, additional steps may be added or removed depending on the particular applications. One of ordinary skill in the art would recognize many variations, modifications, and alternatives.

The structure shown in FIGS. 37A and 37B can be fabricated using a process similar to that described in relation to FIGS. 41A-I. The primary changes between these structures are the starting material type, the formation of n+ and p+ buried layers prior to epitaxial growth, and the formation of deep n+ and p+ sinkers. While most of the power MOSFET fabrication proceeds separately, steps such as n+, p+, metal and contact can be shared between the power transistor and low voltage circuitry such as CMOS reducing the cost. Since the thermal budget for low voltage CMOS is limited, the power MOSFET is not affected significantly if the device is protected sufficiently during fabrication.

It should be noted that although the top views of various devices described herein have utilized stripe geometries, such as illustrated in FIG. 23A, this is not required by embodiments of the present invention. Merely by way of example, other cellular geometries or cell structures are included within the scope of embodiments of the present invention, for instance, hexagonal, rectangular, circular, oval, and the like.

Figure 46A:
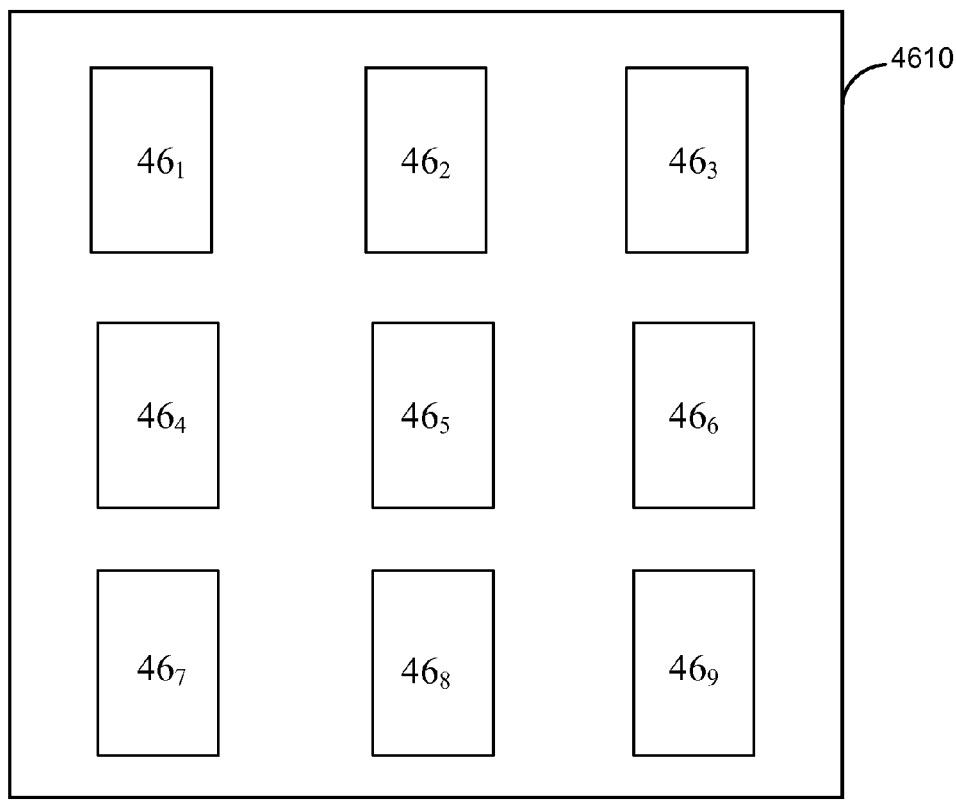
FIG. 46A and FIG. 46B are simplified top views of exemplary cellular geometries provided according to embodiments of the present invention.
Figure 46B:
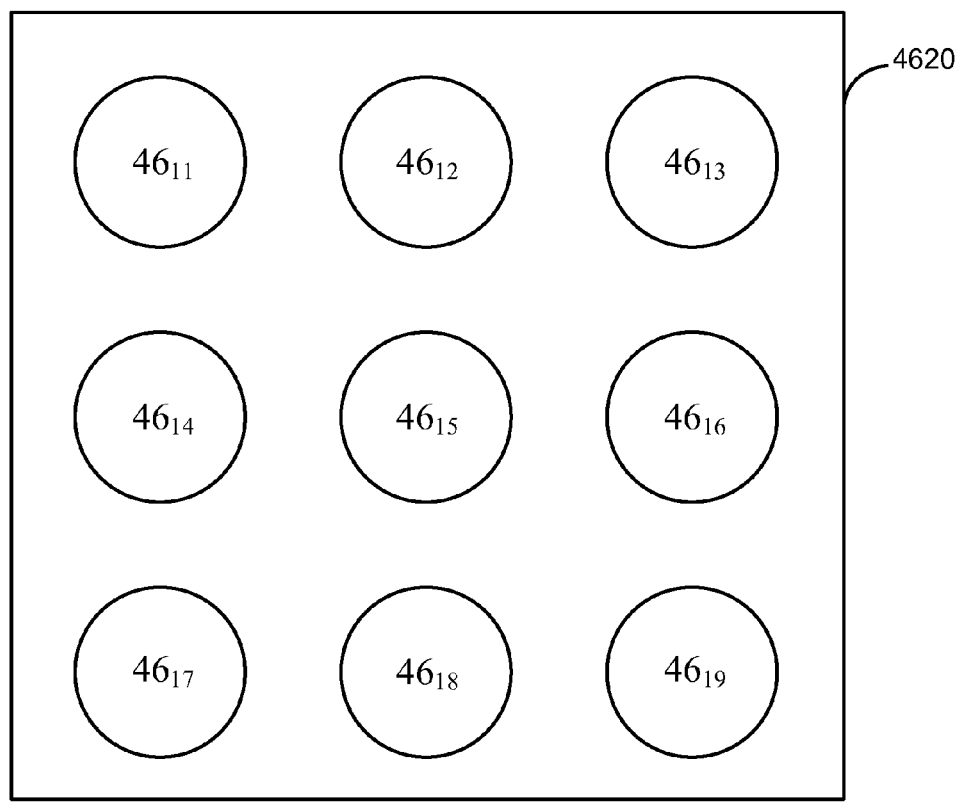

FIG. 46A and FIG. 46B are simplified top views of exemplary cellular geometries provided according to embodiments of the present invention. FIG. 46A is an exemplary top view of a device 4610 that includes a series of nine trenches 46₁ through 46₉ that have rectangular top views and are arrayed in a grid. FIG. 46B is another exemplary top view of device 4620, in accordance with which trenches 4611 through 4619 are shown as having circular top views. It is understood that trenches 206 may have any other top views, such as hexagonal, oval, or the like.

Figure 44A:
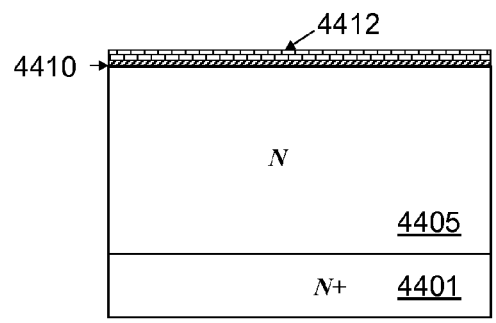
FIGS. 44A-K illustrate a simplified process flow for fabricating a semiconductor device according to yet another alternative embodiment of the present invention.

FIGS. 44A-K illustrate a simplified process flow for fabricating a semiconductor device according to yet another alternative embodiment of the present invention. In the following process flow, a method of making an n-channel transistor with a trench CG and CC trenches filled with a dielectric material (e.g., a silicon oxide material) having a fixed negative charge is described. A heavily doped n+ substrate 4401 is provided. The substrate 4401 may be doped with phosphorus, antimony, arsenic, or other suitable n-type dopants. An n-type epitaxial layer 4405 is grown on top of the n+ substrate 4401 as illustrated in FIG. 44A. Next, a thin oxide layer 4410 is grown over the epitaxial layer and a thin silicon nitride layer 4412 is then deposited on top of the oxide layer. In a specific embodiment, the oxide layer 4410 is 30 nm thick and the silicon nitride layer 4412 is 100 nm thick.

Figure 44B:
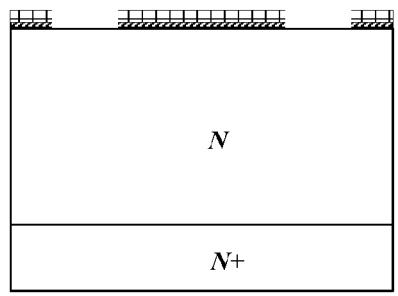
Figure 44C:
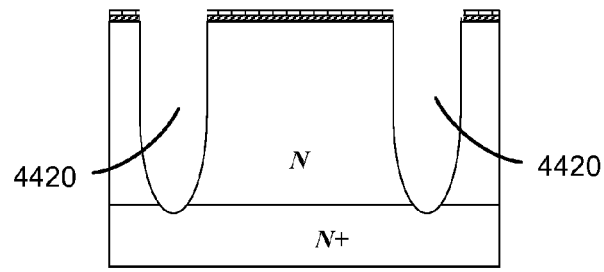
Figure 44D:
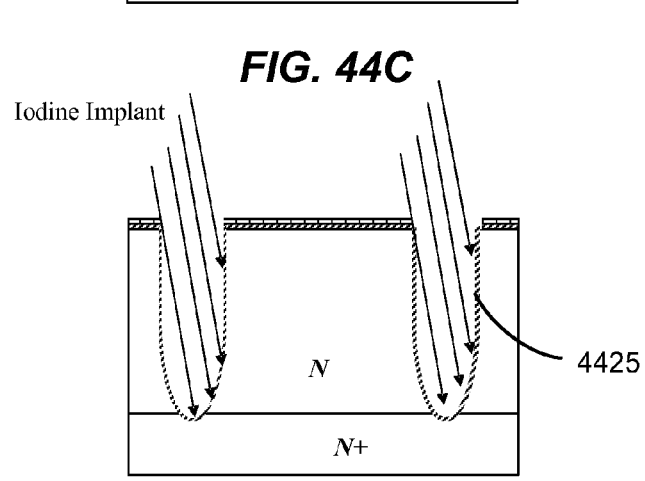

The oxide layer and the silicon nitride layer are masked and etched as shown in FIG. 44B. Although embodiments of the present invention are not limited by the use of photoresist mask, this is one possible masking layer used in some embodiments. The CC trenches 4420 are then etched as shown in FIG. 44C, using the oxide/nitride multilayer mask previously fabricated. After the etch step, a thin thermal oxide layer 4425 as illustrated in FIG. 44D is then grown. For example, the thin oxide layer 4425 may be 30 nm, 50 nm, or another suitable thickness depending on the particular application.

Figure 44E:
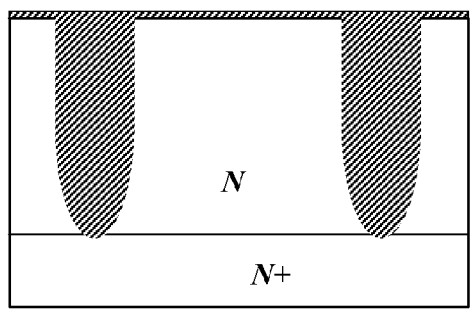

In order to introduce fixed negative charges into the thermal oxide layer 4425, an ion-implantation process is utilized as illustrated in FIG. 44D. Suitable ions, such as iodine, bromine, chromium, aluminum, or chlorine are implanted at a predetermined energy for a predetermined time. Depending on the application, the implant dose is selected to provide adequate charge balance to the positive charge in the mesa. As shown in FIG. 44D, an angle implant may be used depending on the trench width and depth. After the implantation process, the trenches are filled with a deposited oxide and etched back as shown in FIG. 44E. For example, a low temperature oxide or a TEOS deposition process can be used to completely fill the trenches. In some embodiments, an etch back is used to planarize the surface after the oxide trench fill step. As an alternative to the process illustrated in FIGS. 44D and 44E, a process can be performed to implant iodine, bromine, chromium, aluminum, or chlorine ions inside the trench after the trench fill with dielectric using lithography processes. The implantation of the iodine, bromine, chromium, aluminum, or chlorine or similar ions into the insulating layer 4425 provides for a fixed negative charge at the interface of the trenches 4420 and the n-type region adjacent the trenches. As a result of the fixed negative charge in the trenches, at zero bias, the dielectric layer's fixed negative charge is partially balanced by the charge of an inversion layer that forms at the silicon-dielectric layer interface. The charge in the dielectric layer is preferably located at or close to the silicon-dielectric interface for maximum effectiveness.

Figure 44F:
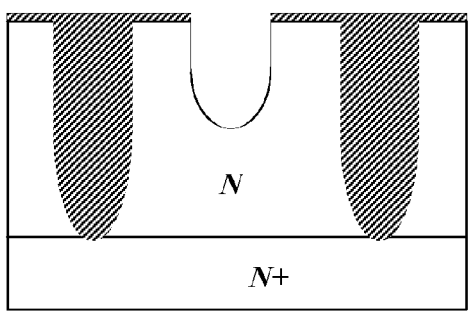

In order to form the trench for the CG, the oxide layer present on the surface of the device is masked and removed over the trench area. Then the CG trench is etched to a predetermined depth as illustrated in FIG. 44F. Typically, etching of the CG trench is performed using a dry plasma etching technique although that is not required by embodiments of the present invention. Although not illustrated, one or more masking steps are utilized during the etching process as will be evident to one of skill in the art.

Figure 44G:
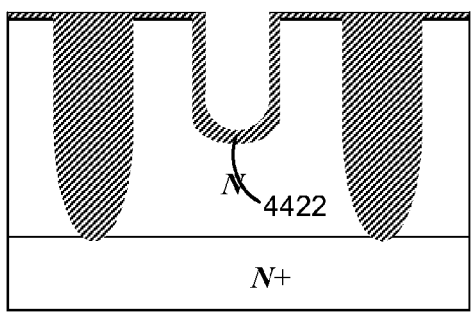
Figure 44H:
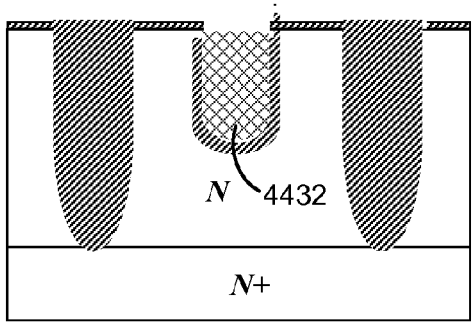

A thermal gate oxide 4422 is grown in the trench CG as shown in FIG. 44G and/or on the upper surface of the device. In order to form the trench CG, polysilicon 4432 is then deposited and is doped using an n-type doping process such as phosphorus doping and etched back to the level or below that of the gate oxide by an etching process such as plasma dry etching, by the use of CMP techniques, by a combination of the two or by other processes. The structure at this stage of fabrication is illustrated in FIG. 44H.

Figure 44I:
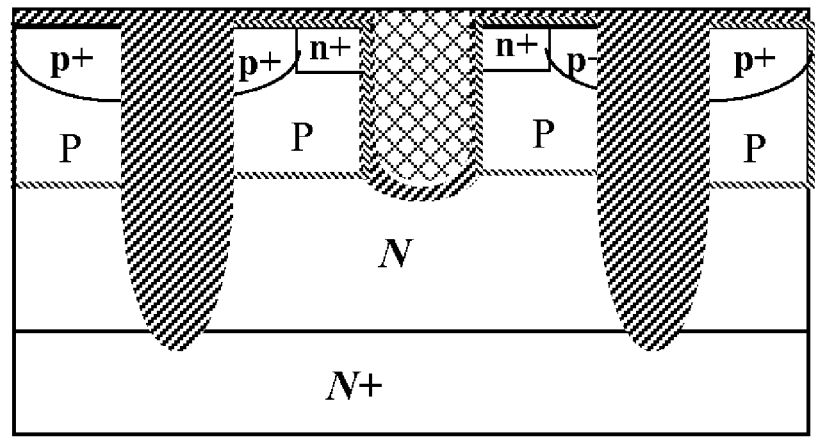
Figure 44J:
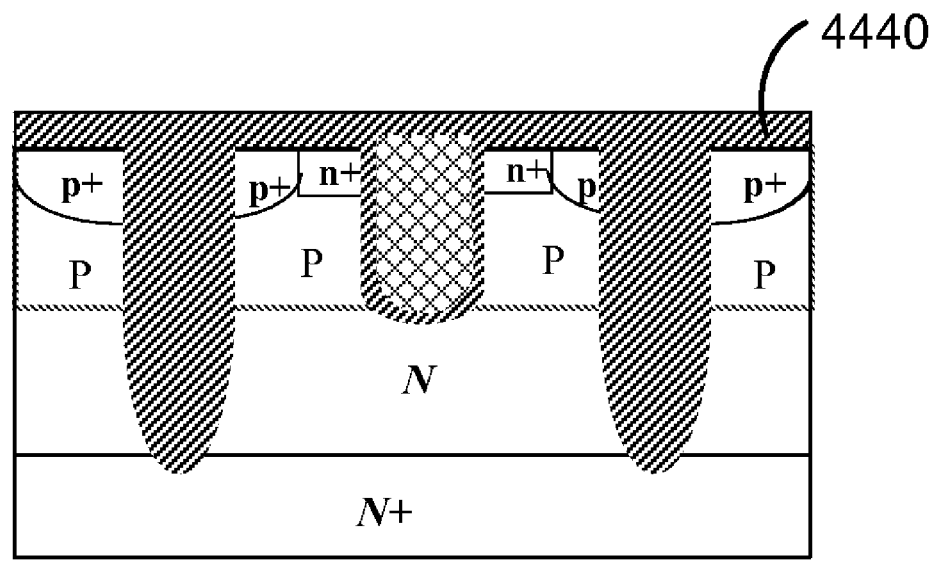

Several masking steps are then performed to implant the p-body and p+ layers using p-type doping such as boron, the n+ source using arsenic, antimony, phosphorus, or a combination thereof as shown in FIG. 44I. Additionally, a deep p+ layer may also be implanted as one of these processing steps. Various masking, implantation, annealing, and other processing steps used to form the diffused junctions illustrated in FIG. 44I are not illustrated for purposes of clarity. One of ordinary skill in the art would recognize many variations, modifications, and alternatives.

Figure 44K:
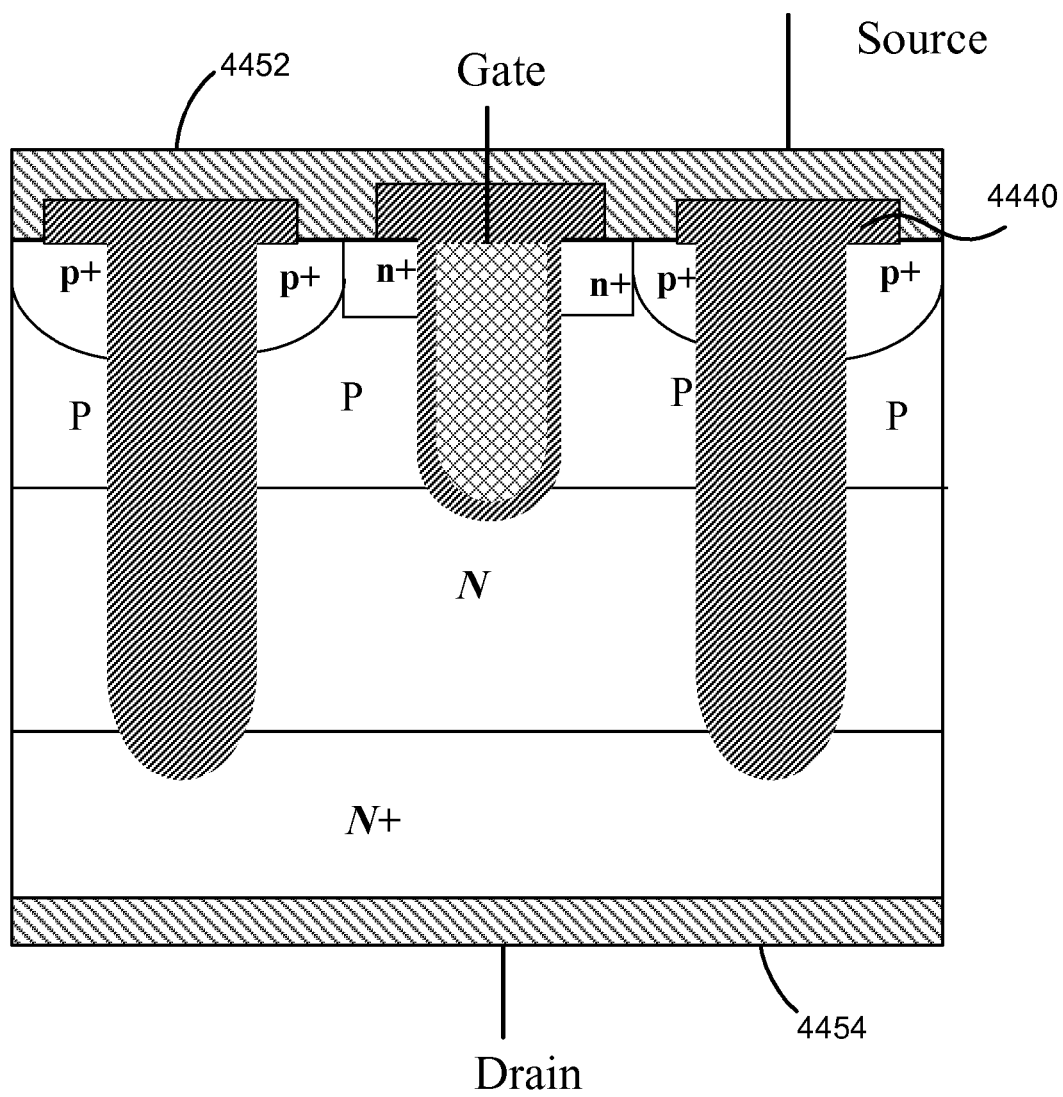

In order to provide for electrical contact regions, the insulating layers formed on portions of the upper surface of the device are removed, typically by use of an etching process, an oxide layer 4440 is deposited, the oxide layer 4440 is patterned, and contact metallization 4452 and 4454 is formed after lapping to complete the device fabrication process. The resulting device is shown in FIG. 44K.

Figure 44L:
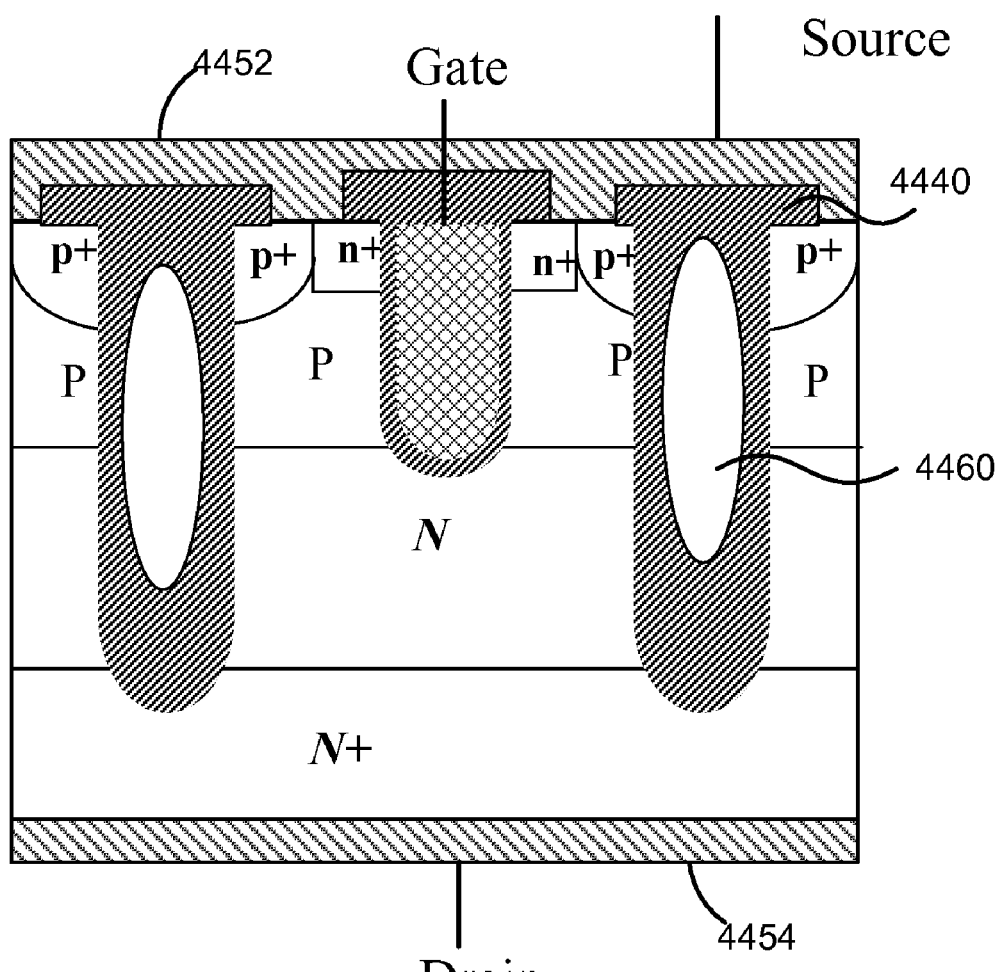
FIG. 44L is a simplified illustration of a semiconductor device fabricated according to the process flow of FIGS. 44A-K including a void according to an embodiment of the present invention.

FIG. 44L is a simplified illustration of a semiconductor device fabricated according to the process flow of FIGS. 44A-K including a void according to an embodiment of the present invention. As illustrated in FIG. 44L, a void 4460 is formed in each of the CC trenches during device fabrication. As an example of a process flow that would form the voids illustrated in FIG. 44L, the voids could be formed as part of step 44E as the dielectric layer is deposited in the CC trenches after the ion implantation process. As discussed previously in the present specification, the voids may be formed either intentionally or as a byproduct of the dielectric deposition process and provide for an additional dielectric material (e.g., air or an inert environment) interior to the one or more dielectric materials illustrated in the CC trenches. One of ordinary skill in the art would recognize many variations, modifications, and alternatives.

Referring to FIG. 43A, a simplified illustration of a planar n-channel DMOS transistor is provided. Such a structure can be fabricated using a fabrication process that is a variation of the process illustrated in FIGS. 39A-I. For example, in order to fabricate a transistor with a planar gate, the etching of the gate trench that is illustrated in FIGS. 39E-F would not be performed. Additionally, steps 39G through 39H would be modified to form a gate oxide and gate material (e.g., polysilicon) that are appropriate for a planar gate structure. One of ordinary skill in the art would recognize many variations, modifications, and alternatives.

It should be appreciated that the specific steps illustrated in FIGS. 44A-K provide a particular method of fabricating a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIGS. 44A-K may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 45A:
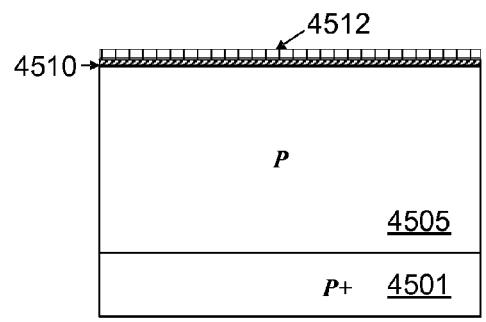
FIGS. 45A-K illustrate a simplified process flow for fabricating a semiconductor device according to yet another specific embodiment of the present invention.

FIGS. 45A-K illustrate a simplified process flow for fabricating a semiconductor device according to yet another specific embodiment of the present invention. In the following process flow, a method of making a p-channel transistor with a trench CG and CC trenches filled with a dielectric material (e.g., a silicon oxide material) having a fixed positive charge is described. A heavily doped p+ substrate 4501 is provided. The substrate 4501 may be doped with boron or other suitable p-type dopants. A p-type epitaxial layer 4505 is grown on top of the p+ substrate 4501 as illustrated in FIG. 45A. Next, a thin oxide layer 4510 is grown over the epitaxial layer and a thin silicon nitride layer 4512 is then deposited on top of the oxide layer. In a specific embodiment, the oxide layer 4510 is 30 nm thick and the silicon nitride layer 4512 is 100 nm thick.

Figure 45B:
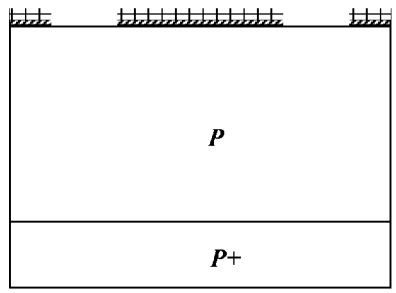
Figure 45C:
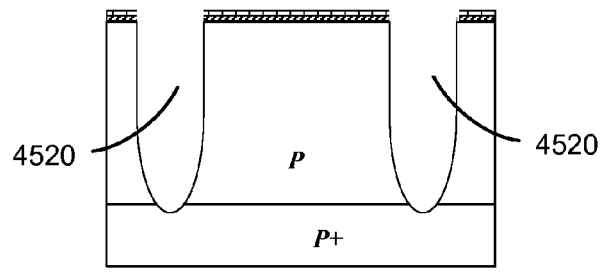
Figure 45D:
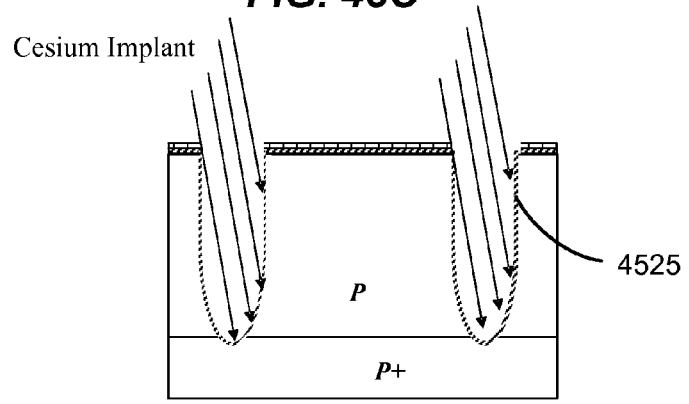

The oxide layer and the silicon nitride layer are masked and etched as shown in FIG. 45B. Although embodiments of the present invention are not limited by the use of photoresist mask, this is one possible masking layer used in some embodiments. The CC trenches 4520 are then etched as shown in FIG. 45C, using the oxide/nitride multilayer mask previously fabricated. After the etch step, a thin thermal oxide layer 4525 as illustrated in FIG. 45D is then grown. For example, the thin oxide layer 4525 may be 30 nm, 50 nm, or another suitable thickness depending on the particular application.

Figure 45E:
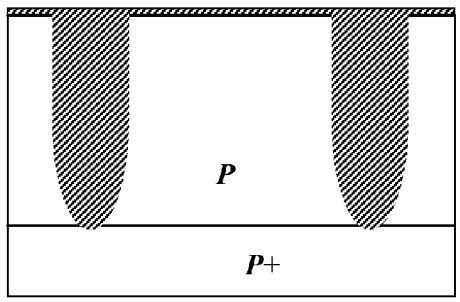

In order to introduce fixed positive charges into the thermal oxide layer 4525, an ion-implantation process is utilized as illustrated in FIG. 45D. Suitable ions, such as cesium, are implanted at a predetermined energy for a predetermined time. Depending on the application, the implant dose is selected to provide adequate charge balance to the negative charge in the mesa. As shown in FIG. 45D, an angle implant may be used depending on the trench width and depth. After the implantation process, the trenches are filled with a deposited oxide and etched back as shown in FIG. 45E. For example, a low temperature oxide or a TEOS deposition process can be used to completely fill the trenches. In some embodiments, an etch back is used to planarize the surface after the oxide trench fill step. As an alternative to the process illustrated in FIGS. 45D and 45E, a process can be performed to implant cesium ions inside the trench after the trench fill with dielectric using lithography processes. The implantation of the cesium or similar ions into the insulating layer 4525 provides for a fixed positive charge at the interface of the trenches 4520 and the p-type region adjacent the trenches. As a result of the fixed positive charge in the trenches, at zero bias, the dielectric layer's fixed positive charge is partially balanced by the charge of an inversion layer that forms at the silicon-dielectric layer interface. The charge in the dielectric layer is preferably located at or close to the silicon-dielectric interface for maximum effectiveness.

Figure 45F:
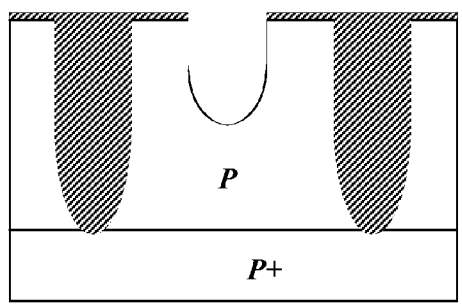

In order to form the trench for the CG, the oxide layer present on the surface of the device is masked and removed over the trench area. Then the CG trench is etched to a predetermined depth as illustrated in FIG. 45F. Typically, etching of the CG trench is performed using a dry plasma etching technique although that is not required by embodiments of the present invention. Although not illustrated, one or more masking steps are utilized during the etching process as will be evident to one of skill in the art.

Figure 45G:
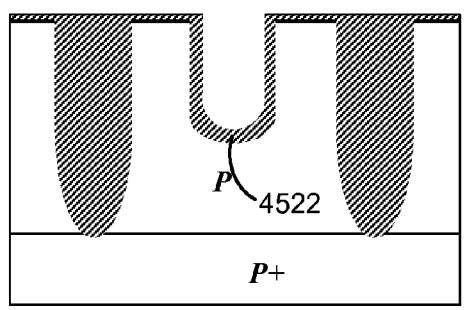
Figure 45H:
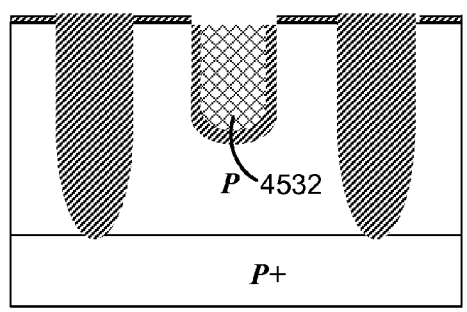

A thermal gate oxide 4522 is grown in the trench CG as shown in FIG. 45G and/or on the upper surface of the device. In order to form the trench CG, polysilicon 4532 is then deposited and is doped using a p-type doping process such as boron doping and etched back to the level or below that of the gate oxide by an etching process such as plasma dry etching, by the use of CMP techniques, by a combination of the two or by other processes. The structure at this stage of fabrication is illustrated in FIG. 45H.

Figure 45I:
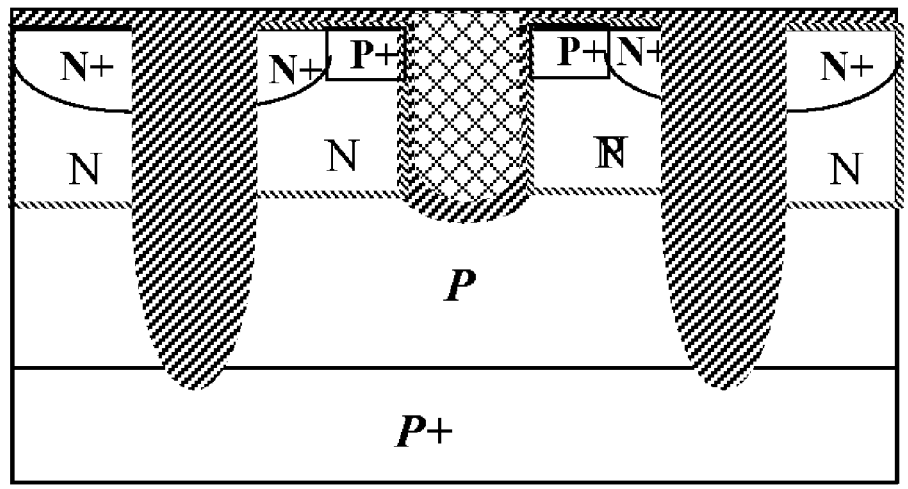
Figure 45J:
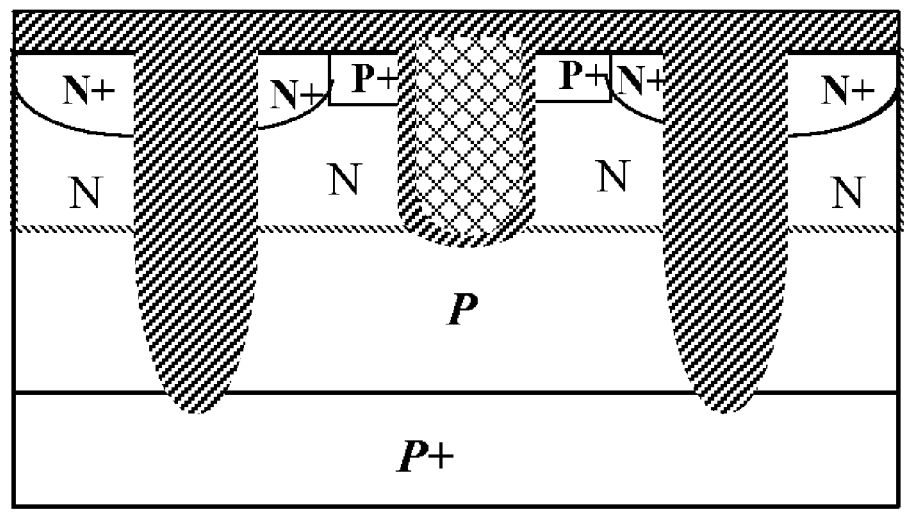

Several masking steps are then performed to implant the n-body and n+ layers using n-type doping such as arsenic, antimony, phosphorus, or a combination thereof, the p+ source using boron as shown in FIG. 45I. Additionally, a deep n+ layer may also be implanted as one of these processing steps. Various masking, implantation, annealing, and other processing steps used to form the diffused junctions illustrated in FIG. 45I are not illustrated for purposes of clarity. One of ordinary skill in the art would recognize many variations, modifications, and alternatives.

Figure 45K:
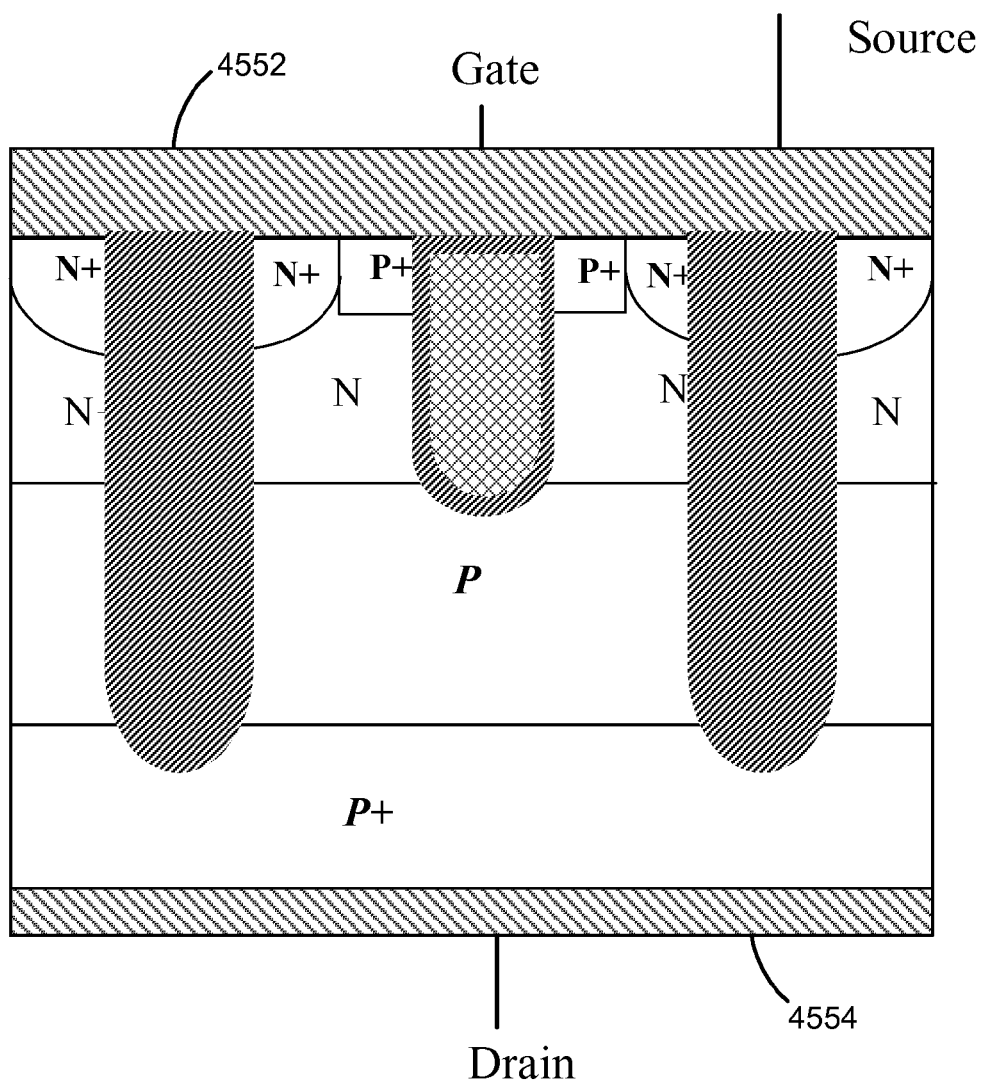

In order to provide for electrical contact regions, the insulating layers formed on portions of the upper surface of the device are removed, typically by use of an etching process, and contact metallization 4552 and 4554 is formed after lapping to complete the device fabrication process. The resulting device is shown in FIG. 45K.

It should be appreciated that the specific steps illustrated in FIGS. 45A-K provide a particular method of fabricating a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIGS. 45A-K may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 45L:
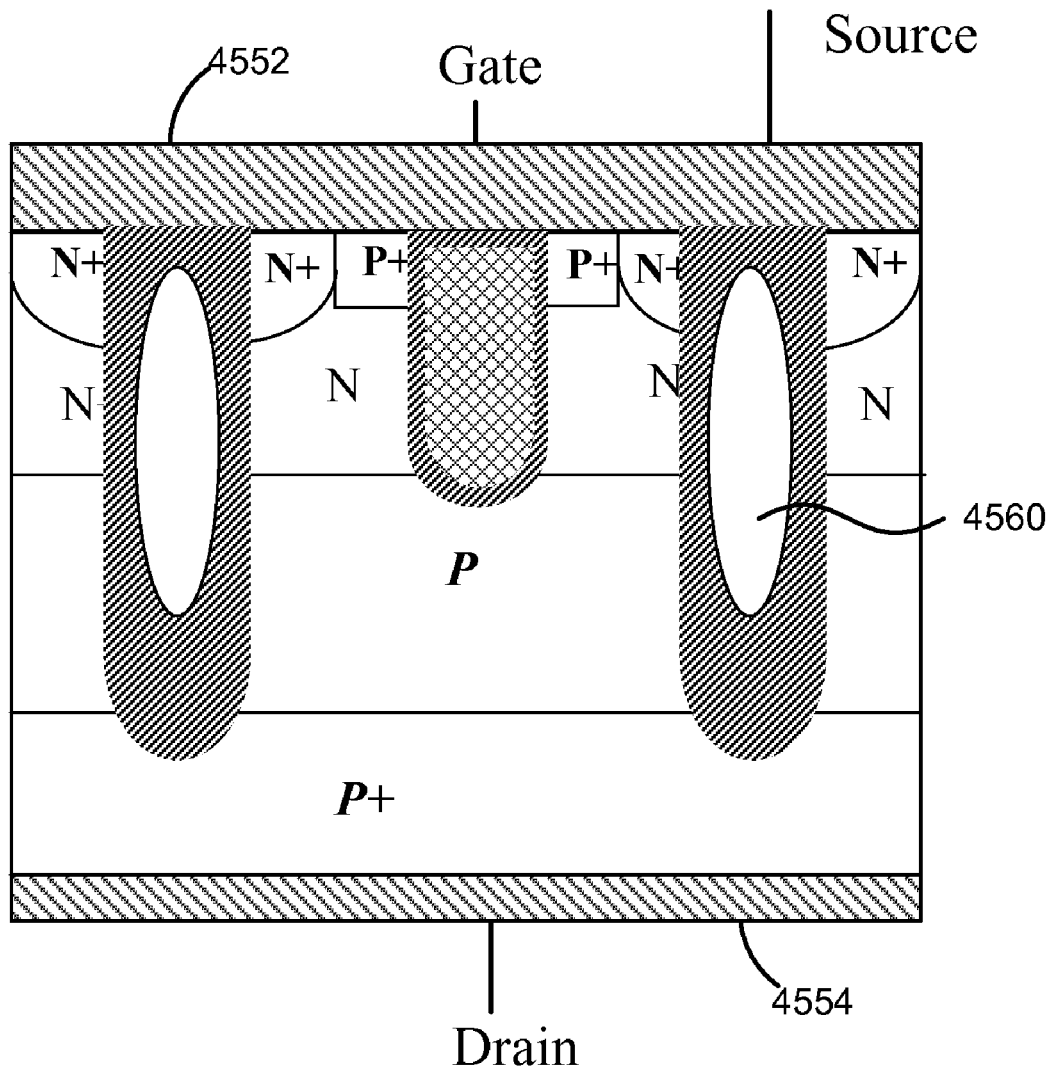
FIG. 45L is a simplified illustration of a semiconductor device fabricated according to the process flow of FIGS. 45A-K including a void according to an embodiment of the present invention.

FIG. 45L is a simplified illustration of a semiconductor device fabricated according to the process flow of FIGS. 45A-K including a void according to an embodiment of the present invention. As illustrated in FIG. 45L, a void 4560 is formed in each of the CC trenches during device fabrication. As an example of a process flow that would form the voids illustrated in FIG. 45L, the voids could be formed as part of step 45E as the dielectric layer is deposited in the CC trenches after the ion implantation process. As discussed previously in the present specification, the voids may be formed either intentionally or as a byproduct of the dielectric deposition process and provide for an additional dielectric material (e.g., air or an inert environment) interior to the one or more dielectric materials illustrated in the CC trenches. One of ordinary skill in the art would recognize many variations, modifications, and alternatives.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A semiconductor device comprising:
 a plurality of trenches penetrating into semiconductor material, wherein
 at least some ones of said trenches include a gate electrode which is capacitively coupled to a portion of said semiconductor material to control conduction therethrough, and
 at least some ones of said trenches have fixed electrostatic charge of at least $5 \times 10^{11}$ cm$^{-2}$ in proximity to sidewalls thereof;
 and wherein said fixed electrostatic charge balances at least some of the net charge in depleted regions of said semiconductor material, when said semiconductor material is depleted.

2. The semiconductor device of claim 1, wherein said gate electrode consists of a doped polycrystalline semiconductor material.

3. The semiconductor device of claim 1, wherein at least some ones of said trenches which have fixed charge in proximity thereto contain a dielectric material.

4. The semiconductor device of claim 1, wherein at least some ones of said trenches have said fixed electrostatic charge in proximity to sidewalls thereof, but do not include any gate electrode.

5. The semiconductor device of claim 1, wherein at least some ones of said trenches include a gate electrode and also include said fixed electrostatic charge in proximity to sidewalls thereof.

6. The semiconductor device of claim 1, wherein an integrated doping density, measured from one of said trenches which has said fixed electrostatic charge to a neighboring trench which has fixed charge ranges from about $1 \times 10^{12}$ cm$^{-2}$ to about $5 \times 10^{12}$ cm$^{-2}$.

7. The semiconductor device of claim 1, wherein said trenches which have said fixed electrostatic charge in proximity to sidewalls thereof contain aluminum oxide.

8. The semiconductor device of claim 1, wherein said gate electrode controls conduction, through said semiconductor material, between heavily doped semiconductor source and drain regions.

9. The semiconductor device of claim 1, wherein said trenches which have said fixed electrostatic charge in proximity to sidewalls thereof include at least two different dielectric materials.

10. The semiconductor device of claim 1, wherein said trenches which have said fixed electrostatic charge in proximity to sidewalls thereof include aluminum fluoride.

11. The semiconductor device of claim 1, wherein said trenches which have said fixed electrostatic charge in proximity to sidewalls thereof contain silicon dioxide.

12. The semiconductor device of claim 1, further comprising, in addition to said trenches, one or more termination trenches.

13. A semiconductor device comprising:
   a first-conductivity-type source overlying at least some portions of a second-conductivity-type body layer;
   first trenches, each including at least one conductive gate electrode which is capacitively coupled to a portion of said body, to thereby control passage of majority carriers emitted by said source through portions of said body, and optionally through a drift region, to a drain;
   a plurality of second trenches, interspersed with said first trenches; and
   fixed electrostatic charge of at least $5\times10^{11}$ cm$^{-2}$ in proximity to sidewalls of said second trenches;
   wherein said fixed electrostatic charge balances at least some of the net charge in depleted regions of said body and/or drift region, when a depletion boundary spreads from the junction between said body and said drain.

14. The semiconductor device of claim 13, wherein said gate electrode consists of a doped polycrystalline semiconductor material.

15. The semiconductor device of claim 13, wherein said second trenches include at least two different dielectric materials.

16. The semiconductor device of claim 13, further comprising, in addition to said first and second trenches, one or more termination trenches.

17. The semiconductor device of claim 13, wherein said first and second trenches are both implemented by a single type of trench, each of which includes both said gate electrode and also, in proximity to sidewalls thereof, said fixed electrostatic charge.

18. A semiconductor device comprising:
   semiconductor material in which a source region at least partly overlies a body region;
   a plurality of trenches extending down into said semiconductor material;
   at least some ones of said trenches including at least one conductive gate electrode which is capacitively coupled to a respective portion of said body diffusion to control conduction therethrough; and
   fixed electrostatic charge of at least $5\times10^{11}$ cm$^{-2}$, in proximity to sidewalls of ones of said trenches;
   wherein said fixed electrostatic charge balances at least some of the net charge in depleted regions of said semiconductor material, when said semiconductor material is depleted.

19. The semiconductor device of claim 18, wherein said gate electrode consists of a doped polycrystalline semiconductor material.

20. The semiconductor device of claim 18, wherein at least some ones of said trenches which have fixed charge in proximity thereto contain a dielectric material.

21. The semiconductor device of claim 18, wherein at least some ones of said trenches have said fixed electrostatic charge in proximity to sidewalls thereof, but do not include any gate electrode.

22. The semiconductor device of claim 18, wherein at least some ones of said trenches include a gate electrode and also include said fixed electrostatic charge in proximity to sidewalls thereof.

* * * * *